United States Patent [19]
Tateyama et al.

[11] Patent Number: 5,803,970
[45] Date of Patent: Sep. 8, 1998

[54] METHOD OF FORMING A COATING FILM AND COATING APPARATUS

[75] Inventors: Kiyohisa Tateyama; Kimio Motoda, both of Kumamoto; Kenji Sekiguchi, Yamanashi-ken; Tsutae Omori, Kumamoto, all of Japan

[73] Assignees: Tokyo Electron Limited, Tokyo; Tokyo Electron Kyuchu Limited, Tosu, both of Japan

[21] Appl. No.: 753,768

[22] Filed: Nov. 29, 1996

Related U.S. Application Data

[62] Division of Ser. No. 512,018, Aug. 7, 1995, Pat. No. 5,695,817.

[30] Foreign Application Priority Data

| Aug. 8, 1994 | [JP] | Japan | 6-204196 |
| Mar. 15, 1995 | [JP] | Japan | 7-083206 |
| Mar. 15, 1995 | [JP] | Japan | 7-083207 |
| Apr. 12, 1995 | [JP] | Japan | 7-111330 |

[51] Int. Cl.⁶ .......................... B05B 13/02; B05C 11/00; B08B 3/00
[52] U.S. Cl. .......................... 118/319; 118/52; 118/72; 134/53; 15/302
[58] Field of Search .............. 118/52, 319, 320, 118/72, 73, 500; 134/902, 153, 435; 414/936, 940, 941; 901/27–29, 43; 15/77, 88.2, 88.3, 302

[56] References Cited

U.S. PATENT DOCUMENTS

| 4,790,262 | 12/1988 | Nakayama et al. | 118/52 |
| 5,002,008 | 3/1991 | Ushijima et al. | 118/52 |
| 5,349,978 | 9/1994 | Sago et al. | 134/902 |
| 5,439,519 | 8/1995 | Sago et al. | 118/52 |
| 5,449,405 | 9/1995 | Cardinali et al. | 118/52 |
| 5,536,128 | 7/1996 | Shimoyashiro et al. | 414/940 |
| 5,705,223 | 1/1998 | Bunkofske | 118/52 |

*Primary Examiner*—Laura Edwards
*Assistant Examiner*—Calvin Padgett
*Attorney, Agent, or Firm*—Oblon, Spivak, McClelland, Maier & Neustadt, P.C.

[57] ABSTRACT

A method of forming a coating film, in which the coating film is formed by supplying a coating liquid onto a surface of a substrate, while the substrate housed in a processing vessel is rotated together with the processing vessel, includes the steps of coating the surface of the substrate with a solvent, supplying the coating liquid to the substrate, rotating the substrate and the processing vessel at a first rotation speed to diffuse the coating liquid on the surface of the substrate, closing the processing vessel with a lid to seal the substrate in the processing vessel, and rotating the processing vessel with the lid and the substrate at a second rotation speed to uniform a film thickness of the coating film.

38 Claims, 32 Drawing Sheets

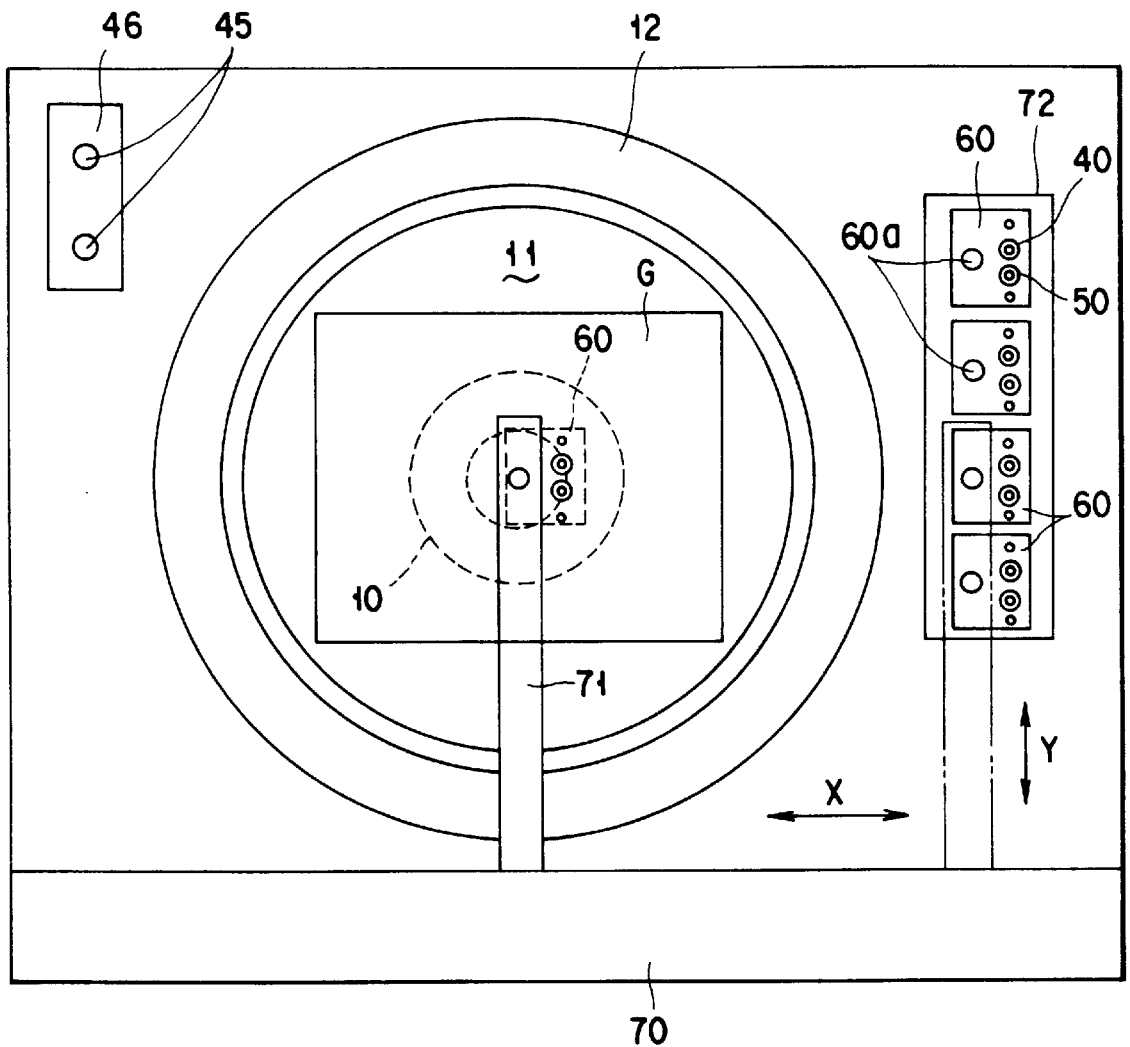
F I G. 2

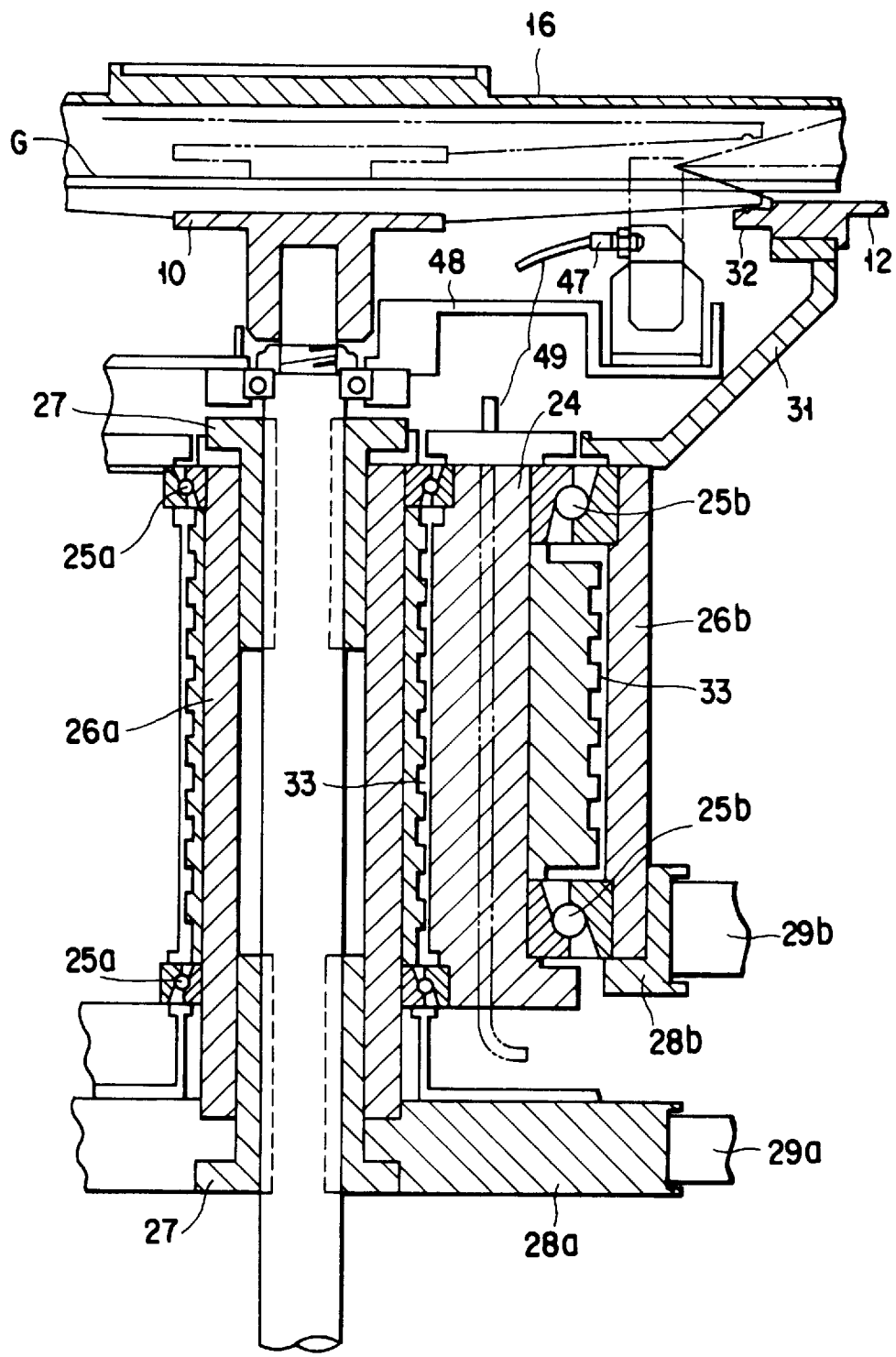
F I G. 3

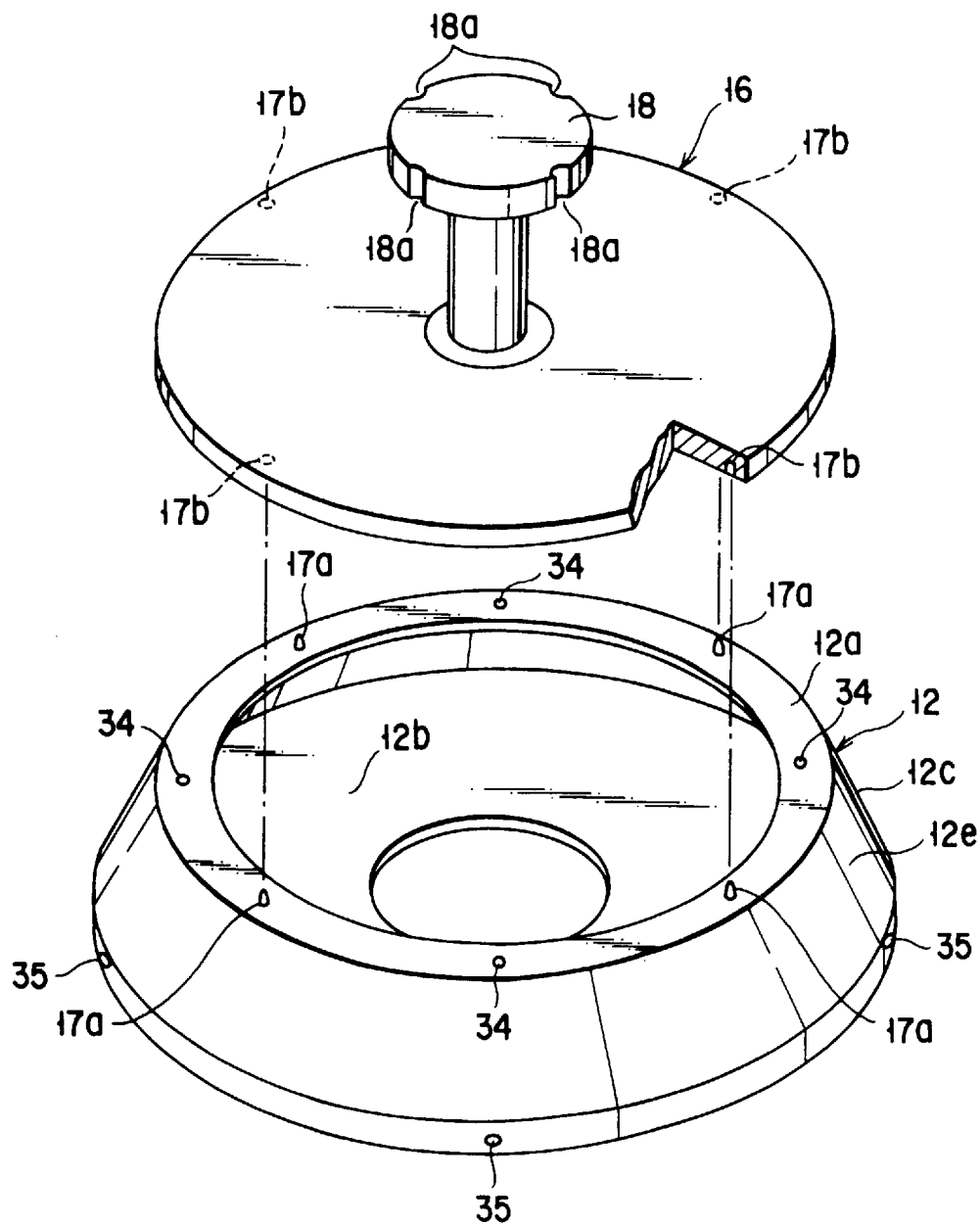
F I G. 4

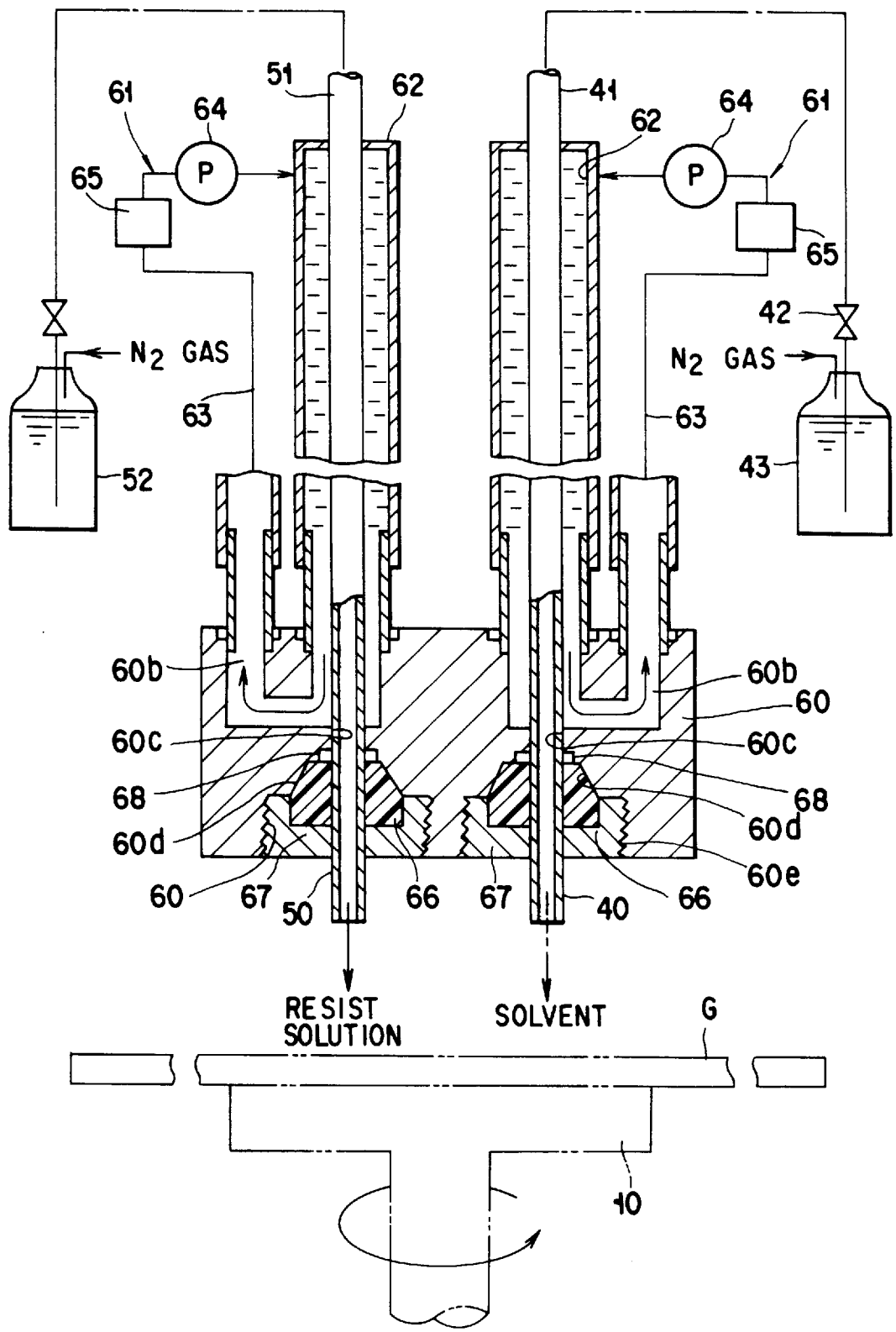
F I G. 8

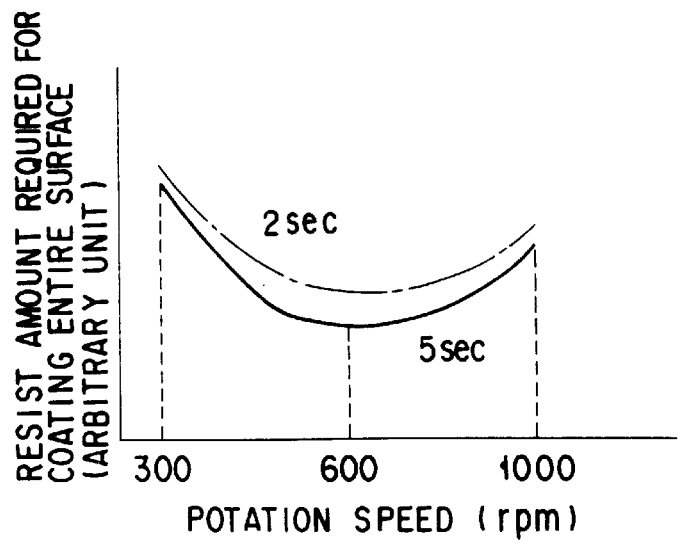
F I G. 11
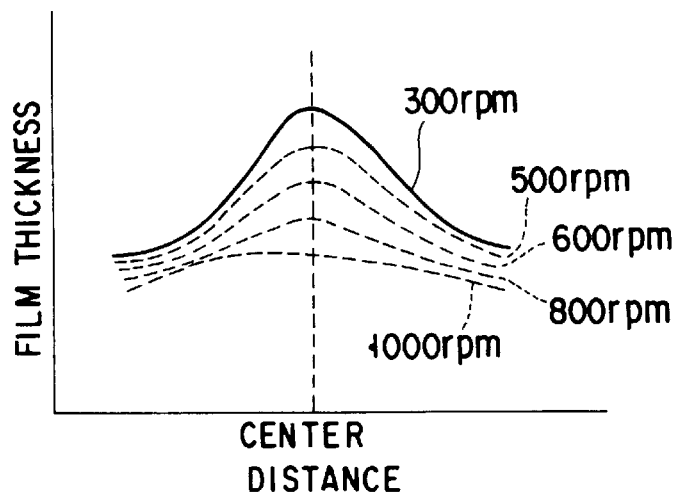
F I G. 12
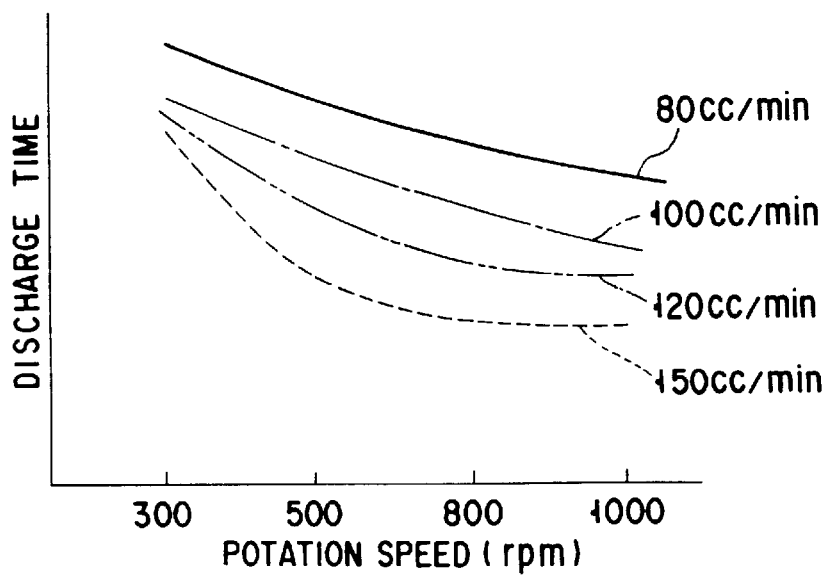
F I G. 13

RESIST SOLUTION    SOLVENT

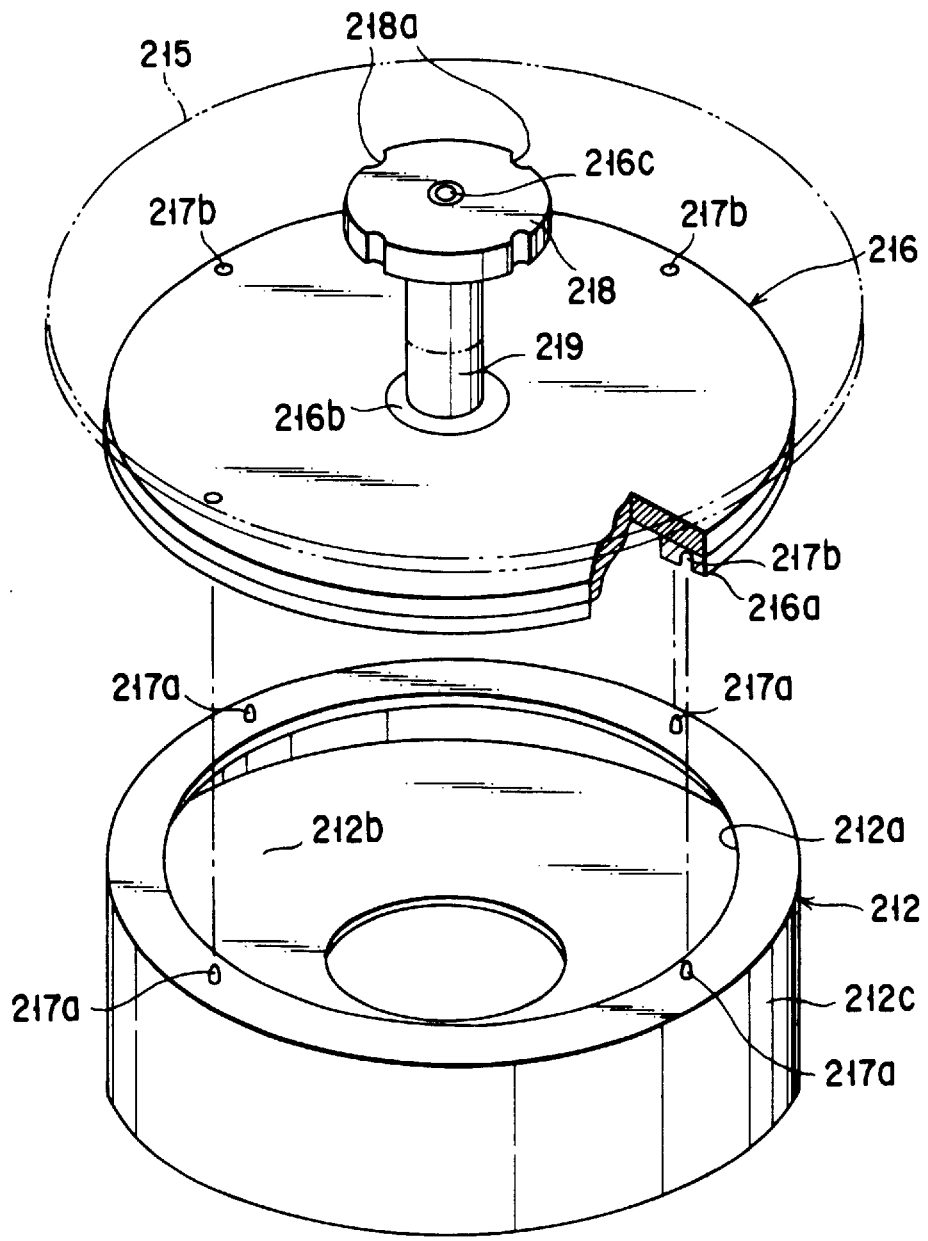
F I G. 26

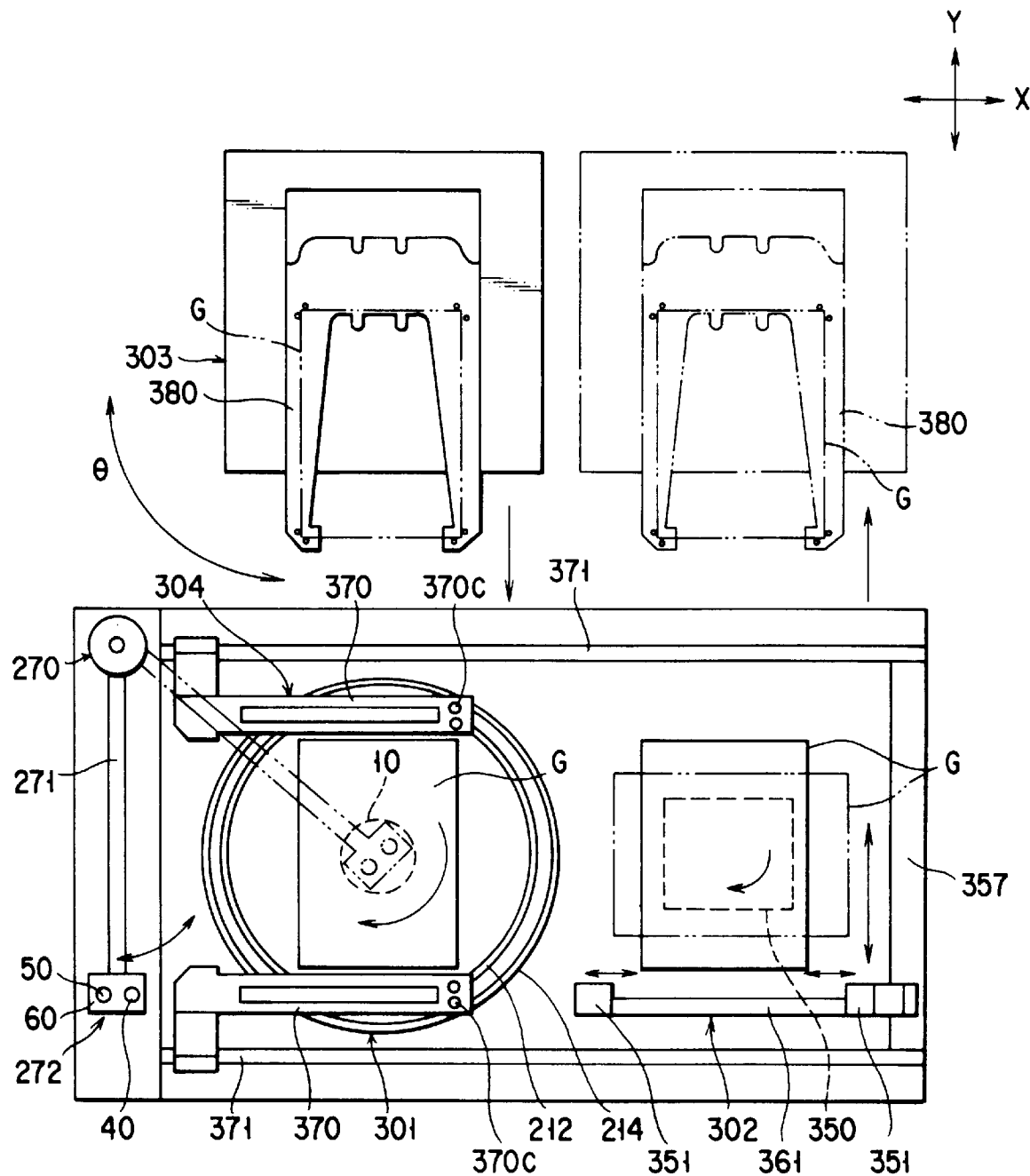
F I G. 31

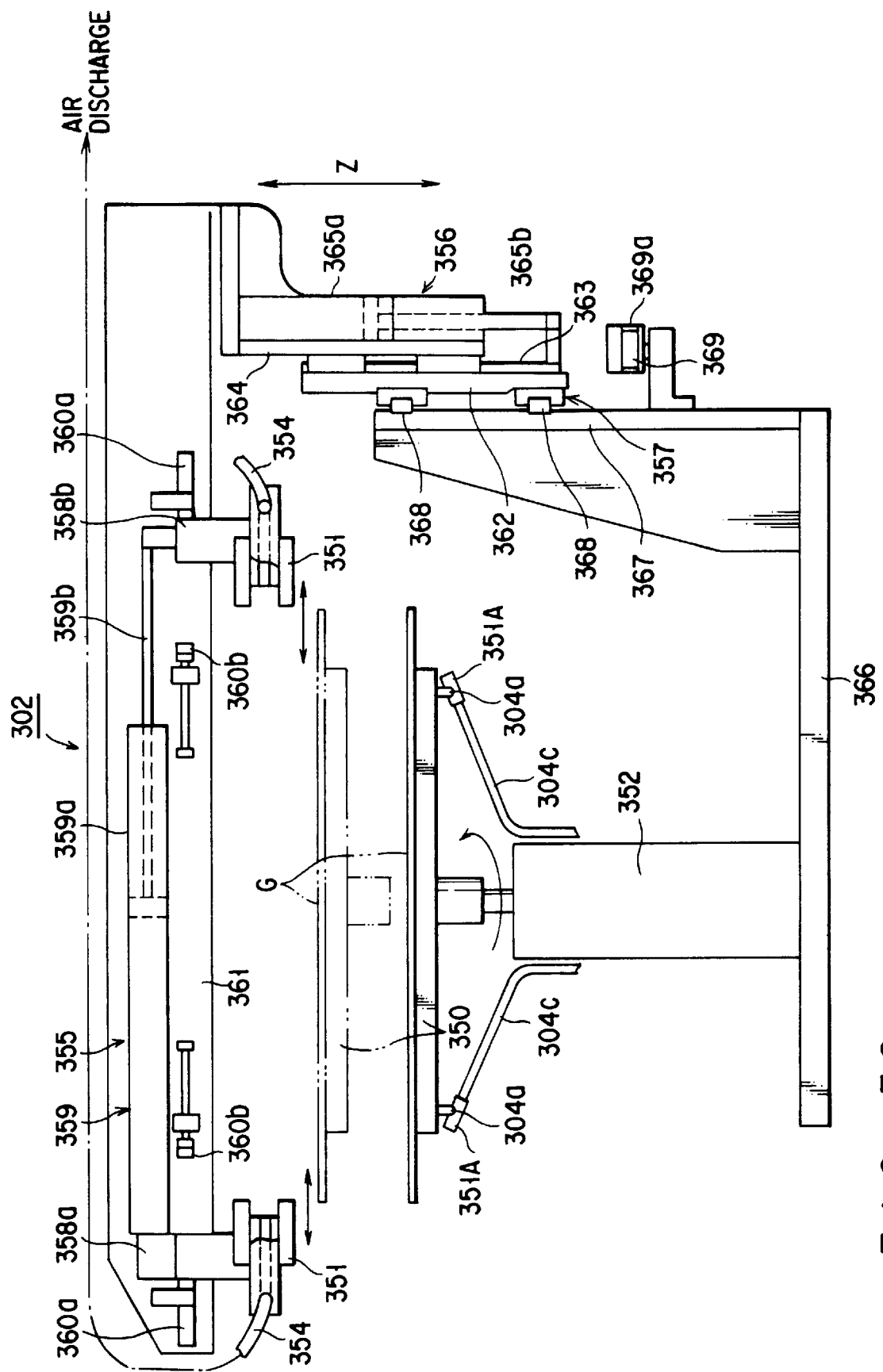
F I G. 32

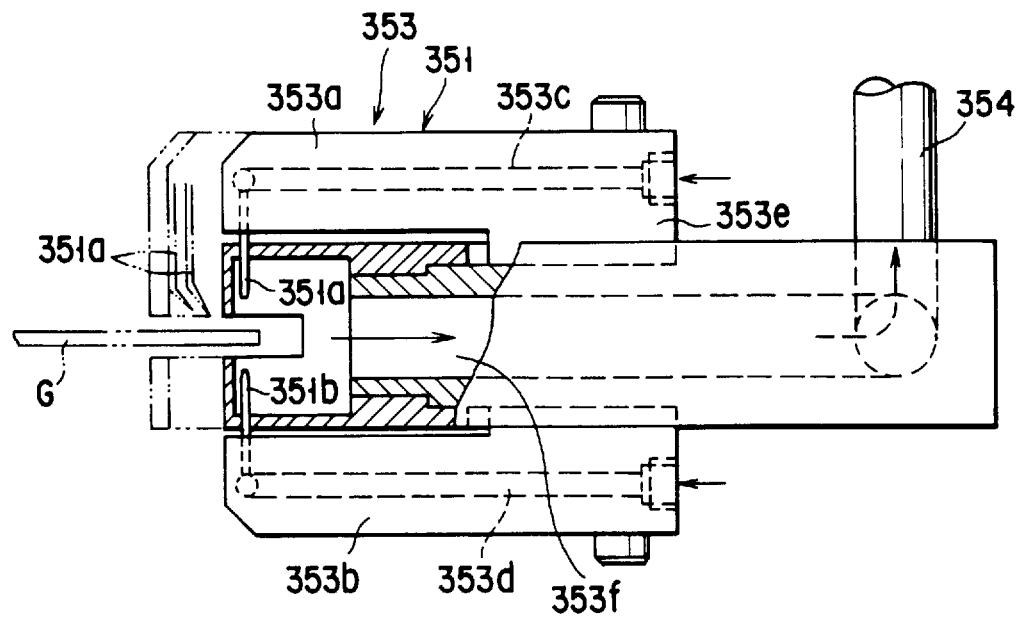
F I G. 33
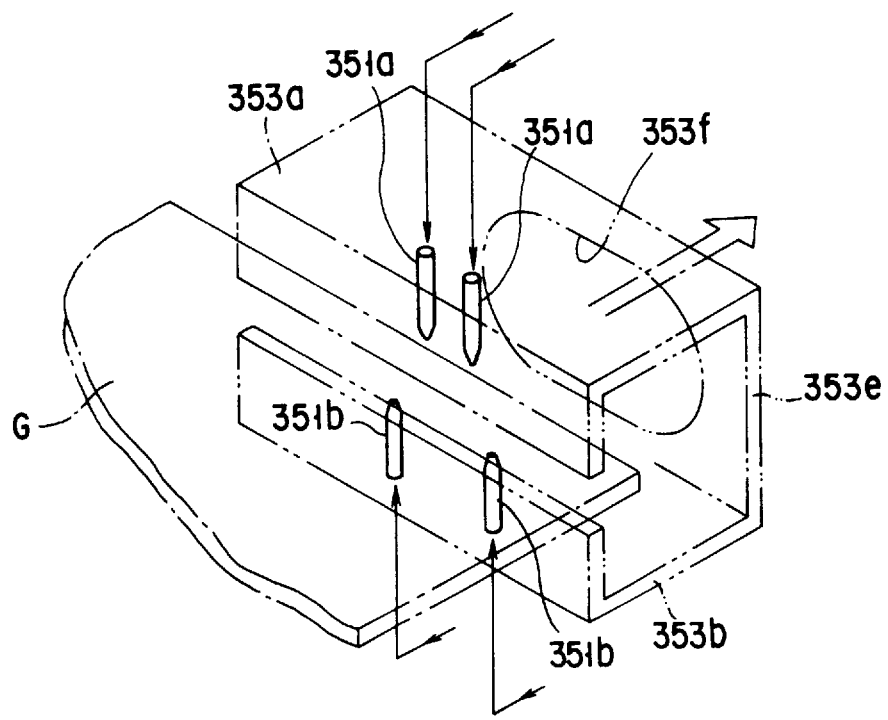
F I G. 34

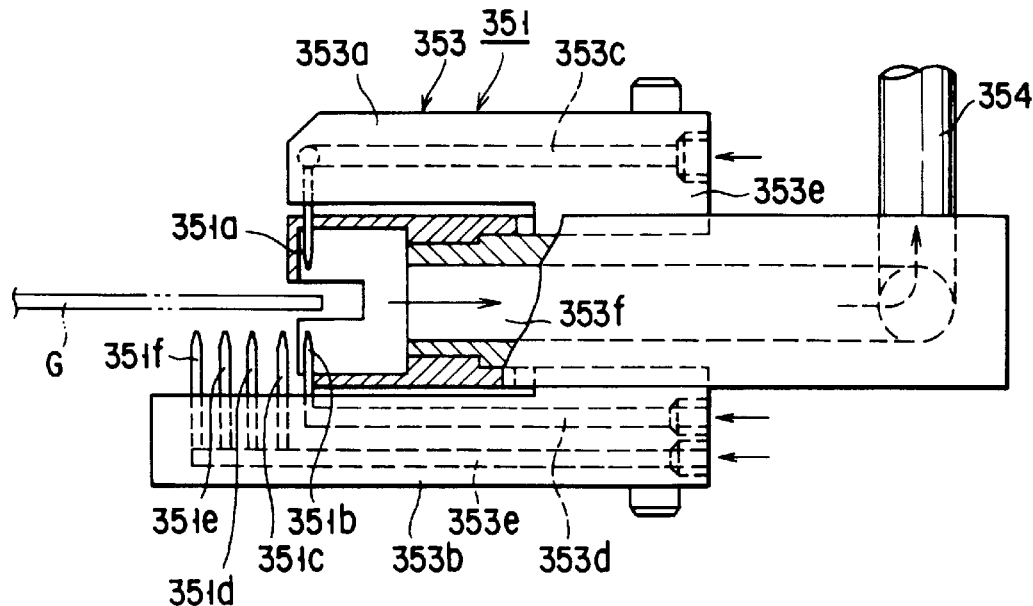
F I G. 37
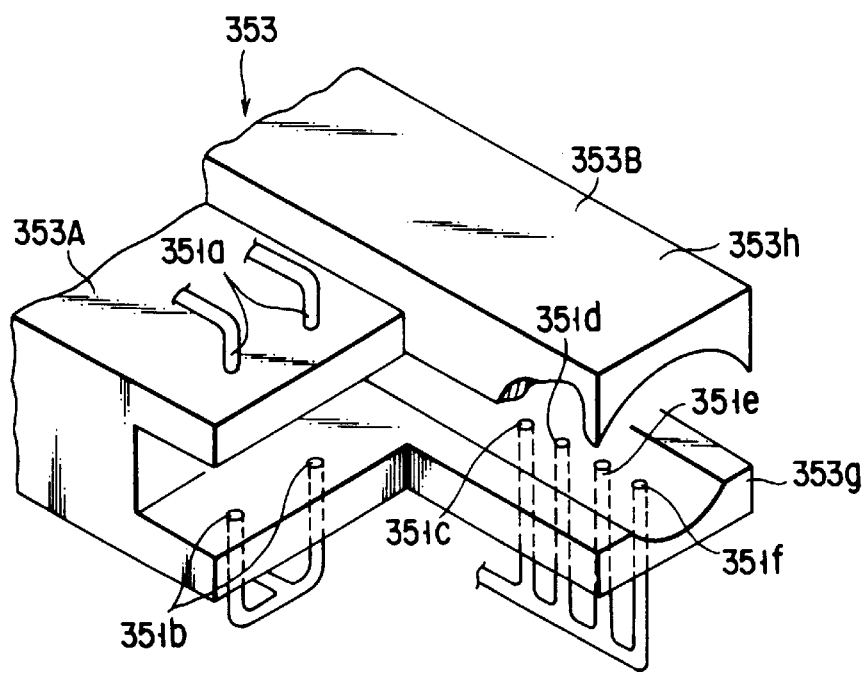
F I G. 38

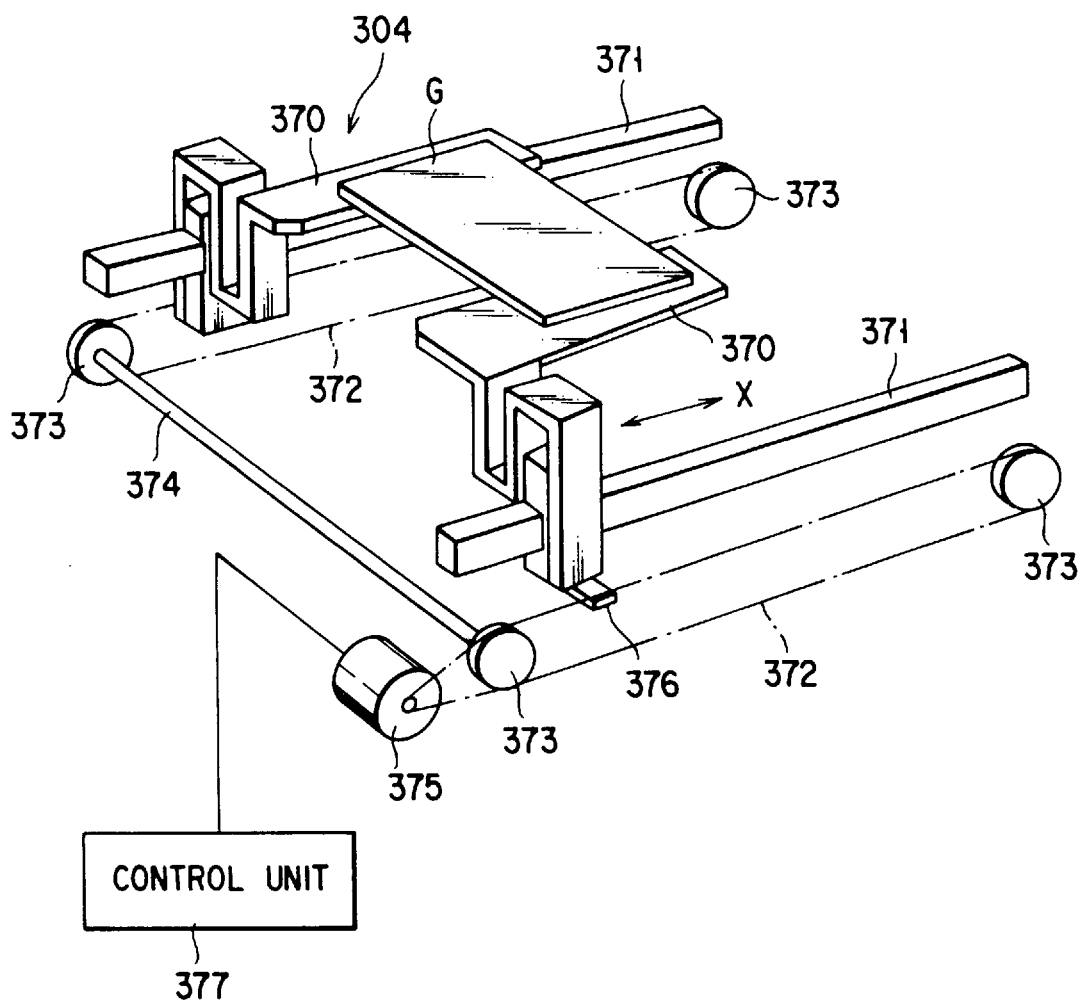
F I G. 39

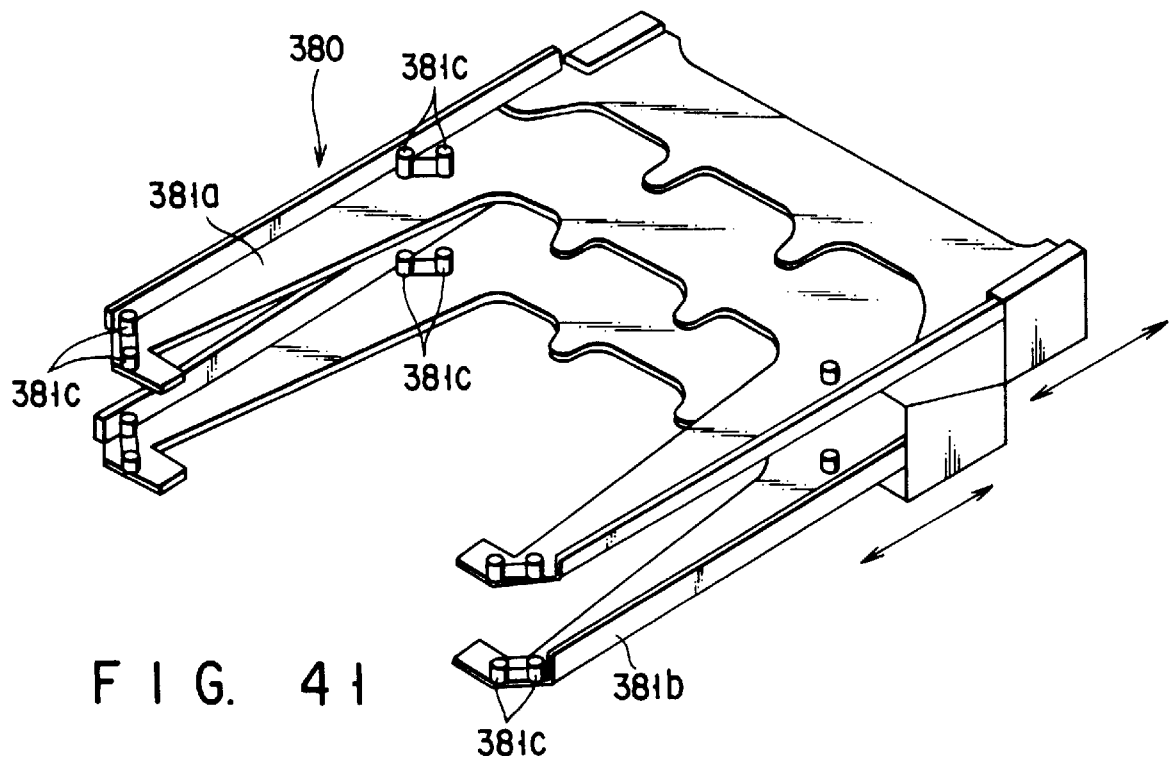
F I G. 41
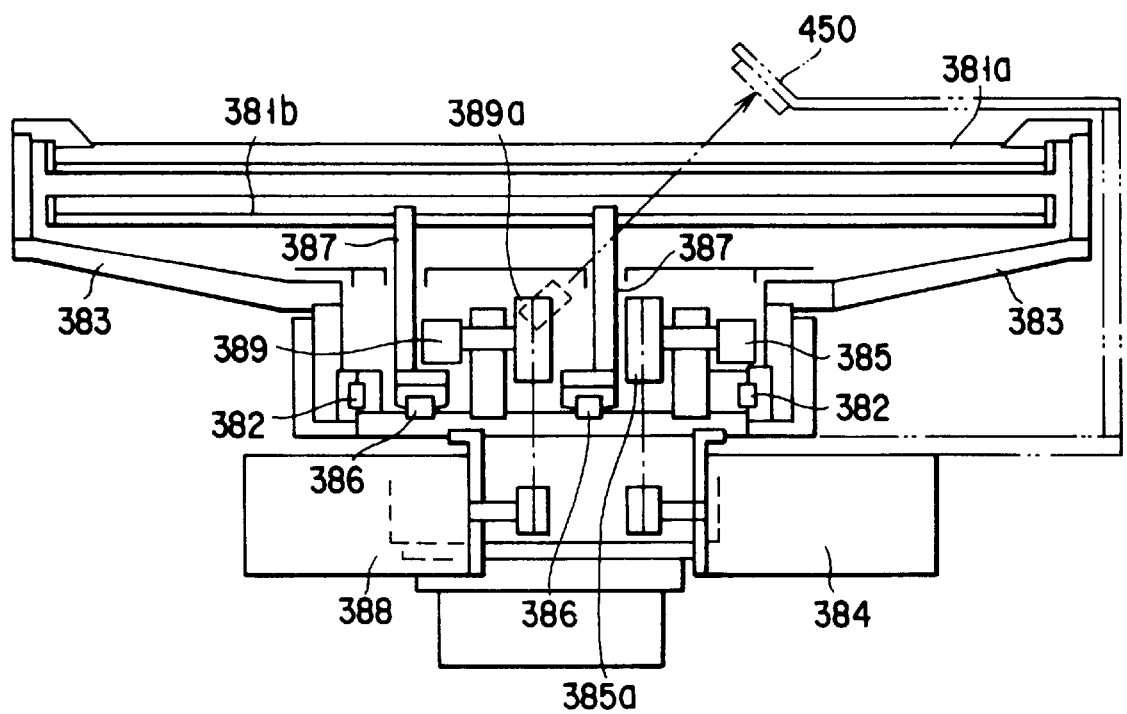
F I G. 42

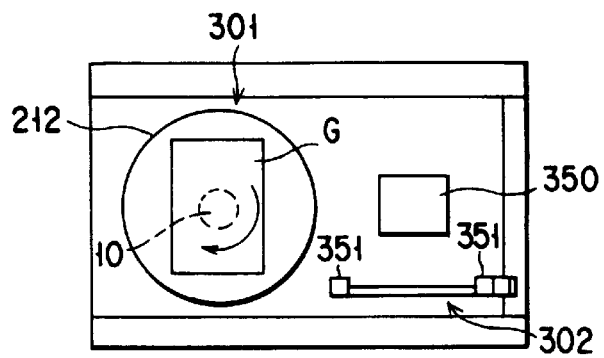
F I G. 44A
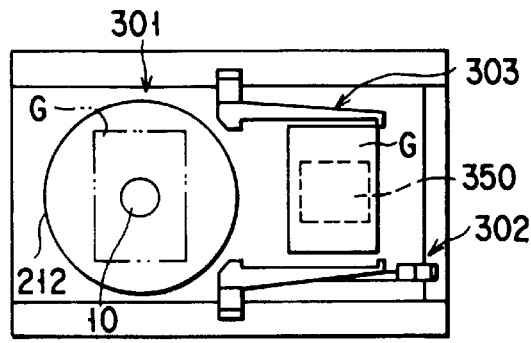
F I G. 44B
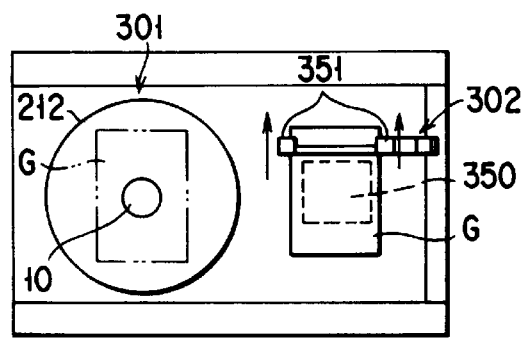
F I G. 44C
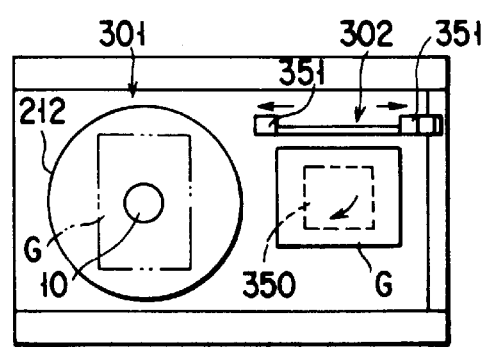
F I G. 44D
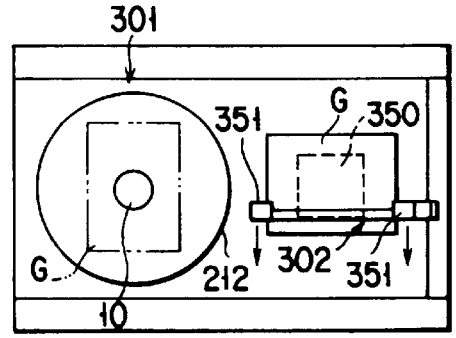
F I G. 44E

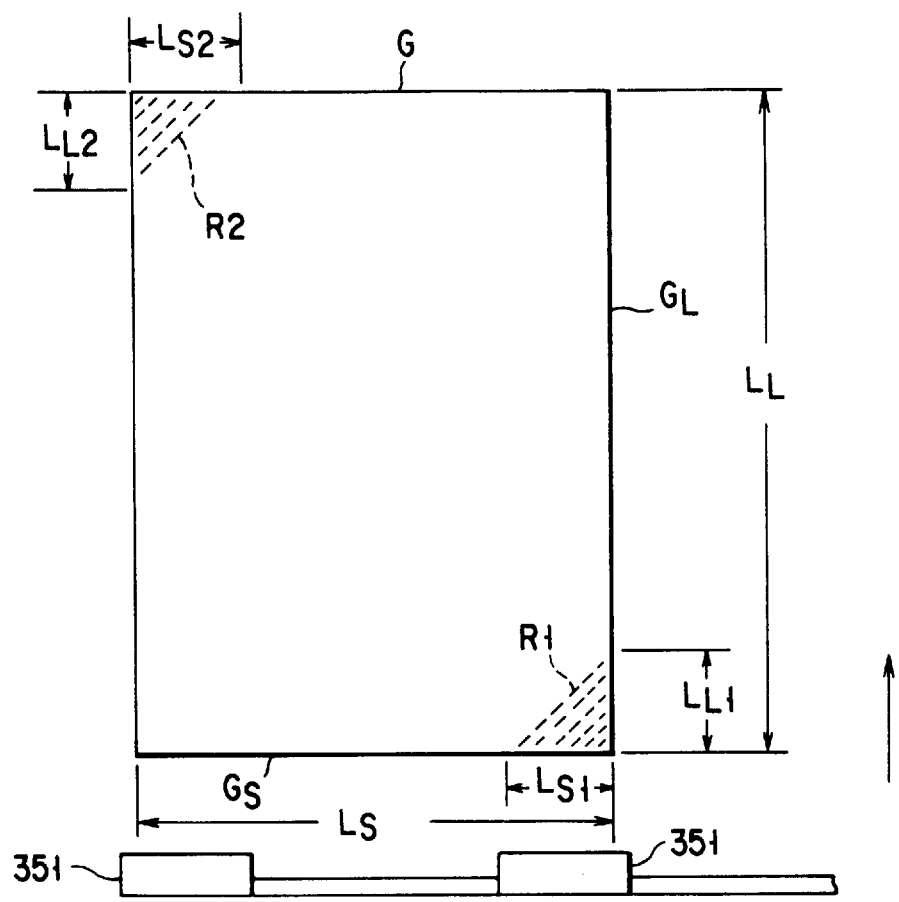
F I G. 45

METHOD OF FORMING A COATING FILM AND COATING APPARATUS

This is a Division of application Ser. No. 08/512,018 filed on Aug. 7, 1995 now U.S. Pat. No. 5,695,817.

BACKGROUND OF THE INVENTION

1. Field of the Invention

The present invention relates to a method of forming a coating film and a coating apparatus for forming a liquid coating film such as a resist film containing a solvent on a coating target such as a liquid crystal display (to be referred to as an LCD hereinafter) substrate or a layer formed thereon.

2. Description of the Related Art

In the conventional manufacture of TFT-LCDs, to selectively etch semiconductor, insulator, and electrode layers formed on an LCD substrate into a predetermined pattern, a resist film served as a masking layer is formed on the uppermost pattern as in a semiconductor wafer.

The following method is known as a method of forming a resist film. According to the method, a quadrangular LCD substrate is placed and fixed on a table disposed in a processing vessel, the opening portion of the processing vessel is closed with a lid, and the processing vessel is rotated together with the table. In this state, a resist solution consisting of a solvent and a photosensitive resin is dropped on the central portion of the upper surface of the substrate and spirally diffused from the central portion to the peripheral portion of the substrate in accordance with rotational and centrifugal forces of the substrate.

According to this method, during diffusion of the resist solution from the central position to the peripheral portion, the solvent in the resist solution is evaporated. The viscosity of the resist solution varies depending on the diffusion directions, and the thickness of the resist film formed at the central portion tends to be different from that at the peripheral portion. In addition, the peripheral speed of the circumferential portion of the substrate is higher than that at the central position of the substrate, and the circumferential portion has a larger resist solution scattering amount than that of the central position. It is, therefore, difficult to form a coating film having a uniform thickness.

To solve this problem, there are proposed (1) a method of suppressing evaporation of a solvent in a resist solution by adjusting the temperature of the resist solution or filling a solvent identical to that of the resist solution in a resist film formation atmosphere, and (2) a method of dropping the solvent of the resist solution on the surface of the substrate prior to the application of the resist solution.

In method (1), that is, the method of suppressing evaporation of a solvent in a resist solution by adjusting the temperature of the resist solution or filling a solvent identical to that of the resist solution in a resist film formation atmosphere, the amount of resist solution is large. For example, only a few % of the total resist solution coating amount can contribute to actual resist film formation. The resist solution may flow onto the corner portions of the lower surface of the substrate. When this resist solution attached to the corner portions of the lower surface is dried, particles may be formed, thus posing a problem.

Even in method (2), that is, the method of dropping the solvent of the resist solution on the surface of the substrate prior to the application of the resist solution, the above problem cannot be satisfactorily solved because it is difficult to uniformly form a coating film due to nonuniformity of the solvent itself on the substrate and difference of dried states. Even in this method, when the substrate particularly has a rectangular shape, an extra amount of resist solution must be undesirably used to form a resist film on the entire surface of the substrate. The coating liquid flows onto the lower corner surface portions as in method (1). When the coating liquid on the corner portions of the lower surface is dried, particles are formed to decrease the product yield.

The interior of the processing vessel is set to a negative pressure by rotation, and a large force is required to open the lid upon processing. Therefore, care must be taken to open the lid to result in a decrease in throughput.

In applying a resist solution to a substrate surface, a phenomenon occurs in which the resist solution flows onto the edge portion of the lower surface of the substrate to form an unnecessary film, thereby forming a nonuniform and thick film at the edge portion of the substrate. When the nonuniform and thick film is formed at the edge portion of the substrate, the resist film at the edge portion is left without being perfectly removed in development of an integrated circuit pattern or the like. The remaining resist peels off in the subsequent substrate convey step, thus forming particles.

Conventionally, an unnecessary coating film is removed from the edge portion of the substrate after the surface of the substrate is coated with the resist solution. This coating film removing step is to spray a removing liquid such as a solvent to the edge portion of the substrate after the coating film forming step, thereby removing the unnecessary coating film from the edge portion of the substrate.

When a dedicated coating film removing unit is incorporated in a coating/developing system, the unnecessary coating film can be removed from the edge portion of the substrate continuously with coating on the substrate.

When the dedicated coating film removing unit is incorporated in the coating/developing system, the facilities become bulky. In addition to coating and unnecessary coating film removal, steps such as loading of the substrate to a coating mechanism, conveyance of the substrate from the coating mechanism to the coating film removing mechanism, and unloading of the substrate from the coating film removing mechanism are required, and the throughput may be decreased.

Furthermore, since the substrate has a rectangular shape, when the substrate is rotated at high speed upon applying the coating liquid such as a resist solution to the substrate to swish off the coating liquid, the coating liquid scattered outward from the periphery of the substrate by the centrifugal force may be attached to the corner portions of the lower surface of the rotating substrate again. The coating liquid attached to the substrate may be dried to form particles, thus posing a problem.

SUMMARY OF THE INVENTION

It is an object of the present invention to provide a method of forming a coating film having a uniform thickness using a small amount of coating liquid such as a resist solution, and a coating apparatus capable of realizing such a method.

It is another object of the present invention to provide a method of forming a coating film, capable of increasing a product yield, and a coating apparatus capable of realizing such a method.

It is still another object of the present invention to provide a coating apparatus and a method of forming a coating film, capable of preventing a substrate and a processing vessel from being contaminated by a coating liquid mist formed in supplying the coating liquid to a substrate to increase the product yield, and capable of facilitating to open a lid to increase the throughput.

It is still another object of the present invention to provide a coating apparatus and a method of forming a coating film, capable of increasing the throughput in coating and developing a substrate and increasing the product yield by removing an unnecessary coating film from the edge portion of the substrate.

According to the first aspect of the present invention, there is provided a method of forming a coating film, in which the coating film is formed by supplying a coating liquid onto a surface of a substrate, while the substrate housed in a processing vessel is rotated together with the processing vessel, comprising the steps of:

coating the surface of the substrate with a solvent;

supplying the coating liquid to the substrate;

rotating the substrate and the processing vessel at a first rotation speed to diffuse the coating liquid on the surface of the substrate;

closing the processing vessel with a lid to seal the substrate in the processing vessel; and rotating the processing vessel with the lid and the substrate at a second rotation speed to uniform a film thickness of the coating film.

According to the second aspect of the present invention, there is provided a method of forming a coating film, in which the coating film is formed by supplying a coating liquid onto a surface of a substrate, while the substrate housed in a processing vessel is rotated together with the processing vessel, comprising the steps of:

coating the surface of the substrate with a solvent;

supplying the coating liquid to the substrate;

rotating the substrate and the processing vessel at a first rotation speed to diffuse the coating liquid on the surface of the substrate;

closing the processing vessel with a lid to seal the substrate in the processing vessel; and rotating the processing vessel with the lid and the substrate at a second rotation speed higher than the first rotation speed, and causing air fed from an upper central portion of the processing vessel into the processing vessel to flow to a lower side portion along an inner wall of the processing vessel to uniform a film thickness of a coating film.

According to the third aspect of the present invention, there is provided a method of forming a coating film, in which the coating film is formed by supplying a coating liquid onto a surface of a substrate, while the substrate housed in a processing vessel is rotated together with the processing vessel, comprising the steps of:

coating the surface of the substrate with a solvent;

supplying the coating liquid to the substrate;

rotating the substrate and the processing vessel at a first rotation speed to diffuse the coating liquid on the surface of the substrate;

closing the processing vessel with a lid to seal the substrate in the processing vessel; and rotating the processing vessel with the lid and the substrate at a second rotation speed higher than the first rotation speed, causing air fed from an upper central portion of the processing vessel into the processing vessel to flow to a lower side portion along an inner wall of the processing vessel, and causing air to flow from an upper portion outside the processing vessel along an outer wall of the processing vessel to uniform a film thickness of a coating film.

According to the fourth aspect of the present invention, there is provided a coating apparatus comprising:

support means for supporting a substrate with a surface of the substrate being set horizontal;

substrate rotation means for rotating the support means about a direction perpendicular to the surface of the supported substrate to rotate the substrate;

a cup-like processing vessel for surrounding the substrate;

vessel rotation means for rotating the processing vessel together with the substrate;

a lid for closing an opening portion of the processing vessel;

solvent supply means for supplying a solvent for a coating liquid to the substrate; and coating liquid supply means for supplying the coating liquid to the substrate.

According to the fifth aspect of the present invention, there is provided a coating apparatus comprising:

substrate support means for supporting a substrate with a surface of the substrate being set horizontal;

substrate rotation means for rotating the substrate support means about a direction perpendicular to the surface of the supported substrate to rotate the substrate;

a cup-like processing vessel, having an air discharge hole near a bottom portion, for surrounding the substrate;

vessel rotation means for rotating the processing vessel together with the substrate;

a lid, having an air inlet port at a central portion, for closing an opening portion of the processing vessel;

a current plate, located below the lid, for diffusing air fed from the air inlet port outward;

solvent supply means for supplying a solvent for a coating liquid to the substrate; and coating liquid supply means for supplying the coating liquid to the substrate.

According to the sixth aspect of the present invention, there is provided a coating apparatus comprising:

substrate support means for supporting a substrate with a surface of the substrate being set horizontal;

substrate rotation means for rotating the substrate support means about a direction perpendicular to the surface of the supported substrate to rotate the substrate;

a cup-like processing vessel, having an air discharge hole near a bottom portion, for surrounding the substrate;

vessel rotation means for rotating the processing vessel together with the substrate;

a lid, having an air inlet port at a central portion, for closing an opening portion of the processing vessel;

a current plate, located below the lid, for diffusing air fed from the air inlet port outward;

a fixed vessel, having an air discharge port at a lower portion, for surrounding the processing vessel;

a fixed lid, having a plurality of air supply holes at a central portion, for closing an opening portion of the fixed vessel;

solvent supply means for supplying a solvent for a coating liquid to the substrate; and coating liquid supply means for supplying the coating liquid to the substrate.

According to the seventh aspect of the present invention, there is provided a coating apparatus comprising:

substrate support means for supporting a substrate with a surface of the substrate being set horizontal;

substrate rotation means for rotating the substrate support means about a direction perpendicular to the surface of the supported substrate to rotate the substrate;

a cup-like processing vessel, having an air discharge hole near a bottom portion, for surrounding the substrate;

vessel rotation means for rotating the processing vessel together with the substrate;

a lid, having an air inlet port at a central portion, for closing an opening portion of the processing vessel;

inert gas supply means, retractable with respect to interior of the processing vessel, for supplying an inert gas into the processing vessel; and coating liquid supply means for supplying a coating liquid to the substrate.

According to the eighth aspect of the present invention, there is provided a coating apparatus comprising:

substrate support means for supporting a substrate with a surface of the substrate being set horizontal;

substrate rotation means for rotating the substrate support means about a direction perpendicular to the surface of the supported substrate to rotate the substrate;

a cup-like processing vessel, having an air discharge hole near a bottom portion, for surrounding the substrate;

vessel rotation means for rotating the processing vessel together with the substrate;

a lid, having an air inlet port at a central portion, for closing an opening portion of the processing vessel;

inert gas supply means, retractable with respect to interior of the processing vessel, for supplying an inert gas into the processing vessel;

vessel cleaning means retractable with respect to interior of the processing vessel; and coating liquid supply means for supplying a coating liquid to the substrate.

According to the ninth aspect of the present invention, there is provided a method of forming a coating film, in which the coating film is formed by supplying a coating liquid onto a surface of a substrate, while the substrate housed in a processing vessel is rotated together with the processing vessel, comprising the steps of:

supplying the coating liquid to the substrate;

rotating the substrate and the processing vessel to diffuse the coating liquid on the surface of the substrate;

closing the processing vessel with a lid to seal the substrate in the processing vessel;

rotating the processing vessel with the lid and the substrate to uniform a film thickness of a coating film; and supplying an inert gas into the processing vessel which stops rotating.

According to the tenth aspect of the present invention, there is provided a method of forming a coating film, in which the coating film is formed by supplying a coating liquid onto a surface of a substrate, while the substrate housed in a processing vessel is rotated together with the processing vessel, comprising the steps of:

supplying the coating liquid to the substrate;

rotating the substrate and the processing vessel to diffuse the coating liquid on the surface of the substrate;

closing the processing vessel with a lid to seal the substrate in the processing vessel;

rotating the processing vessel with the lid and the substrate to uniform a film thickness of a coating film;

supplying an inert gas into the processing vessel which stops rotating;

opening the lid to unload the substrate from the processing vessel;

closing the processing vessel with the lid again; and spraying a cleaning liquid into the processing vessel in this state.

According to the eleventh aspect of the present invention, there is provided a coating apparatus comprising:

a coating mechanism having substrate support means for supporting a quadrangular substrate with a surface of the substrate being set horizontal, substrate rotation means for rotating the substrate support means about a direction perpendicular to the surface of the supported substrate to rotate the substrate, a cup-like processing vessel for surrounding the substrate, vessel rotation means for rotating the processing vessel together with the substrate, a lid for closing an opening portion of the processing vessel, and coating liquid supply means for supplying a coating liquid to the substrate;

a coating film removing mechanism for spraying a coating film removing liquid to an edge portion of the substrate on which a coating film is formed by the coating mechanism to remove the coating film from the edge portion;

a first convey mechanism for loading the substrate in the coating mechanism and unloading the substrate from the coating film removing mechanism; and a second convey mechanism for conveying the substrate from the coating mechanism to the coating film removing mechanism.

According to the twelfth aspect of the present invention, there is provided a coating apparatus comprising:

a coating mechanism having substrate support means for supporting a quadrangular substrate with a surface of the substrate being set horizontal, substrate rotation means for rotating the substrate support means about a direction perpendicular to the surface of the supported substrate to rotate the substrate, a cup-like processing vessel for surrounding the substrate, vessel rotation means for rotating the processing vessel together with the substrate, a lid for closing an opening portion of the processing vessel, solvent supply means for supplying a solvent to the substrate, and coating liquid supply means for supplying a coating liquid to the substrate;

a coating film removing mechanism for spraying a coating film removing liquid to a side portion of the substrate on which a coating film is formed by the coating mechanism to remove the coating film from the edge portion;

a first convey mechanism for loading the substrate in the coating mechanism and unloading the substrate from the coating film removing mechanism; and a second convey mechanism for conveying the substrate from the coating mechanism to the coating film removing mechanism.

According to the thirteenth aspect of the present invention, there is provided a method of forming a coating film, comprising the steps of:

loading a substrate in a processing vessel of a coating mechanism;

supplying a coating liquid to the substrate;

rotating the substrate to diffuse the coating liquid on a surface of the substrate;

closing the processing vessel with a lid to seal the substrate in the processing vessel;

rotating the processing vessel with the lid and the substrate to uniform a film thickness of a coating film;

conveying the substrate having the coating film formed thereon to a coating film removing mechanism for removing the coating film from an edge portion;

removing the coating film from the edge portion by supplying a coating film removing liquid for removing the coating film to the edge portion of the substrate in the coating film removing mechanism; and unloading the substrate from the coating film removing mechanism.

According to the fourteenth aspect of the present invention, there is provided a method of forming a coating film, comprising the steps of:

loading a substrate in a processing vessel of a coating mechanism;

coating a surface of the substrate with a solvent;

supplying a coating liquid to the substrate;

rotating the substrate to diffuse the coating liquid on the surface of the substrate;

closing the processing vessel with a lid to seal the substrate in the processing vessel;

rotating the processing vessel with the lid and the substrate to uniform a film thickness of a coating film;

conveying the substrate having the coating film formed thereon to a coating film removing mechanism for removing the coating film from an edge portion;

removing the coating film from the edge portion by supplying a coating film removing liquid for removing the coating film to the edge portion of the substrate in the coating film removing mechanism; and unloading the substrate from the coating film removing mechanism.

BRIEF DESCRIPTION OF THE DRAWINGS

FIG. 2 is a plan view showing the coating apparatus in FIG. 1;

FIG. 3 is an enlarged sectional view showing the main part in FIG. 1;

FIG. 4 is a partially cutaway perspective view showing a rotary cup and its lid used in the apparatus in FIG. 1;

FIG. 8 is a sectional view showing the supply system of a solvent and a resist solution including the spray head;

FIG. 11 is a graph showing a relationship between a substrate rotation speed and a resist amount required to coat the entire substrate surface;

FIG. 12 is a graph showing the influence of the substrate rotation speed on a variation in resist film thickness;

FIG. 13 is a graph showing a relationship between the substrate rotation speed and the discharge time of a resist solution;

FIG. 26 is a partially cutaway perspective view showing a rotary cup and its lid used in the apparatus in FIG. 23;

FIG. 31 is a plan view schematically showing the arrangement of a coating apparatus according to the third embodiment of the present invention;

FIG. 32 is a side view showing a removing mechanism used in the coating apparatus shown in FIG. 31;

FIG. 33 is a partially sectional side view showing removing nozzles used in the removing mechanism shown in FIG. 32;

FIG. 34 is a perspective view schematically showing the removing nozzles in FIG. 33;

FIG. 37 is a partially sectional side view showing another example of the auxiliary cleaning nozzles used in the removing mechanism;

FIG. 38 is a perspective view showing still another example of the auxiliary cleaning nozzles;

FIG. 39 is a perspective view schematically showing the arrangement of the second convey mechanism used in the coating apparatus shown in FIG. 31;

FIG. 41 is a perspective view showing the main part of a main arm of the first convey mechanism used in the coating apparatus shown in FIG. 31;

FIG. 42 is a side view showing a driving mechanism of the main arm shown in FIG. 41;

FIGS. 44A to 44E are plan views for explaining a procedure of removing a coating film from the edge portions of a substrate;

FIG. 45 is a plan view for explaining a method of removing a resist film attached to the lower corner surface portions of a substrate with auxiliary nozzles;

DETAILED DESCRIPTION OF THE PREFERRED EMBODIMENTS

Figure 1:
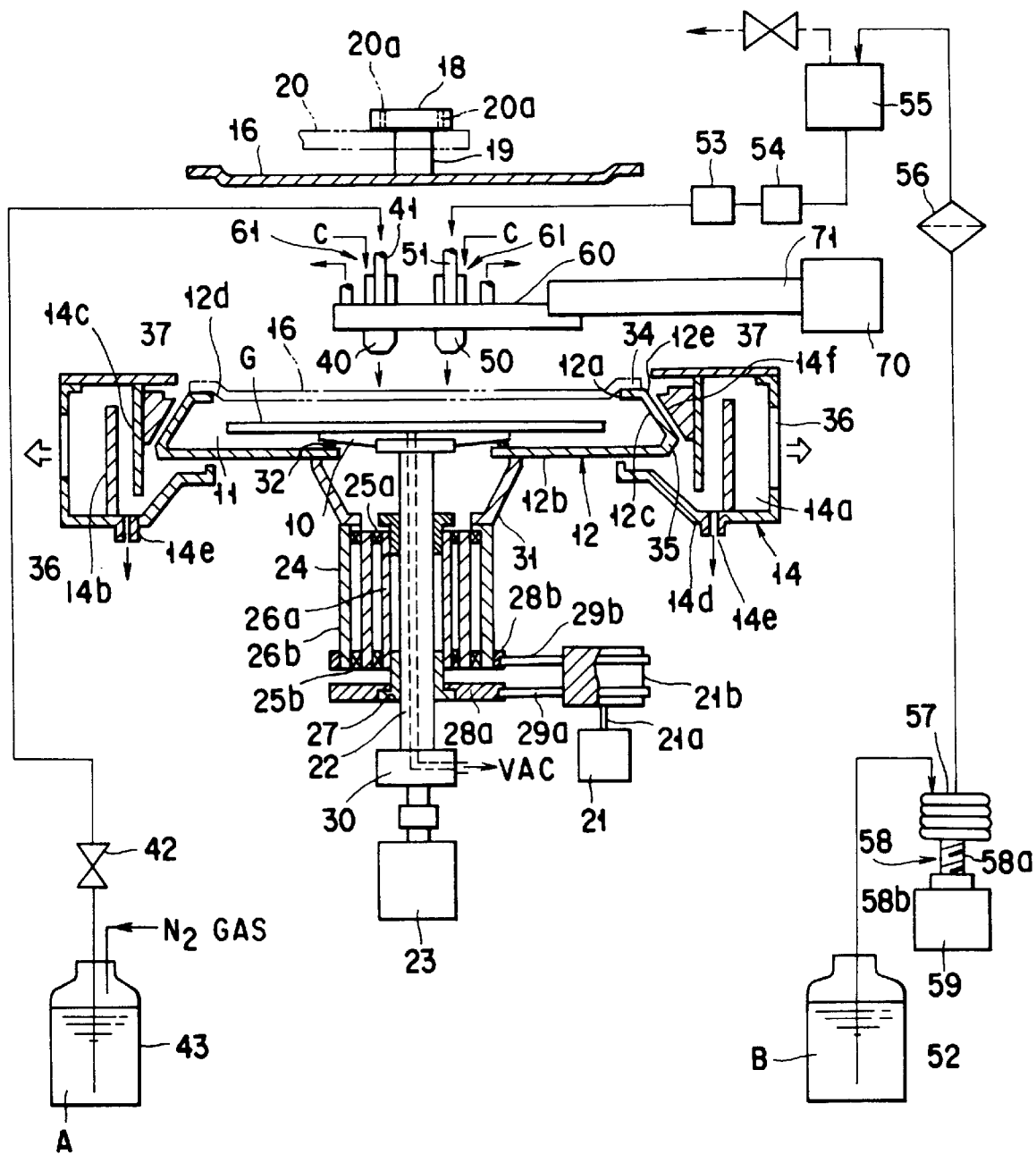
FIG. 1 is a sectional view schematically showing the arrangement of a coating apparatus according to the first embodiment of the present invention.

Preferred embodiments of the present invention will be described below with reference to the accompanying drawings.

The following embodiments will exemplify a case wherein a method of forming a coating film and a coating film forming apparatus of the present invention are applied to a method of forming a resist film on an LCD substrate (glass substrate) and a forming apparatus.

FIGS. 1 to 4 show a coating apparatus according to one embodiment of the present invention. This coating apparatus has a spin chuck 10 for horizontally, rotatably holding a quadrangular LCD substrate G (to be referred to as a substrate hereinafter) as a coating target by vacuum suction, a cup-like rotatable processing vessel (rotary cup) 12 having an opening on the upper portion and a processing chamber 11 surrounding the upper and circumferential portions of the spin chuck 10, a lid 16 detachably provided to the cup 12 and capable of closing an opening portion 12a of the rotary cup 12, a robot arm 20 for moving the lid 16 between a closing position and a waiting position, a hollow ring-like drain cup 14 arranged to surround the circumferential side of the rotary cup 12, a driving motor 21 for rotating the spin chuck 10 and the rotary cup 12, a spray head 60 movably arranged above the spin chuck 10, and a moving mechanism 70 which grips the spray head 60 to move it between a spray head waiting position and a position above a substrate. The spray head 60 is constituted by integrally mounting a solvent supply nozzle 40 for supplying a solvent of a coating liquid and a coating liquid supply nozzle 50 for supplying resist solution B as a coating liquid so as to be adjacent each other.

A solvent supply path and a resist solution supply path of the nozzles 40 and 50 have temperature adjustment mechanisms 61. Each temperature adjustment mechanism 61 circulates and supplies a temperature adjustment solution C for adjusting a solvent A or a resist solution B flowing through a corresponding path to a predetermined temperature (for example, 23° C.).

Figure 5:
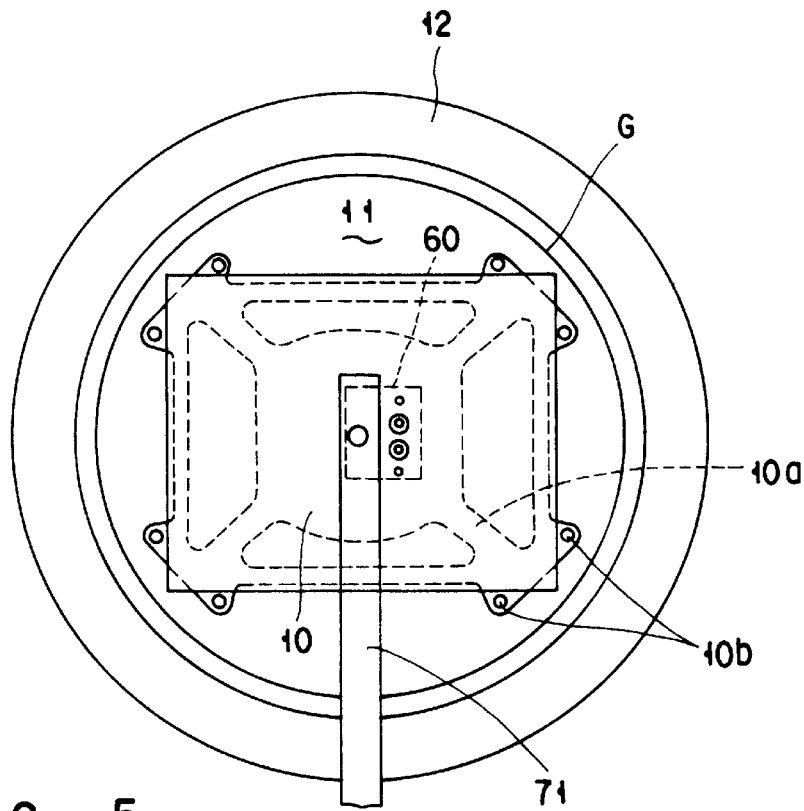
FIG. 5 is a plan view showing another example of a substrate holding mechanism.

The spin chuck 10 is formed a heat-resistant synthetic resin such as polyether ether ketone (PEEK) and is driven on the basis of a predetermined program. The spin chuck 10 can is horizontally rotated (rotated about its axis) through a rotating shaft 22 rotated upon driving of the driving motor 21 having a variable rotation speed. The spin chuck 10 can also be vertically moved upon driving of an elevating cylinder 23 coupled to the rotating shaft 22. In this case, the rotating shaft 22 is vertically slidably coupled to a spline bearing 27. The spline bearing 27 is fitted in the inner circumferential surface of an inner rotary cylinder 26a rotatably mounted on the inner circumferential surface of a fixed collar 24 through a bearing 25a. A driven pulley 28a is mounted on the spline bearing 27, and a belt 29a is looped between the driven pulley 28a and a driving pulley 21b mounted on a driving shaft 21a of the driving motor 21. The rotating shaft 22, therefore, is rotated through the belt 29a upon driving of the driving motor 21 to rotate the spin chuck 10. The lower side of the rotating shaft 22 is disposed in a cylindrical member (not shown), and the rotating shaft 22 is coupled to the elevating cylinder 23 through a vacuum seal portion 30 in this cylindrical member. The rotating shaft 22 can be vertically moved upon driving of the elevating cylinder 23 to vertically move the spin chuck. Note that the spin chuck 10 is constituted to hold the substrate G by vacuum suction. Alternatively, as shown in FIG. 5, a plurality of support arms 10a may be provided outward, and locking pins 10b are arranged at the distal end portions to lock the corner portions of the substrate G by these locking pins 10b.

A coupling cylinder 31 is fixed to the upper end portion of an outer rotary cylinder 26b mounted on the circumferential surface of the fixed collar 24 through a bearing 25b. The rotary cup 12 is mounted through this coupling cylinder 31. A bearing 32 with a seal function is interposed between a bottom portion 12b of the rotary cup 12 and the lower surface of the spin chuck 10, and the rotary cup 12 can rotate relative to the spin chuck 10. A driven pulley 28b is mounted on the outer rotary cylinder 26b, and a belt 29b is looped between the driven pulley 28b and the driving pulley 21b mounted on the driving motor 21. Therefore, driving of the driving motor 21 is transmitted to the rotary cup 12 through this belt 29b to rotate the rotary cup 12.

In this case, the diameter of the driven pulley 28b is equal to the diameter of the driven pulley 28a mounted on the rotating shaft 22, and the belts 29a and 29b are wound on the same driving motor 21. With this arrangement, the rotary cup 12 and the spin chuck 10 are rotated at the same speed. Note that, as shown in FIG. 3, labyrinth seal portions 33 are formed on an opposing surface between the fixed collar 24 and the inner rotary cylinder 26a and an opposing surface between the fixed collar 24 and the outer rotary cylinder 26b to prevent dust from entering from a lower driving system into the rotary cup 12 during rotation.

The rotary cup 12 has a side wall 12c having a diameter reduced upward. This side wall 12c surface serves as a tapered surface 12e. An inward flange 12d is formed inward at the upper end of the side wall 12c. Air supply holes 34 are formed in the inward flange 12d of the rotary cup 12 in the circumferential direction at proper intervals. Exhaust holes 35 are formed in the lower side of the side wall 12c in the circumferential direction at proper positions (see FIG. 4). With the air supply holes 34 and the exhaust holes 35, air flowing through the air supply holes 34 to the processing chamber 11 flows outward through the air discharge holes 35. Therefore, the interior of the processing chamber 11 can be prevented from being set to a negative pressure during rotation of the rotary cup 12, and the lid 16 can be easily opened from the rotary cup 12 without requiring a large force upon processing.

On the other hand, an annular passage 14a is arranged in the drain cup 14. Exhaust ports 36 are formed in the circumferential wall of the drain cup 14 at proper portions (for example, four portions in the circumferential direction)

and coupled to an air discharge unit (not shown). In addition, radial exhaust passages 37, which communicate with the annular passage 14a and the exhaust ports 36, are formed in the upper inner circumferential side portions of the drain cup 14 (see FIG. 1). In this manner, the exhaust ports 36 are formed in the circumferential portions of the drain cup 14, and the exhaust passages 37 are formed in the upper inner circumferential side portions of the drain cup 14. With this arrangement, a mist which is scattered in the processing chamber 11 by the centrifugal force during rotation and flows into the drain cup 14 through the air supply holes 34 can be prevented from being blown to the upper side of the rotary cup 12, and the mist can be discharged outside through the air discharge ports 36.

The annular passage 14a is partitioned by an outer wall 14b standing from the bottom portion of the drain cup 14 and an inner wall 14c suspended from the ceiling portion of the drain cup 14 to form a detour path, thereby uniformly discharging air. Drain holes 14e are formed in a bottom portion 14d between the outer wall 14b and the inner wall 14c in the circumferential direction at proper intervals.

A tapered surface 14f having a taper corresponding to the tapered surface 12e of the rotary cup 12 is formed on the inner circumferential surface of the drain cup 14. A small gap is formed between the tapered surface 12e of the rotary cup 12 and the tapered surface 14f of the drain cup 14. Formation of the small gap, which is tapered downward, induces a pressure difference due to a peripheral speed difference between the upper and lower portions of the small gap during rotation of the rotary cup 12. This pressure difference promotes an air flow from the upper side to the lower side of the small gap on the circumferential portion of the rotary cup 12 to prevent discharge mist in the drain cup 14 from being scattered outside the rotary cup 12 through the small gap.

Even if the mist tends to go upward through the small gap and be scattered outside the rotary cup 12, it is discharged from the air discharge ports 36 through the annular passage 14a in the drain cup 14.

The case has been described in which the drain cup 14 is arranged to surround the circumferential side of the rotary cup 12. The drain cup 14 need not be always arranged on the circumferential side of the rotary cup 12 and may be arranged on the lower side of the rotary cup 12.

The lid 16 must be fixed to the opening portion 12a of the rotary cup 12 and rotated together with the rotary cup 12 during rotation. As shown in FIG. 4, fixed pins 17a projecting at the upper portions of the rotary cup 12 are fitted in fitting recessed portions 17b, which fit with the fixed pins 17a, to fix the lid 16 to the rotary cup 12. In this case, dust formed in contact with the fitting recessed portions 17b is reduced by forming spherical top portions of the fixed pins 17a. Note that the fixed pins 17a need not always project on the rotary cup side. The fixed pins 17a may be projected on the lid side, and the fitting recessed portions 17b may be formed on the rotary cup side. In addition, a suction means (not shown) may be connected in the fitting recessed portions 17b to discharge, outside, dust formed when the fitting recessed portions 17b contact with the fixed pins 17a.

A support member 19 projecting upward is arranged on the upper central surface of the lid 16. A head portion 18 having a diameter larger than that of the support member 19 is arranged on the upper end of the support member 19. In opening/closing the lid 16, the robot arm 20 is inserted below the head portion 18 arranged on the upper surface of the lid 16 through the support member 19, as indicated by a chain double-dashed line in FIG. 1. Locking pins 20a projecting from the robot arm 20 are engaged with locking grooves 18a formed in the head portion 18 (see FIG. 4). Then, the robot arm 20 is vertically moved.

Note that positioning of the locking grooves 18a of the head portion 18 and the locking pins 20a of the robot arm 20 in opening the lid 16, and positioning of the fixed pins 17a and the fitting recessed portions 17b in closing the lid 16 are performed by controlling the rotation angle of the driving motor 21 constituted by, for example, a servomotor.

The case has been described in which the lid 16 is fixed to the rotary cup 12 by fitting the fixed pins 17a in the fitting recessed portions 17b. Such a structure, however, is not necessarily required. If the lid 16 is fixed to the rotary cup 12 using another press mechanism, formation of dust in opening the lid 16, cluttering of the lid 16 during rotation, and the like can be prevented.

Note that it is possible to arrange a baffle plate (not shown) which is mounted on the central portion of the lid 16 and formed of a perforated plate larger than the substrate G at a middle position between the lid 16 and the substrate G. In this manner, generation of turbulent flow in the processing chamber 11 can be more reliably prevented during coating by arranging the baffle plate.

The solvent supply nozzle 40 is connected to a solvent tank 43 through a solvent supply tube 41 as solvent supply path and an opening/closing valve 42. By supplying nitrogen ($N_2$) gas to the solvent tank 43, the solvent A in the solvent tank 43 is supplied to the substrate G due to pressure loading. In this case, the flow rate of the solvent A is controlled by controlling the pressure force of the $N_2$ gas, and a predetermined a mount of solvent A is supplied for a predetermined time.

The resist solution supply nozzle 50 communicates with a resist solution tank 52 (coating liquid supply source) containing the resist solution B through a resist solution supply tube 51 serving as a resist solution supply path. A suck back valve 53, an air-operated valve 54, a bubble removing mechanism 55 for separating and removing bubbles in the resist solution B, a filter 56, and a bellows pump 57 are sequentially arranged on this tube 51. The bellows pump 57 is extendible by a driving portion. By controlling this extension, a predetermined amount of resist solution B can be supplied (dropped) onto the central portion of the substrate G through the resist solution supply nozzle 50. The bellows pump 57 can control the supply amount of resist solution B to an amount smaller than the supply amount of conventional resist solution B. This driving portion comprises a ball screw mechanism 58 constituted by a screw 58a, which has one end mounted on one end of the bellows pump, and a nut 58b threadably engaged with this screw, and a stepping motor 59 for rotating this nut 58b to linearly move the screw 58a.

The diameter of the resist solution supply nozzle 50 is set in accordance with the size of the substrate G. For a 500×600-mm substrate, the inner diameter is set to $\phi$0.5 to $\phi$5 mm, and preferably to $\phi$3 mm. In this manner, if the diameter of the nozzle is set in accordance with the size of the substrate the minimum amount of resist solution B can be supplied for a long period of time. This is because the uniformity of a film thickness is degraded with a short supply time. If it is too long, however, the resist solution does not reach the edge portion of the substrate, so the supply time is preferably set proper. Supply of a small amount of resist solution depends on the diameter of the nozzle 50 and the resist solution supply pressure.

In the resist solution supply system having the above arrangement, the discharge time of the resist solution is controlled by the driving time of the stepping motor 59 of the bellows pump 57 (control accuracy: ±2 msec). Further, the discharge amount of resist solution is set by the driving operation of the bellows pump 57, for example, the driving time and driving speed, and the opening/closing operation (ON-OFF operation) of the air-operated valve 54 for opening/closing the resist solution supply path. Setting of the driving time of the bellows pump 57 and the ON-OFF operation of the air-operated valve 54 are automatically controlled by the operation of a computer on the basis of a predetermined program.

The discharge time of the resist solution B can also be controlled by opening/closing a variable orifice (not shown) provided to the resist solution supply nozzle 50. Alternatively, $N_2$ gas may be supplied to the resist solution tank 52 without using the bellows pump 57 to supply the resist solution B by the pressure force. In this case, the discharge time of the resist solution B can be controlled by adjusting the pressure amount of $N_2$ gas.

The suck back valve 53 provided to the above resist solution supply system is a valve which draws back the resist solution B remaining on the inner wall portion of the distal end of the resist solution supply nozzle 50 due to the surface tension into the resist solution supply nozzle 50 after discharging the resist solution from the resist solution supply nozzle 50. This prevents solidification of the remaining resist solution. In the resist solution supply nozzle 50 for discharging a small amount of resist solution B, if the resist solution B is normally drawn back into the resist solution supply nozzle 50 by the negative pressure function of the suck back valve 53, air around the distal end of the nozzle 50 may also be drawn in the nozzle 50. The residue of the resist solution B attached to the distal end of the nozzle 50 may enter the nozzle 50 to clog the nozzle 50. Further, the dried resist may form particles to contaminate the substrate G and decrease the yield.

Figure 6A:
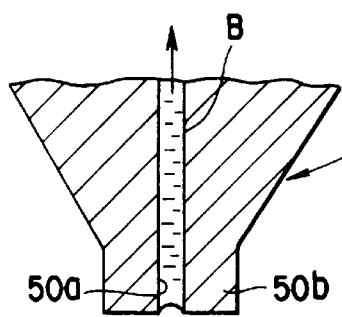
FIGS. 6A to 6C are sectional views showing modifications of the distal end portion of a resist solution supply nozzle.

To solve this problem, as shown in FIG. 6A, the nozzle 50 is constituted by a thick cylindrical distal end portion obtained by setting a thickness 50b of a portion near the opening portion larger than that of a nozzle hole 50a of the resist solution supply nozzle 50, and an inverted frustoconical portion continuous to this cylindrical distal end portion.

Figure 6B:
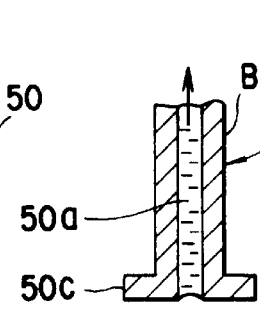

Instead of this, as shown in FIG. 6B, an outward flange 50c is provided to the cylindrical distal end portion or opening portion of the resist solution supply nozzle 50, thereby preventing air around the distal end of the nozzle 50 from being drawn in suck back.

Further, a small-diameter bent portion 50d extending in a lateral S-shaped manner is formed at the vertically extending cylindrical distal end of the resist solution supply nozzle 50. Suck back is performed up to the vicinity of the center of this bent portion 50d, thereby similarly preventing air at the nozzle distal end portion from being drawn.

Figure 7:
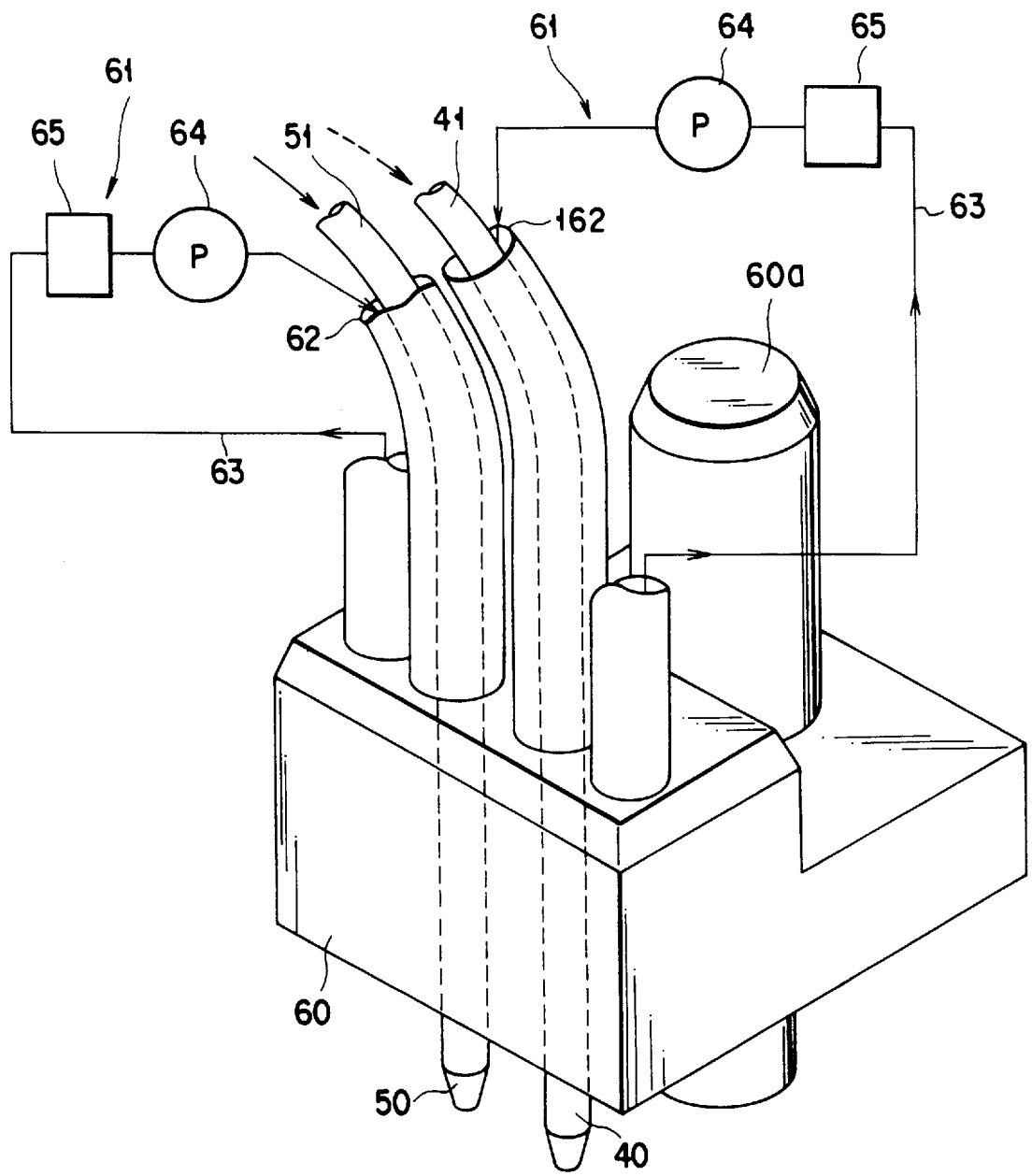
FIG. 7 is a perspective view showing a spray head having a solvent supply nozzle and the resist solution supply nozzle used in the coating apparatus in FIG. 1.

As shown in FIG. 7, the temperature adjustment mechanisms 61 are constituted by temperature adjustment solution supply paths 62, circulating paths 63, circulating pumps 64 provided to the respective circulating paths 63, and thermo modules 65 for keeping the temperature adjustment solution C (for example, constant-temperature water) at a constant temperature. Each circulating path 63 has two ends connected to the two end portions of a corresponding one of the temperature adjustment solution supply paths 62. Each temperature adjustment solution supply path 62 is provided to surround the outer circumference of the solvent supply tube 41 or resist supply tube 51. Each thermo module 65 is connected to the midway along a corresponding one of the circulating paths 63. With the temperature adjustment mechanisms 61 constituted in this manner, the solvent A flowing through the solvent supply tube 41 and the resist solution B flowing through the resist solution supply tube 51 can be kept at a predetermined temperature (for example, about 23° C.).

In FIG. 7, the solvent supply nozzle 40 is integrally formed with the solvent supply tube 41, while the resist solution supply nozzle 50 is integrally formed with the resist solution supply tube 51. Alternatively, they may be separately formed.

The structures of the solvent and resist solution supply systems and the spray head 60 will be described below in detail with reference to FIG. 8.

The spray head 60 consists of a stainless steel or aluminum alloy member. U-shaped holes serving as part of by-pass passages 60b are formed in the upper surface of the spray head 60. Vertical through holes 60c extending to the lower surface of the spray head 60 are formed in the bottom portions of these holes. Each vertical through hole 60c has an inclined middle portion 60d which becomes larger downward, and a large-diameter lower portion 60e. An internal thread is formed on the inner circumferential surface of this lower portion 60e.

When the nozzles 40 and 50 are to be mounted on the spray head 60 having such an arrangement, the cylindrical nozzles 40 and 50 are inserted in the through holes 60c such that their upper and lower portions extend. Substantially conical, synthetic resin seal members 66 have vertical through holes, through which the nozzles 40 and 50 can extend. These seal members 66 are packed in the inclined middle portions 60d. Mounting screw members 67 have vertical through holes through which the nozzles 40 and 50 can extend. These mounting screw members 67 are screwed in lower screw mounting portions 60e to press the seal members 66 against the inclined inner circumferential surfaces of the middle portions 60d under pressure. In this manner, the nozzles 40 and 50 are liquid-tightly mounted on the spray head 60. In this case, O-rings 68 are interposed between the upper surfaces of middle portions 60d and the upper surfaces of the seal members 66, as shown in FIG. 8. With this structure, a watertight state between a by-pass passage 60b and the nozzles 40 and 50 can be further assured.

A holding pin 60a projects on one upper side surface of spray head 60. A moving arm 71, which grips this holding pin 60a, is moved in X and Y (horizontal) and Z (vertical) directions by the moving mechanism 70. Upon this movement, the spray head 60 comprising the solvent supply nozzle 40 and the resist solution supply nozzle 50 is moved between an operation position above the central portion of the substrate G and a waiting position above a nozzle waiting portion 72.

Note that, in this case, four types of spray heads 60 are arranged in accordance with the types of resist solutions (see FIG. 2). More specifically, the four spray heads 60 are prepared at the nozzle waiting portion 72. The resist solution supply nozzles 50 of these spray heads 60 communicate with tanks, which contain different resist solutions having different viscosities and the like. In this case, each spray head 60 may have only the resist solution supply nozzle 50, and the solvent supply nozzle 40 may be mounted on the distal end of the scanning arm 71 in advance so as to be commonly used for all the spray heads 60. Also in this case, a plurality of solvent supply nozzles 40 may be arranged, for example, linearly to simultaneously supply a solvent from a plurality of portions in the radical direction of the substrate. In this case, nozzles having different discharge diameters may be prepared. Discharge from each nozzle may be arbitrarily controlled in correspondence with the discharge flow rate and a change in discharge flow rate.

A waiting portion 46 for rinse solution supply portions 45 is set on a side opposite to the nozzle waiting portion 72 (see FIG. 2). A cleaning nozzle 47 is disposed in a coupling cylinder 31, which is fixed to the lower side of the rotary cup 12 so as not to rotate, thereby cleaning the inner surfaces of the rotary cup 12 and the lid 16. More specifically, a bracket 48 mounted on the rotating shaft 22 holds the cleaning nozzle 47. A cleaning liquid supply pipe 49 connected to the cleaning nozzle 47 is connected to an external cleaning liquid supply source (not shown) through a passage (not shown) formed in the fixed collar 24. With this arrangement, as indicated by a chain double-dashed line in FIG. 3, when the spin chuck 10 is moved upward, the cleaning nozzle 47 can be located between the bottom portions of the spin chuck 10 and the rotary cup 12 to spray a cleaning liquid to the inner surfaces of the rotating rotary cup 12 and lid 16.

Figure 9:
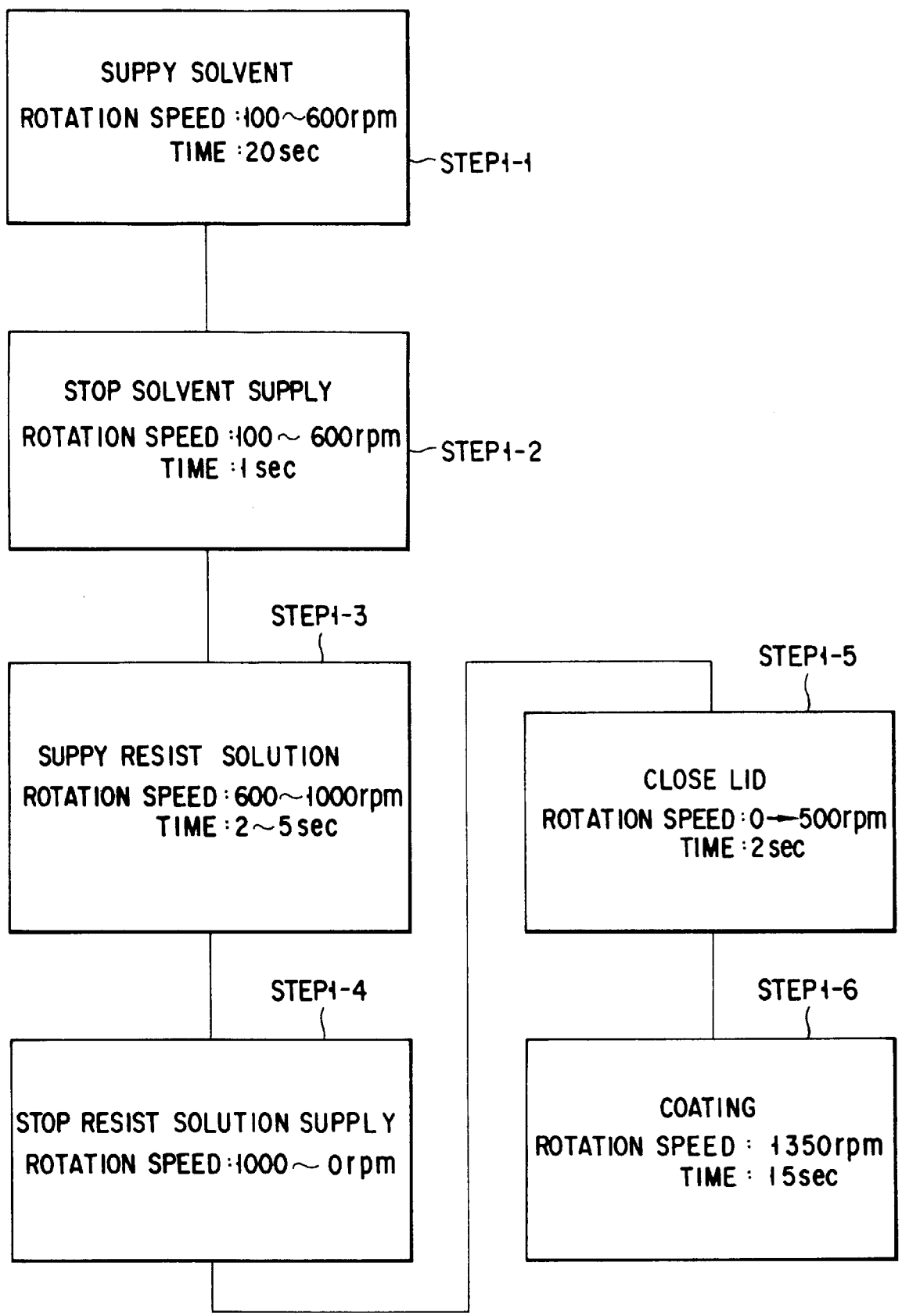
FIG. 9 is a flow chart for explaining a method of forming a coating film in the first embodiment of the present invention.

A procedure of forming a resist film by the coating apparatus having the above arrangement will be described below with reference to a flow chart in FIG. 9.

First, the lid 16 of the rotary cup 12 is opened. The substrate G is conveyed onto the rest spin chuck 10 by a convey arm (not shown) and held by the stationary spin chuck 10 by vacuum suction.

In this state, the spin chuck 10 is rotated to rotate the substrate G at a lower speed (for example, rotation speed: 100 to 600 rpm, acceleration: 300 to 500 rpm/sec) compared to normal processing rotation. At the same, the rotary cup 12 is rotated at the same speed. The solvent supply nozzle 40 of the spray head 60 is gripped by the moving arm 71 and moved above the central portion of the substrate G by the moving mechanism 70. During the rotation of the spin chuck 10 and the rotary cup 12, for example, 26.7 cc of ethyl cellosolve acetate (ECA) as the solvent A of a coating liquid are supplied (for example, dropped) to the substrate surface for, for example, 20 seconds from the solvent supply nozzle 40 (step 1—1). This supply means may be a spray. Alternatively, the solvent A may be dropped onto the rest substrate G without rotating it, and then the substrate G may be rotated.

After the solvent A is supplied for 20 sec in this manner, the supply of the solvent A is stopped, while the rotation speed of the spin chuck 10 and the rotary cup 12 is kept at the above low rotation speed (step 1-2).

Next, the spin chuck 10 is rotated at a high speed (first rotation speed: range of about 600 to 1,000 rpm, for example, 1,000 rpm, acceleration: 300 to 600 rpm/sec). At the same time, for example, 10 cc of the resist solution B are dropped from the resist solution supply nozzle 50 to the central portion of the solvent film on the substrate surface for, for example, 5 sec (step 1-3). Time when the solvent A is dried can be obtained in advance by an experiment. For example, when the interference fringes of light are visually recognized on the surface of the substrate G, the solvent A is not dried. When the solvent A is dried, the interference fringes of light are not recognized, thereby obtaining the time. In this case, for the supply time of 5 sec, the driving time of the bellows pump 57 can be controlled to accurately, delicately control the supply amount of resist solution.

After the resist solution B is supplied (dropped) for 5 sec in this manner, the supply of the resist solution B is stopped. At the same time, the rotation of the spin chuck 10 and the rotary cup 12 is stopped (step 1-4).

The supply of the resist solution is stopped, and the resist solution supply nozzle 50 is moved to the waiting position. Thereafter, the lid 16 closes the upper opening portion 12a of the rotary cup 12 by using the robot arm 20 to encapsulate the substrate G in the rotary cup 12 (step 1-5).

The opening portion 12a of the rotary cup 12 is tightly closed with the lid 16. In this state, the spin chuck 10 and the rotary cup 12 are rotated for, for example, 15 sec (for example, second rotation speed: 1,350 rpm, acceleration: 500 rpm/sec), thereby uniforming the film thickness of the resist film (step 1-6). In this case, it is preferable to set the second rotation speed higher than the first rotation speed.

Upon coating, the rotation of the spin chuck 10 and the rotary cup 12 is stopped. Thereafter, the lid 16 is moved to the waiting position by the robot arm 20, and the substrate G is unloaded by the convey arm (not shown), completing the coating operation.

The coating apparatus described above is singly used as a resist coating apparatus for an LCD substrate. In addition, it can be used by being incorporated in a resist coating/developing system for the LCD substrate G. The structure of the resist coating/developing system in which the above coating apparatus is incorporated will be described below.

Figure 10:
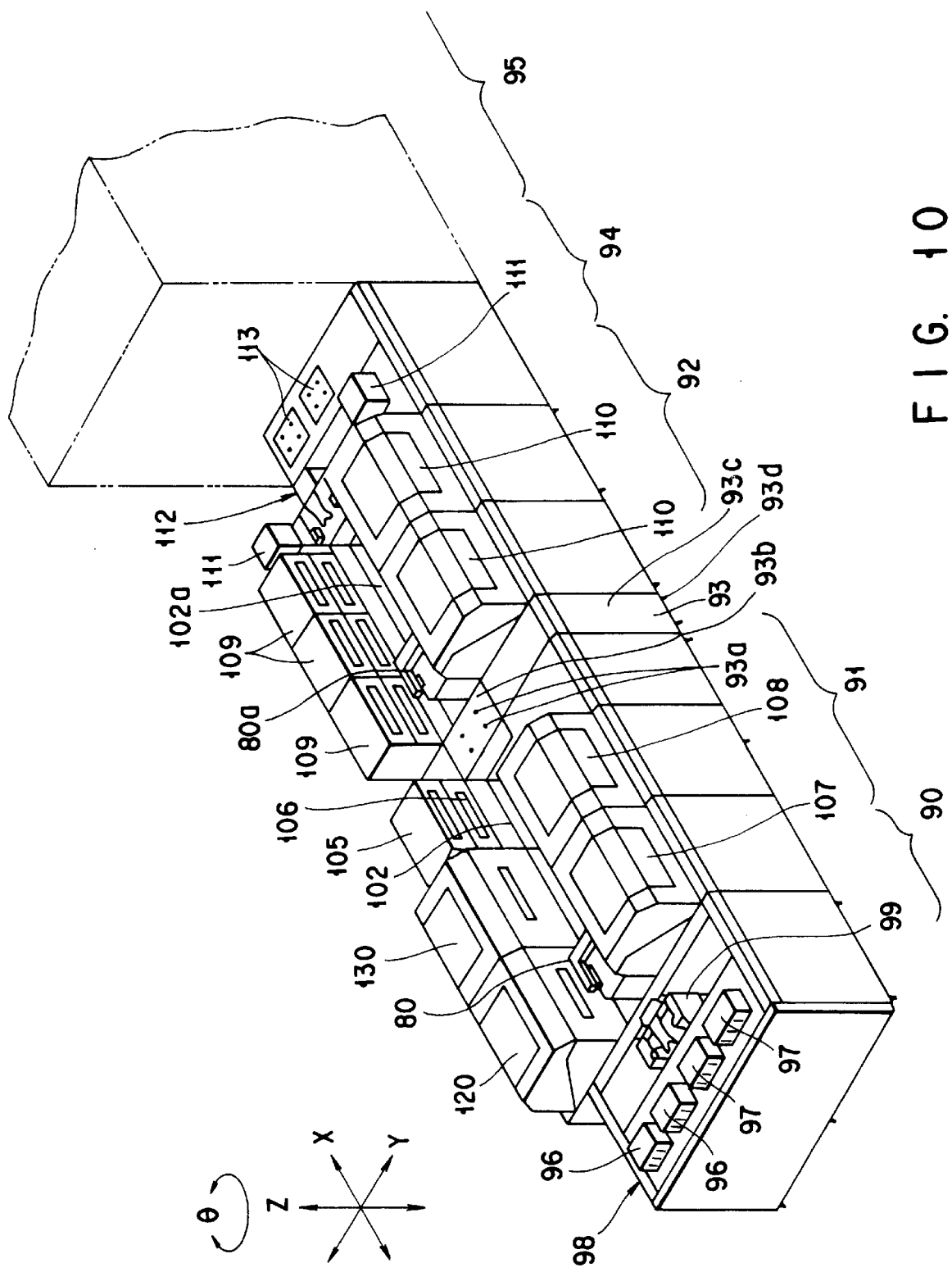
FIG. 10 is a perspective view schematically showing an overall resist coating/developing system using the coating apparatus in FIG. 1.
Figure 14:
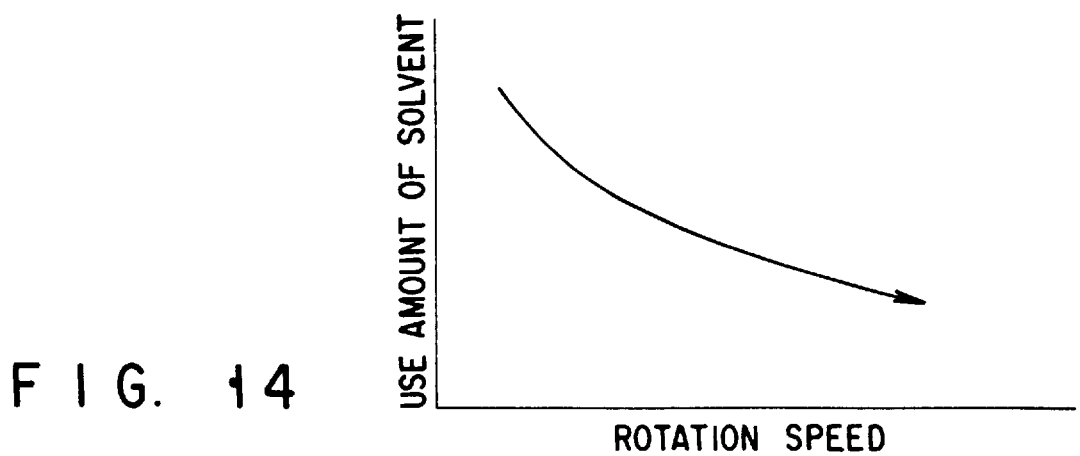
FIG. 14 is a graph showing a relationship between the substrate rotation speed and the use amount of a solvent.

The above resist coating/developing system is mainly constituted by a loader section 90 for loading/unloading the substrate G, a first processing section 91 for the substrate G, and a second processing section 92 continuously arranged to the first processing section 91 through a relay section 93, as shown in FIG. 10. Note that an exposure unit 95 for exposing a predetermined fine pattern on a resist film can be continuously arranged to the second processing section 92 through a transfer section 94.

The loader section 90 is constituted by a cassette table 98 and a substrate loading/unloading arm 99. On the cassette table 98, cassettes 96 for housing unprocessed substrates G and cassettes 97 for housing processed substrates G are placed. The substrate loading/unloading arm 99 is movable in the horizontal (X and Y) and vertical (Z) directions and rotatable (θ) so as to load/unload the substrates G between the cassettes 96 and 97 on the cassette table 98.

The first processing section 91 has a main arm 80 movable in the X, Y, and Z directions and rotatable in the θ direction, and a convey path 102 of the main arm 80. A brush cleaning unit 120 for cleaning the substrate G with a brush, a jet-water cleaning unit 130 for cleaning the substrate G with high-pressure jet water, an adhering unit 105 for hydrophobically treating the surface of the substrate G, and a cooling unit 106 for cooling the substrate G to a predetermined temperature are arranged on the one side of the convey path 102. A coating apparatus or unit 107 having the above arrangement and a coating film removing unit 108 are arranged on the other side of the convey path 102.

On the other hand, the second processing section 92 has a main arm 80a movable in the X, Y, and Z directions and rotatable in the θ direction, and a convey path 102a of the main arm 80a. Heating units 109 for heating the substrate G before and after applying a resist solution to pre-bake and post-bake the substrate are arranged on one side of the convey path 102a. Developing units 110 are arranged on the other side of the convey path 102a.

The relay section 93 comprises casters 93d on the bottom surface of a box 93c having a transfer table 93b on which support pins 93a stand. With this structure, the relay section 93 can be extracted from the first processing section 91 and the second processing section 92, as needed, and an operator can enter the first processing section 91 or second processing section 92 to easily perform check, repair, and the like.

In the transfer section 94, a cassette 111 for temporarily holding the substrate G, a convey arm 112 for loading/unloading the substrate G in/from this cassette 111, and a transfer table 113 for the substrate G are arranged.

In the coating/developing system having the above arrangement, an unprocessed substrate G housed in the cassette 96 is extracted by the loading/unloading arm 99 of the loader section 90. Thereafter, the substrate G is transferred to the main arm 80 of the first processing section 91 and conveyed into the brush cleaning unit 120. The substrate G cleaned with a brush in this brush cleaning unit 120 is cleaned with high-pressure jet water in the jet-water cleaning unit 130. The substrate G is hydrophobically treated by the adhering unit 105 and cooled by the cooling unit 106. Then, a photoresist, that is, photosensitive film is applied and formed by the coating film forming unit 107 of the present invention following the above procedure. Subsequently, an unnecessary resist film is removed from the edge portions of the substrate G by the coating film removing unit 108. Therefore, the resist does not attach to the main arm 80 afterward because the resist film is removed from the edge portions before unloading the substrate G. This photoresist is heated and baked by the heating unit 109, and a predetermined pattern is exposed by the exposure unit 95. The exposed substrate G is conveyed into the developing unit 110 and developed with a developing solution. Thereafter, the developing solution is cleaned off with a rinse solution, completing the developing.

The developed, processed substrate G is housed in the cassette 97 of the loader section 90, and then unloaded and transferred for the subsequent processing.

Next, examples will be described in which coating films were formed using the above apparatus by the method of forming a coating film according to the present invention.

Experiment 1

Ethyl Cellosolve acetate (ECA) was used as a solvent A, and 25 cc of ethyl cellosolve acetate were supplied under the conditions of step 1, that is, a rotation speed of 500 rpm and a time of 20 sec. Subsequently, an experiment was conducted such that a resist solution B was supplied (dropped) from a resist solution supply nozzle 50 to a substrate G under the following conditions.

[Conditions]

Resist solution discharge (supply) time: 2 sec, 5 sec

Rotation speed: 300, 500, 600, 800, 1,000 rpm

Size of substrate G: 500×600 mm

Resist coating was performed under these conditions, and a resist amount required to coat the entire surface was measured. Results are shown in FIG. 11. As shown in FIG. 11, the resist amount required to coat the entire surface of the substrate G could be minimum under the conditions, that is, a rotation speed of 600 rpm (strictly, 500 rpm or more to less than 800 rpm) and a time of 5 sec. At this time, the supply amount of the resist B was 8 cc/substrate. The variation (range) in thickness of the coating film was 597 Å. It was found that a coating film having a uniform thickness of about 600 Å within the average film thickness variation range of about ±2% could be formed. The film thickness profiles upon coating at the respective rotation speeds for a time of 5 sec are shown in FIG. 12. As can be apparent from FIG. 12, when the rotation speed increases, the uniformity of the film thickness tends to be improved. When the resist solution B was supplied at rotation speeds of 800 rpm and 1,000 rpm for 5 sec, it was confirmed that the film thickness variations of the resultant coating films were as small as 412 Å and 240 Å, respectively. In this case, the resist amount was found to be slightly larger than that for a resist amount of 10 cc/substrate at 600 rpm.

Experiment 2

An experiment was conducted such that ECA was used as a solvent A and supplied under the following conditions, and a resist solution B was then supplied (dropped) from a resist solution supply nozzle 50 to a substrate G.

[Conditions]

Resist: TSMR-8900
  Viscosity: 15 cp

Rotation speed: 300, 500, 800, 1,000 rpm

Flow rate of solvent: 80, 100, 120, 150 cc/min

Size of substrate G: 500×600 mm

The experiment of the solvent was conducted under the following conditions, and results shown in Table 1 were obtained. Table 1 shows values obtained when the supplied solvent could be effectively applied without being dried.

TABLE 1

| Rotation Speed (rpm) | | Flow Rate of Solvent (cc/min) | | | |
|---|---|---|---|---|---|
| | | 80 | 100 | 120 | 150 |
| 300 | Solvent Discharge Time (sec) | 23 | 20 | 19 | 18 |
| | Solvent Amount (cc) | 30.7 | 33.3 | 38 | 45 |
| 500 | Solvent Discharge Time (sec) | 23 | 17 | 14 | 10 |
| | Solvent Amount (cc) | 26.7 | 28.3 | 28 | 25 |
| 800 | Solvent Discharge Time (sec) | 18 | 15 | 11 | 9 |
| | Solvent Amount (cc) | 24 | 25 | 22 | 22.5 |
| 1000 | Solvent Discharge Time (sec) | 16 | 12 | 11 | 8 |
| | Solvent Amount (cc) | 21.3 | 20 | 22 | 20 |

The results in Table 1 are shown in FIG. 13. As shown in FIG. 13, the discharge (supply) time could be found to be shortened at a higher rotation speed and a higher flow rate of the solvent per unit time. When the value of the actual use amount (=flow rate×time) is taken into consideration, the actual use amount was found to decrease at a higher rotation speed.

The film thickness profiles of coating films formed under the above conditions were measured to obtain results shown in Table 2.

TABLE 2

| Rotation Speed (rpm) | | Flow Rate of Solvent (cc/min) | | | |
|---|---|---|---|---|---|
| | | 80 | 100 | 120 | 150 |
| 300 | Profile | (profile) | (profile) | (profile) | (profile) |
| | Average (Å) | 14127 | 14013 | 13955 | 14062 |
| | Range (Å) | 772 | 460 | 416 | 650 |
| 500 | Profile | (profile) | (profile) | (profile) | (profile) |
| | Average (Å) | 14237 | 14078 | 14019 | 14075 |
| | Range (Å) | 597 | 575 | 475 | 530 |
| 800 | Profile | (profile) | (profile) | (profile) | (profile) |
| | Average (Å) | 14041 | 14086 | 14019 | 14094 |
| | Range (Å) | 467 | 562 | 469 | 364 |
| 1000 | Profile | (profile) | (profile) | (profile) | (profile) |
| | Average (Å) | 14048 | 14097 | 13982 | 14103 |
| | Range (Å) | 390 | 397 | 313 | 582 |

As shown in Table 2, the film thickness variation (range) was 364 Å at a rotation speed of 800 rpm, a solvent flow rate of 150 cc/min, a solvent discharge time of 9 sec, and a solvent amount of 22.5 cc. The film thickness variation (range) was 582 Å at a rotation speed of 1,000 rpm, a solvent flow rate of 150 cc/min, a solvent discharge time of 8 sec, and a solvent amount of 20 cc. Sufficiently uniform film thicknesses could be obtained in both the cases.

Examples of the coating liquid are a resist (phenolnovolac resin and naphthoquinone diazido ester) and an ARC (Anti Reflection Coating).

Examples of the solvent are ethyl lactate (EL, boiling point: 154° C., viscosity: 2.6 cps), ethyl-3-ethoxypropionate (EEP, boiling point: 170° C., viscosity: 1.3 cps), pyruvic acid ethyl (EP, boiling point: 144° C., viscosity: 1.2 cps), propylene glycol monomethyl ether acetate (PGMEA, boiling point: 146° C., viscosity: 1.3 cps), 2-heptanon (boiling point: 152° C., viscosity: 1.1 cps), and cyclohexanone (solvent of AKC) other than methyl-3-methoxypropionate (MMT, boiling point: 145° C., viscosity: 1.1 cps), all of which are well known in this field.

Figure 15:
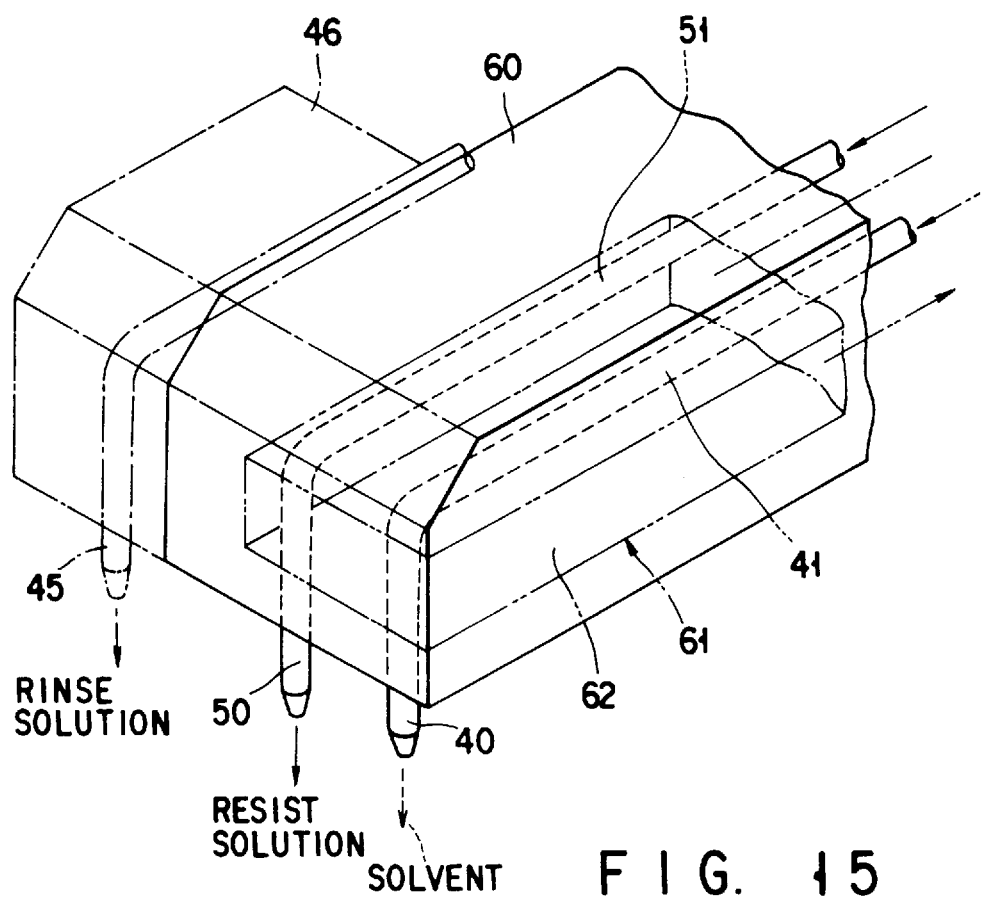
FIG. 15 is a perspective view showing a modification of the spray head.

Note that the above embodiment exemplifies the arrangement in which the solvent supply nozzle 40 is arranged on the spray head 60 together with the resist solution supply nozzle 50. The arrangement, however, is not limited to this. As illustrated in an embodiment shown in FIG. 15, a spray head 46 having a rinse solution supply portion 45 may be integrally arranged with the spray head 60 to supply a solvent.

Figure 16:
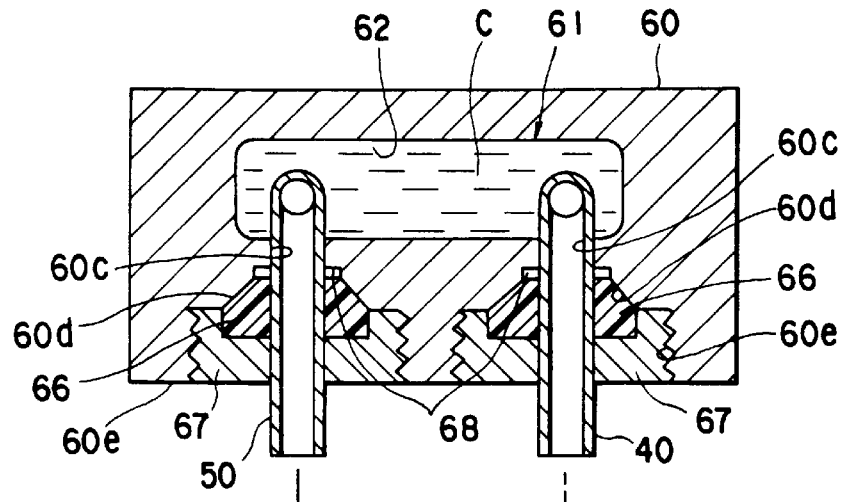
FIGS. 16 to 19 are sectional views showing other modifications of the spray head.

In this embodiment, the common temperature adjustment mechanism 61 is disposed for a solvent supply path and a resist solution supply path (see FIG. 16). The spray head 60 is integrally formed with the scanning arm 71 of the moving mechanism 70. The temperature adjustment solution supply path 62 is formed in the spray head 60 and the moving arm 71. The solvent supply tube 41 and the resist solution supply tube 51 are disposed in this supply path 62 to temperature-adjust the solvent A and the resist solution B with the same temperature adjustment solution C. With this arrangement, the structure of the temperature adjustment mechanism 61 can be simplified, and the solvent A and the resist solution B can be kept at the same temperature.

The arrangements of the spray head 60 and the nozzles 40 and 50 are not limited to the above example. For example, they may be arranged as shown in FIGS. 17 to 20.

Figure 17:
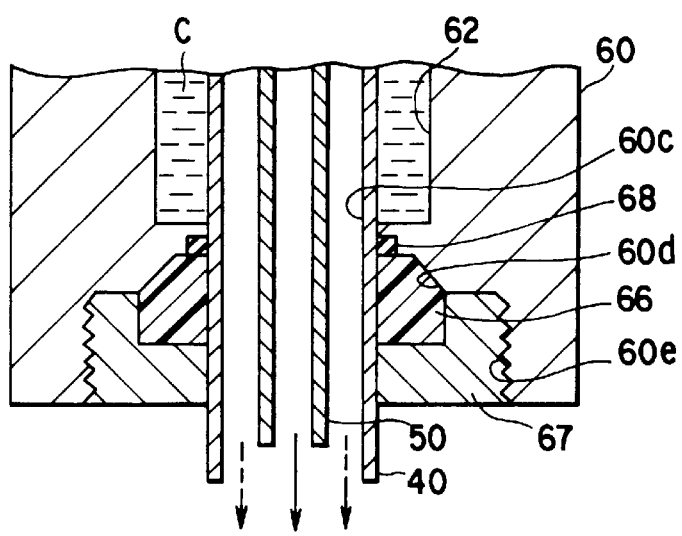
Figure 18:
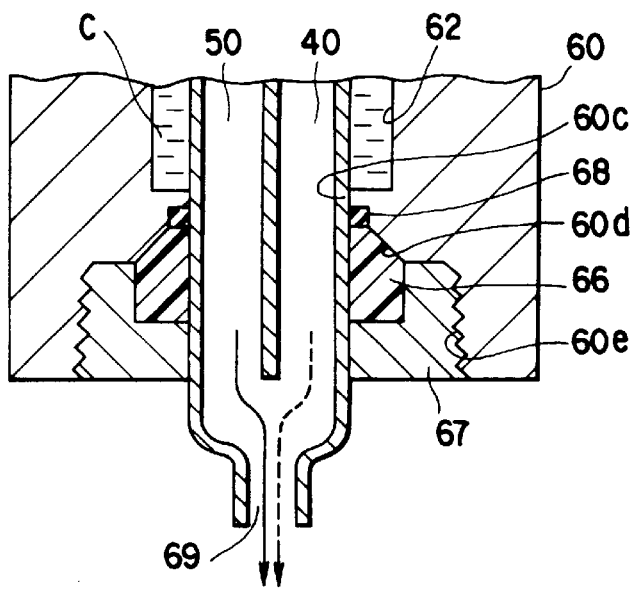

FIG. 17 exemplifies a case wherein the solvent supply nozzle 40 is arranged on the outer circumference of the resist solution supply nozzle 50 so as to be coaxial with the resist solution supply nozzle 50. The resist solution supply nozzle 50 and the solvent supply nozzle 40 have a double pipe structure, and the distal end of the solvent supply nozzle 40 projects downward lower than the distal end of the resist solution supply nozzle 50. As a matter of course, the distal end of the solvent supply nozzle 40 may be set at the same level as the distal end of the resist solution supply nozzle 50, or the former may be set to be shorter. Instead of this, the resist solution supply nozzle 50 may be disposed outside the solvent supply nozzle 40. Further, as shown in FIG. 18, a mechanism may be employed in which the resist solution supply nozzle 50 is provided together with the solvent supply nozzle 40, and they use a common discharge port 69.

Figure 19:
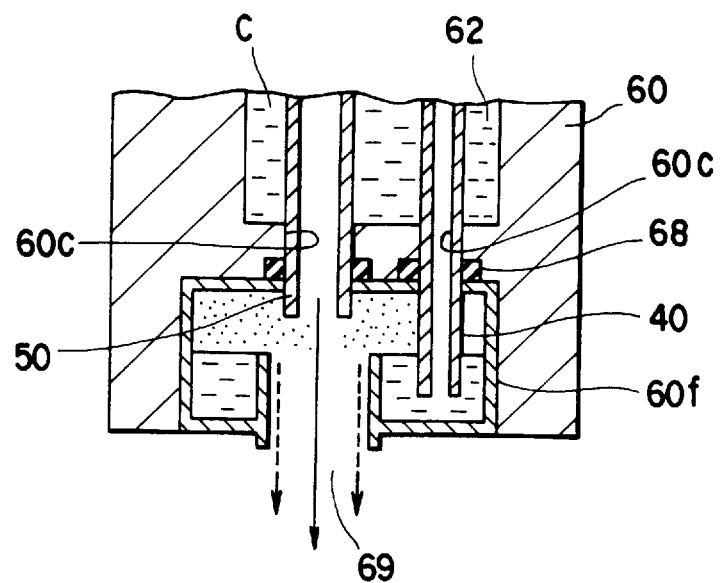

As shown in FIG. 19, the distal end of the solvent supply nozzle 40 may be inserted in a solvent in an annular solvent reservoir tank 60f, which is formed in the spray head 60 and has the discharge port 69 at the center. In addition, the distal end of the nozzle 50 may be located at the upper portion in the tank 60f and exposed in a gasified solvent atmosphere. In this manner, the distal end of the solvent supply nozzle 40 is arranged around the distal end of the resist solution supply nozzle 50. A resist attached to the resist solution supply nozzle 50, therefore, can be cleaned off, and a resist solution can be prevented from drying to prevent formation of particles due to a dried resist solution.

Figure 20:
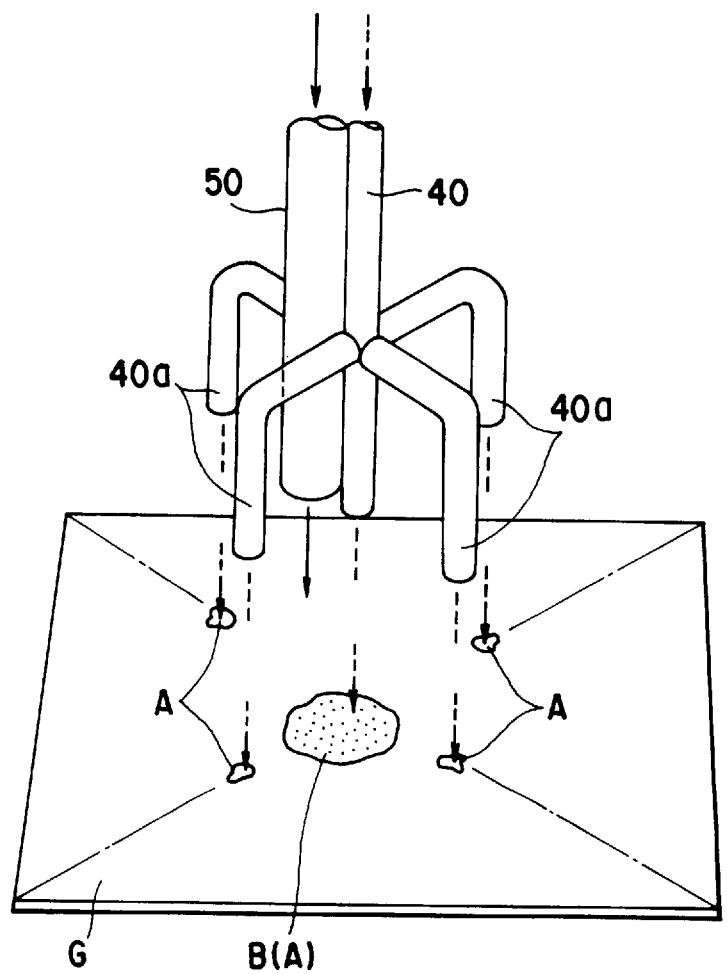
FIG. 20 is a perspective view showing a modification of the arrangement of the solvent supply nozzle and the resist solution supply nozzle.

As shown in FIG. 20, the solvent supply nozzle 40 may be arranged parallel to the outer circumference of the resist solution supply nozzle 50, and the distal end of this nozzle 40 may be branched into a plurality of (four, in this example) ends. As a result, a solvent is supplied to four portions at once. Preferably, branch nozzle portions 40a are disposed in correspondence with the four corners of a rectangle similar to the substrate G to simultaneously supply a solvent to symmetrical positions on diagonal lines with respect to the center of the substrate G. With this arrangement, the solvent can be uniformly diffused on the rectangular substrate to a certain degree.

Note that the above embodiment has exemplified the following arrangement. The lid 16 of the rotary cup 12 is moved by the robot arm 20 to open the rotary cup 12. The supply nozzle 40 for the solvent A, the supply nozzle 50 for the resist solution B, and the like are moved upward above the central portion of the substrate G by the moving mechanism 70 to drop the solvent A and the resist solution B. Alternatively, the solvent A and the resist solution B may be dropped while the opening portion 12a of the rotary cup 12 is kept closed with the lid 16.

Figures 21, 22:
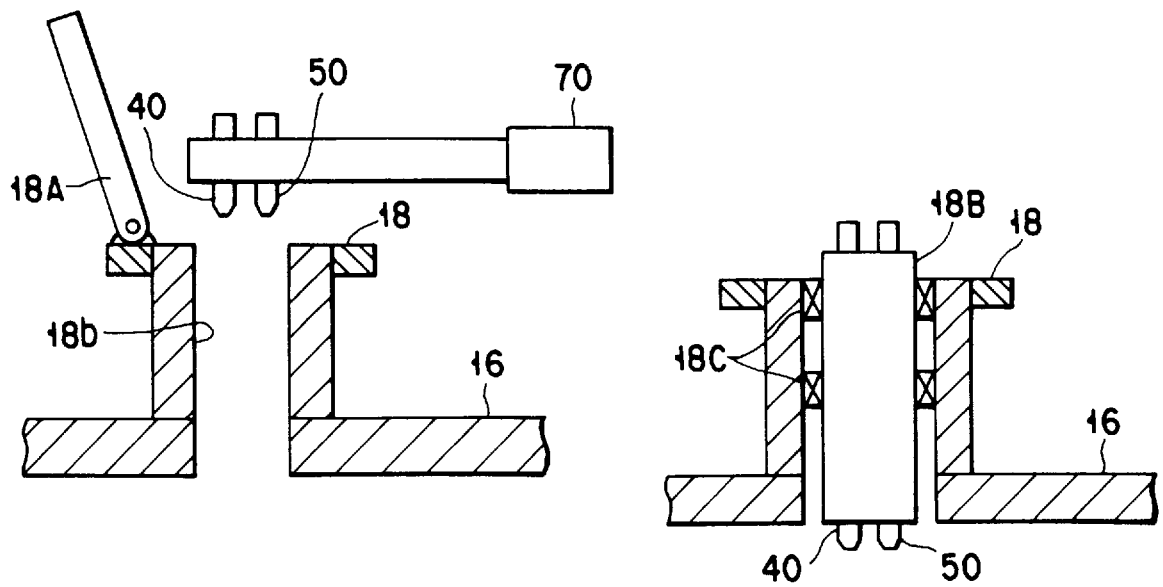
FIGS. 21 and 22 are sectional views showing other methods of supplying a solvent and a resist solution to a substrate.

For example, as shown in FIG. 21, a hollow portion 18b is formed in the head portion 18. An opening is formed at a portion of the lid 16 corresponding to the hollow portion 18b of the head portion 18, and the upper end portion of the head portion 18 is made closable with a lid 18c. The lid 18c is opened, and the nozzles are moved above the head 18, that is, above the central portion of the substrate G to drop the solvent A and the resist solution B.

As shown in FIG. 22, a nozzle mounting member 18d is mounted inside the head portion 18 through a bearing 18e or the like so as to make the lid 16 rotatable. The opening portion 12a of the rotary cup 12 is kept closed with the lid 16. In this state, the solvent A and the resist solution B can be dropped from the nozzles 40 and 50 mounted on the nozzle mounting member 18d to the central portion of the substrate G.

As described above, the solvent A and the resist solution B are dropped, while the opening portion 12a is kept closed with the lid 16. The processing throughput, therefore, becomes shorter than that of a moving type arrangement with the moving mechanism 70, and processing of dropping and applying the solvent A can be realized in a closed state.

Processing, for example, can also be realized in which upon supplying the solvent A, the rotary cup 12 is rotated while the resist solution B is supplied, then the supply of the resist solution B is stopped, and the rotary cup 12 is rotated.

The second embodiment of the present invention will be described below.

FIGS. 23 to 26 show a coating apparatus according to the second embodiment of the present invention. The same reference numerals as in the apparatus according to the first embodiment (see FIGS. 1 to 4) denote the same parts in these drawings, and a detailed description thereof will be omitted.

In the second embodiment, a spin chuck 10, a driving motor 21 for rotating the spin chuck and a rotary cup, a mechanism for transmitting rotation of the driving motor 21, and a movable spray head 60 provided above the spin chuck 10 are constituted similar to those in the first embodiment. The second embodiment comprises, a cup-like rotatable processing vessel (rotary cup) 212 having an opening in the upper portion and a processing chamber 211 surrounding the upper portion and outer circumferential portions of the spin chuck 10, a lid 216 detachably provided to the cup 212 and capable of closing an opening portion 212a of the rotary cap 212, a flat current plate 213 horizontally suspended below this lid 216 and projecting outward from the peripheral edge of a substrate G, a drain cup 214 as a fixed vessel having an opening portion in the upper portion to surround the outer circumference side of the rotary cup 212, a fixed lid 215 detachably provided to the cup 214 and capable of closing the opening portion of this drain cup 214, and a nozzle moving mechanism 270, which grips the spray head 60 and moves it between a spray head waiting position and a position above a substrate, which is different from the first embodiment.

A mounting member 234, which can be elevated together with the spin chuck 10 through a bearing 234a between the mounting member 234 and the spin chuck 10, is mounted on a lower position near the spin chuck 10. A cleaning nozzle 235 of the rotary cup 212 and a supply nozzle 236 for an inert gas, for example, nitrogen (N$_2$) gas are mounted on this mounting member 234.

The rotary cup 212 is formed of, for example, stainless steel. The rotary cup 212 is mounted on the outer circumferential surface of a fixed collar 24 through a coupling cylinder 231 fixed to the upper end portion of an outer rotary cylinder 26b mounted through a bearing 25b. A seal O-ring 232 is interposed between a bottom portion 212b of the rotary cup 212 and the lower surface of the spin chuck 10. The spin chuck 10 is moved downward to abut against the O-ring 232 to keep an airtight state. In the rotary cup 212, the inner surface of a side wall 212c has a diameter decreasing upward to form a tapered surface 212e. An exhaust hole 212d is formed in a proper position on the lower peripheral portion, that is, the lower side of the side wall 212c in the peripheral direction.

An abutment ring 216a made of Delrin (tradename) is mounted on the lower peripheral surface of the lid 216 for closing the opening portion 212a of the rotary cup 212 to avoid contact with the metal rotary cup 212. A support column 219 supported by a robot arm 20 is mounted on the central portion of the lid 216 through a bearing 216b. An air inlet port 216c is formed in the center of the support column 219.

In this manner, the air inlet port 216c is formed in the lid 216, and the exhaust hole 212d is formed in the rotary cup 212. The interior of the processing chamber 211, therefore, is set to be a negative pressure with rotation of the rotary cup 212. Air flows from the air inlet port 216c to the rotary cup 212, and this air is discharged from the exhaust hole 212d along the inner wall of the rotary cup 212 by the current plate 213. For this reason, a resist solution mist can be prevented from attaching to the substrate G again. Further, the interior of the processing chamber 211 is prevented from being set to an excessive negative pressure during rotation of the rotary cup 212.

Note that the air inlet port 216c may be directly formed in the support column 219. Alternatively, it can be formed with a pipe member which is inserted in a through hole formed in the support column 219. Especially, it is preferable to form the air inlet port 216c with a pipe member because the hole diameter of the pipe member can be selected in accordance with the properties, for example, the type, drying properties, and viscosity of the solvent A or resist solution B to be used. For example, if a resist having good drying properties is quickly dried, a phenomenon occurs in which the resist solution is difficult to spread over the entire surface of the substrate G, so part of the film thickness becomes large. In this case, the hole diameter of the air inlet port 216c is decreased to suppress drying of the resist, thereby uniforming the film thickness of the resist film. To the contrary, with a resist having poor drying properties, the hole diameter of the air inlet port 216c is increased to promote the resist to dry, thereby uniforming the resist film.

On the other hand, a plurality of liquid discharge ports 214a are formed on the outer peripheral side of the bottom portion of the drain cup 214 on the same circle concentric with the drain cup. Exhaust ports 214b connected to an air discharge unit (not shown) are arranged at proper portions (for example, four portions in the peripheral direction) on the inner peripheral side of the liquid discharge port 214a. In this case, the liquid discharge ports 214a are formed in the tangential direction along the rotation direction (for example, clockwise direction) of the substrate G and the rotary cup 212. The reason why the liquid discharge ports 214a are provided in the tangential direction along the rotation direction of the substrate G and the rotary cup 212 is to rapidly discharge the resist solution mist scattered with rotation of the substrate G and the rotary cup 212 outside.

The fixed lid 215 is formed of stainless steel and is supported by the support column 219. A ring-like abutment member 215a made of Delrin (tradename) is mounted on the lower peripheral surface of the fixed lid 215 to avoid contact with the metal drain cup 214. A plurality of air supply holes 215b are formed on the central side of the fixed lid 215 on one circle or a plurality of circles concentric with the fixed lid 215.

In this manner, the plurality of air supply holes 215b are provided on the central portion of the fixed lid 215 on the concentric circle or circles, and the exhaust ports 214b are provided in the bottom portion of the drain cup 214. Therefore, air flowing from the air supply holes 215b to the drain cup 214 during rotation of the rotary cup 212 flows along the outer wall of the rotary cup 212. The mist which is scattered in the processing chamber 211 by the centrifugal force during rotation and flows into the drain cup 214 through the exhaust hole 212d is prevented from being blown up to the upper side of the rotary cup 212. The mist can be discharged outside from the exhaust ports 214b.

The lid 216 must be fixed to the opening portion 212a of the rotary cup 212 and integrally rotated during rotation. For this reason, as shown in FIG. 26, fitting recessed portions 217b are formed in the lower surface of the abutment ring 216a. These fitting recessed portions 217b are fitted on fixed pins 217a projecting on the upper portion of the rotary cup 212 to fix the lid 216 to the rotary cup 212. In this case, dust formed in contact with the fitting recessed portions 217b is reduced by forming spherical top portions of the fixed pins 217a. Note that the fixed pins 217a need not always project on the rotary cup side. The fixed pins 217a may project on the lid side, and the fitting recessed portions 217b may be provided on the rotary cup side. In addition, a suction means (not shown) is connected in the fitting recessed portions 217b to discharge, outside, dust formed when the fitting recessed portions 217b contact the fixed pins 217a.

Figure 23:
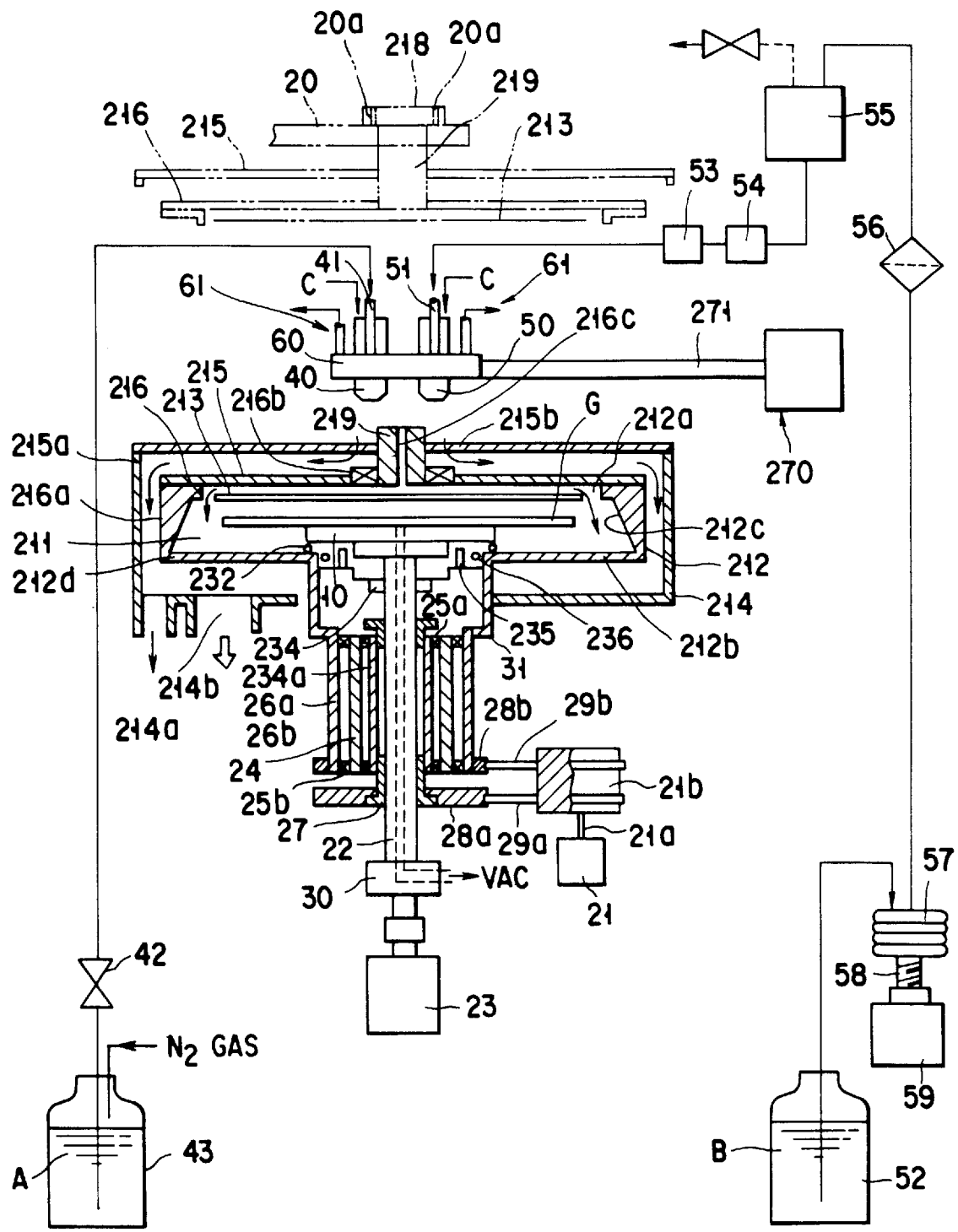
FIG. 23 is a sectional view schematically showing the arrangement of a coating apparatus according to the second embodiment of the present invention.

In opening/closing the lid 216, the robot arm 20 is inserted below a head portion 218 located on the upper end of the support column 219 projecting on the upper surface of the lid 216, as indicated by a chain double-dashed line in FIG. 23. Locking pins 20a projecting from the robot arm 20 are engaged with locking grooves 218a formed in the head portion 218. Then, the robot arm 20 is vertically moved. Note that positioning of the locking grooves 218a of the head portion 218 and the locking pins 20a of the robot arm in opening the lid 216, and positioning of the fixed pins 217a and the fitting recessed portions 217b in closing the lid 216 are performed by controlling the rotation angle of the driving motor 21 constituted by, for example, a servomotor.

Also in the second embodiment, like the lid 16 in the first embodiment, the lid 216 is fixed to the rotary cup 212 using another press mechanism, thereby preventing formation of dust in opening the lid 216 and cluttering of the lid 216 during rotation.

Since the fixed lid 215 is fixed to the support column 219 rotatably supporting the lid 216, the fixed lid 215 is vertically moved with opening/closing movement of the lid 216 to open/close the opening portion of the drain cup 214.

Solvent and resist supply systems in the second embodiment are basically the same as in the first embodiment.

Also in the second embodiment, the discharge time of resist solution B can be controlled by opening/closing a variable orifice (not shown) provided to a resist solution supply nozzle 50. Alternatively, $N_2$ gas may be supplied to a resist solution tank 52 without using a bellows pump 57 to supply the resist solution B by the pressure force. In this case, the discharge time of the resist solution B can be controlled by adjusting the pressure amount of $N_2$ gas.

Figure 6C:
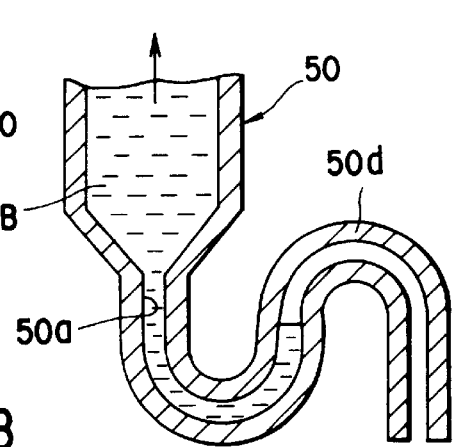

As described above, a suck back valve 53 provided to the above resist solution supply system is a valve which draws back the resist solution B remaining on the inner wall portion of the distal end of the resist solution supply nozzle 50 due to the surface tension into the resist solution supply nozzle 50 after discharging the resist solution from the resist solution supply nozzle 50. This prevents solidification of the remaining resist solution. Also in the second embodiment, the nozzle distal end can be constituted as shown in FIGS. 6A to 6C to prevent clogging of the nozzle 50 and formation of particles due to a dried resist.

Further, temperature adjustment mechanisms 61 and a spray head 60 are constituted like in the first embodiment. Also in the second embodiment, a solvent supply nozzle 40 is integrally formed with a solvent supply tube 41, while the resist solution supply nozzle 50 is integrally formed with a resist solution supply tube 51. Alternatively, they may be separately formed.

Figure 24:
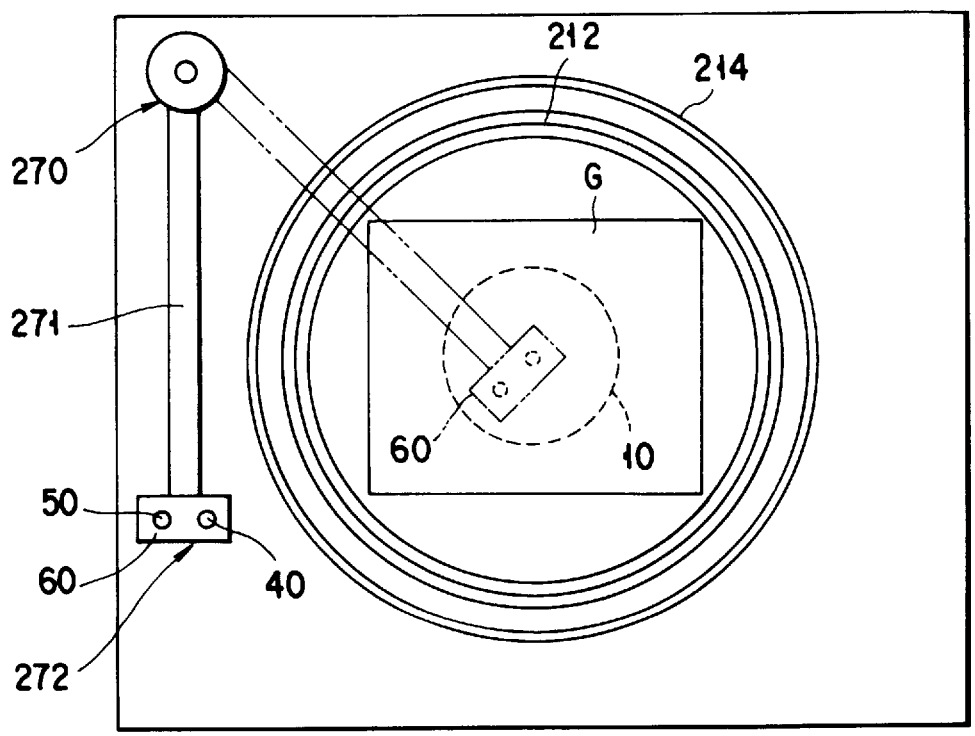
FIG. 24 is a plan view showing the coating apparatus in FIG. 23.

In the second embodiment, the spray head 60 is mounted on the distal end of a moving arm 271, which is rotatable in the horizontal direction (X and Y directions) and movable in the vertical direction (Z direction). As shown in FIG. 24, the moving arm 271 is disposed outside the drain cup 214. The spray head 60 having the solvent supply nozzle 40 and the resist solution supply nozzle 50 is moved between an operation position above the central portion of the substrate G and a waiting position above a nozzle waiting portion 272 by a driving means (not shown) such as a stepping motor. With the movement of the spray head 60 from the waiting position to the operation position, the solvent supply nozzle 40 is moved to the central position of the substrate G. After a predetermined period of time, the resist solution supply nozzle 50 is moved to the central position of the substrate G. Upon completion of the coating operation, the spray head 60 having both the nozzles 40 and 50 is moved to the nozzle waiting portion 272.

In the second embodiment, the rotary moving arm 271 is used as a moving mechanism for the spray head 60 having the solvent supply nozzle 40 and the resist solution supply nozzle 50. The moving mechanism, however, is not limited to this. For example, a linear-type moving mechanism can be used as in the first embodiment.

Figure 27:
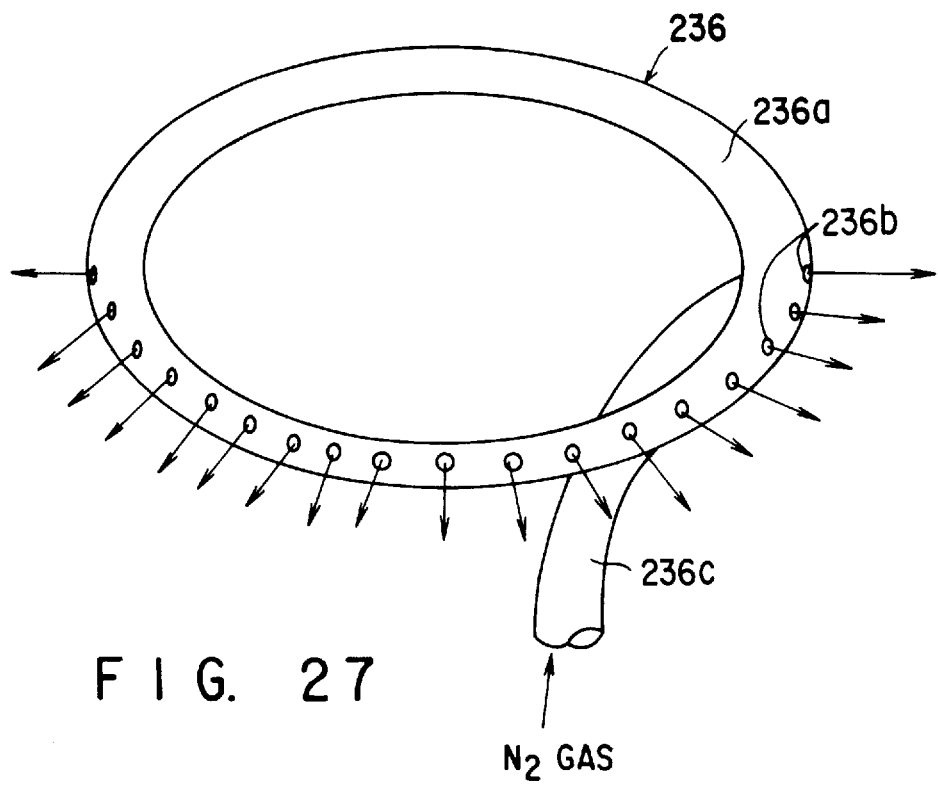
FIG. 27 is a perspective view showing an inert gas supply nozzle used in the apparatus in FIG. 23.

As shown in FIG. 27, the $N_2$ gas supply nozzle 236 is constituted by a nozzle main body 236a formed with a doughnut-like hollow pipe, and large number of small holes 236b formed in the outer circumferential surface of the nozzle main body 236a at proper intervals. The $N_2$ gas supply nozzle 236 having such an arrangement is mounted on the mounting member 234, which elevates together with the spin chuck 10. The $N_2$ gas supply nozzle 236 is connected to an $N_2$ gas supply source (not shown) through an $N_2$ gas supply tube 236c, which extends through the fixed collar 24. The supply nozzle 236 is moved upward with upward movement of the spin chuck 10 by rotation and is located in the processing chamber 211 of the rotary cup 212. Then, $N_2$ gas supplied from the $N_2$ gas supply source is radially sprayed in the processing chamber 211 to purge the interior of the processing chamber 211 with $N_2$. At the same time, the negative pressure state in the processing chamber 211 is released to facilitate subsequent opening of the lid 216.

Figure 25:
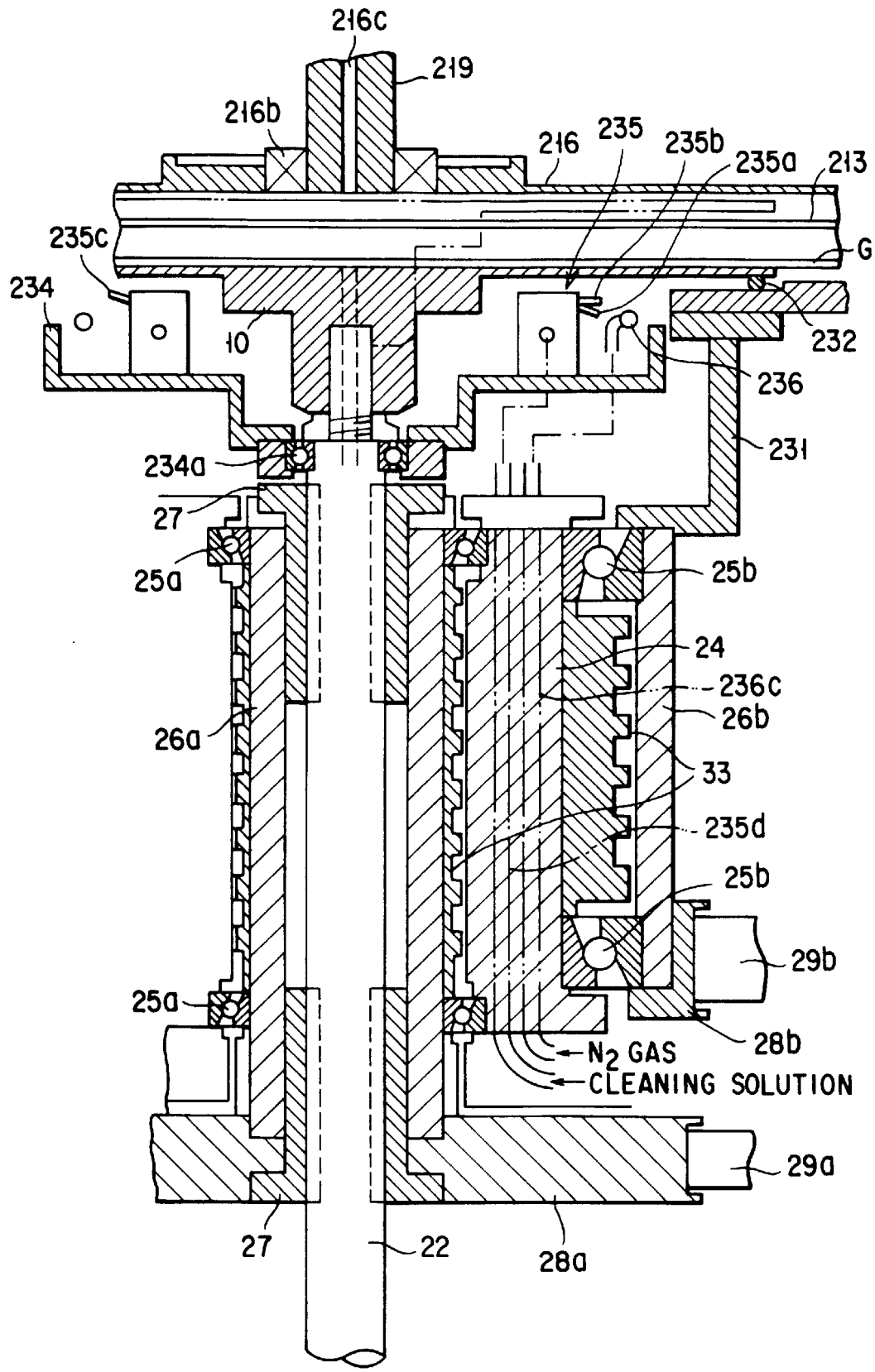
FIG. 25 is an enlarged sectional view showing the main part in FIG. 23.
Figure 28:
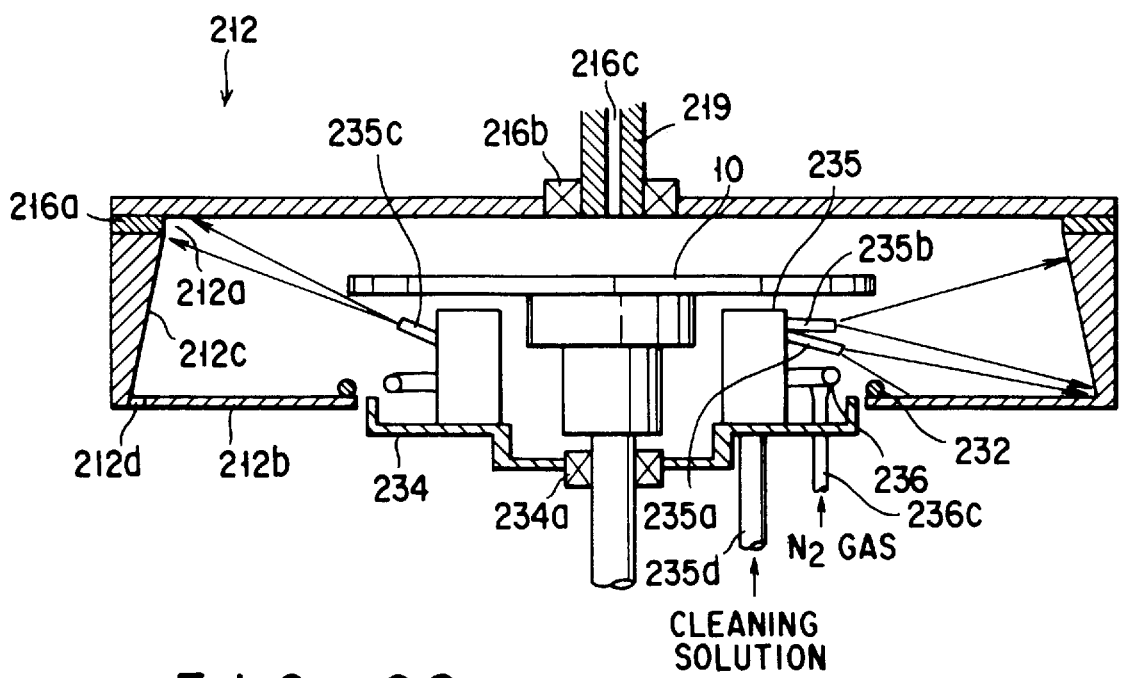
FIG. 28 is a sectional view showing a state of using the inert gas supply nozzle and cleaning nozzles in FIG. 27.

A cleaning nozzle 235 mounted on the mounting member 234 together with the $N_2$ gas supply nozzle 236 is constituted by a bottom surface cleaning nozzle member 235a inclined toward the bottom surface of the rotary cup 212, a side surface cleaning nozzle member 235b horizontally projecting toward the inner surface of the rotary cup 212, and a lid cleaning nozzle member 235c inclined toward the lower surface of the lid 216, as shown in FIGS. 25 and 28. These nozzle members 235a to 235c are connected to a cleaning liquid supply source (not shown) through a cleaning liquid supply tube 235d, which extends through the fixed collar 24.

In cleaning the rotary cup 212 with this cleaning nozzle 235, the nozzle members 235a to 235c are moved upward with upward movement of the spin chuck 10 by rotation and are located in the processing chamber 211 of the rotary cup 212, as shown in FIG. 20. Then, a cleaning liquid supplied from the cleaning liquid supply source is sprayed from the nozzle members 235a to 235c to the bottom and inner side surfaces of the rotating rotary cup 212 and the lower surface of the lid 216 (more particularly, an abutment portion between the lid 216 and the rotary cup 212), thereby cleaning off a resist solution attached to the rotary cup 212 and the lid 216. This cleaning is periodically performed upon processing a predetermined number of substrates G.

Figure 29:
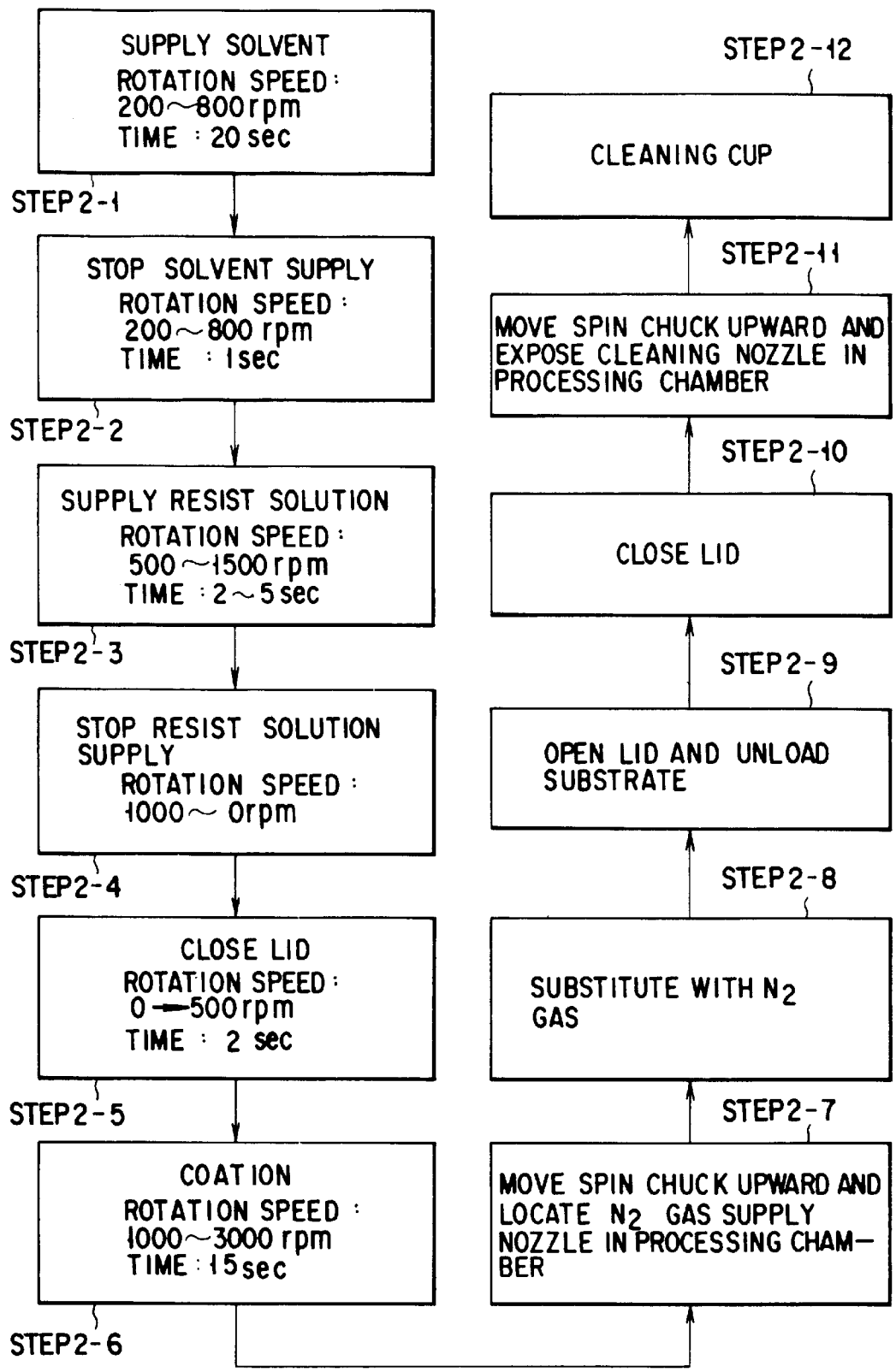
FIG. 29 is a flow chart for explaining a method of forming a coating film in the second embodiment of the present invention.
Figure 30A:
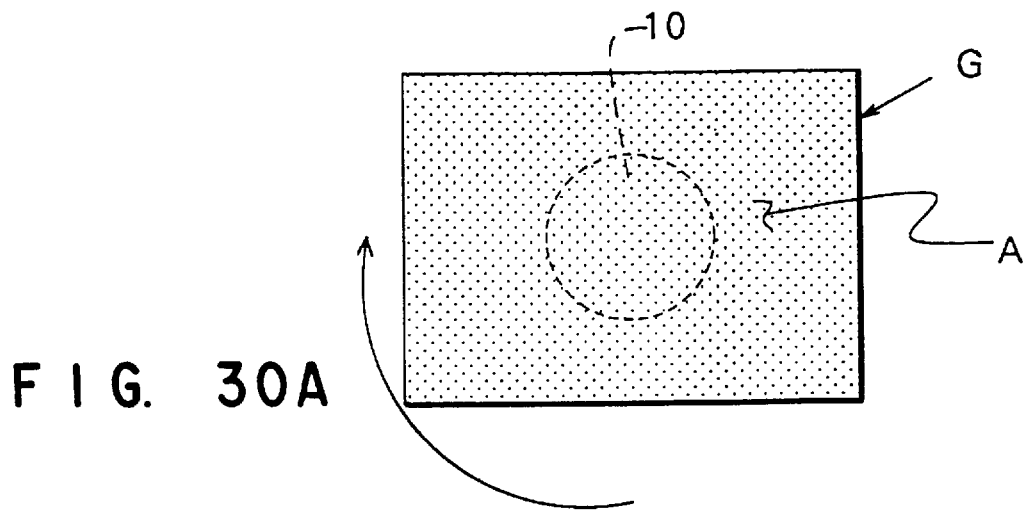
FIGS. 30A to 30C are views showing states of a substrate when the method of forming a resist film in the second embodiment of the present invention is executed.
Figure 30B:
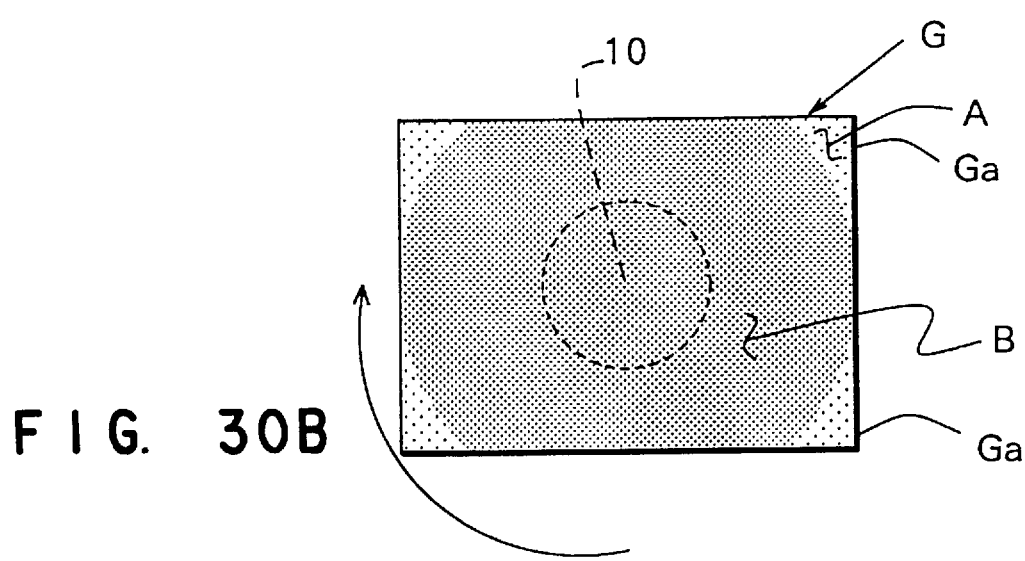
Figure 30C:
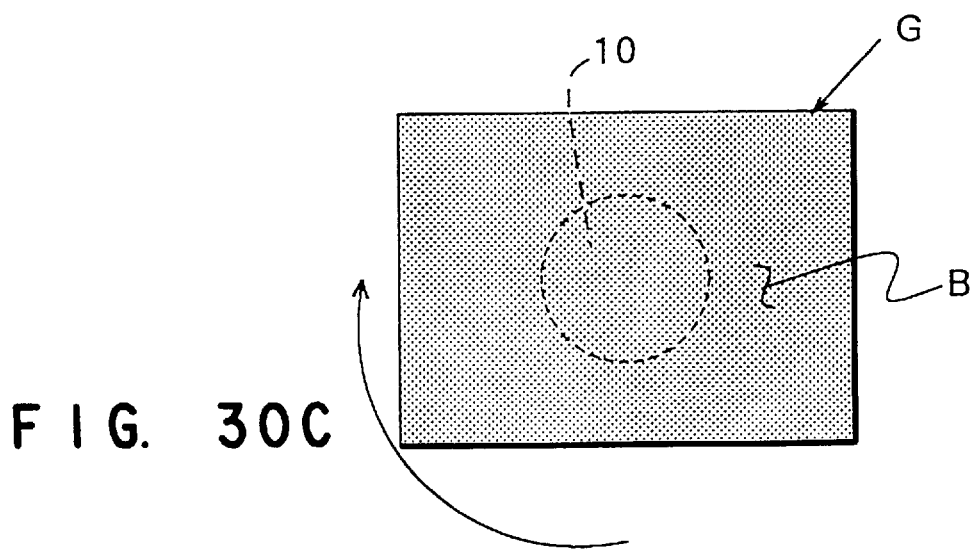

A procedure of forming a resist film by the coating apparatus having the above arrangement will be described below with reference to a flow chart in FIG. 29 and explanatory views in FIGS. 30A to 30C.

First, the lid 216 of the rotary cup 212 and the fixed lid 215 of the drain cup 214 are opened. The substrate G is conveyed onto the rest spin chuck 10 by a convey arm (not shown), and the substrate G is held on the spin chuck 10 by vacuum suction.

In this state, the spin chuck 10 is rotated to rotate the substrate G at a lower speed (for example, rotation speed: 200 to 800 rpm, acceleration: 300 to 500 rpm/sec) compared to normal processing rotation. At the same, the rotary cup 212 is rotated at the same speed. The moving arm 271 of the moving mechanism 270 is rotated from the waiting position to move the solvent supply nozzle 40 of the spray head 60 above the central portion of the substrate G. During the rotation of the spin chuck 10 and the rotary cup 212, for example, 26.7 cc of ethyl cellosolve acetate (ECA) as the solvent A of a coating liquid are supplied (for example, dropped) to the substrate surface for, for example, 20 seconds from the solvent supply nozzle 40 (step 2-1). Alternatively, the solvent A may be dropped onto the rest substrate G without rotating it, and then the substrate G may be rotated.

After the solvent A is supplied for 20 sec in this manner, the supply of the solvent A is stopped, while the rotation speed of the spin chuck 10 and the rotary cup 212 is kept at the above low rotation speed (step 2-2). At this time, the solvent A is diffused and applied to the entire surface of the substrate G (see FIG. 30A).

Next, the spin chuck 10 is rotated at a high speed (first rotation speed: range of about 500 to 1,500 rpm, for example, 1,000 rpm, acceleration: 300 to 600 rpm/sec). At the same time, 5 cc of a coating liquid such as the resist solution B are dropped for, for example, 5 sec from the resist solution supply nozzle 50 which is moved above the central portion of the solvent film on the substrate surface (step 2-3). Time when the solvent A is dried can be obtained in advance by an experiment. For example, when the interference fringes of light are visually recognized on the surface of the substrate G, the solvent A is not dried. When the solvent A is dried, the interference fringes of light are not recognized, thereby obtaining the time. In this case, for the supply time of 5 sec, the driving time of the bellows pump 57 can be controlled to accurately, delicately control the supply amount of resist solution.

After the resist solution B is supplied (dropped) for 5 sec in this manner, the supply of the resist solution B is stopped. At the same time, the rotation of the spin chuck 10 and the rotary cup 12 is stopped (step 2-4). In this state, the resist solution B is applied within a substantially concentric circle remaining corner portions Ga of the substrate G (see FIG. 30B). If the resist solution B is supplied to the entire region including the corner portions Ga of the substrate G at this time, the resist solution B is wasted. Also, the mist of the resist solution B may be scattered and attached to the lower surface of the rotary cup 212 and the substrate G. The amount of resist solution B, therefore, is preferably set to the minimum amount for being supplied to the entire region of the substrate G with a predetermined film thickness.

The supply of the resist solution B is stopped, and the resist solution supply nozzle 50 is moved to the waiting position. Thereafter, the fixed lid 215 and the lid 216 are moved to positions for respectively closing the opening portions of the drain cup 214 and the rotary cup 212 by the robot arm 20. These opening portions are closed to encapsulate the substrate G in the rotary cup 12 (step 2-5).

The opening portion of the drain cup 214 is closed with the fixed lid 215, and the opening portion 212a of the rotary cup 212 is tightly closed with the lid 216. In this state, the spin chuck 10 and the rotary cup 212 are rotated for, for example, 15 sec at a speed higher than the first rotation speed (second rotation speed: range of about 1,000 to 3,000 rpm, for example, 1,400 rpm, acceleration: 500 rpm/sec). The resist solution B spreads over the entire surface of the substrate G, thereby uniforming the film thickness of the resist film (step 2-6; see FIG. 30C). The discharge amount and time of the resist solution B at this time determine the film thickness of the resist film. Note that the solvent A and the resist film are not dried but are wet in this state.

In the film thickness formation, the interior of the processing chamber 211 is set to a negative pressure with the rotation of the spin chuck 10 and the rotary cup 212. Air discharge is always performed on the exhaust port 214b side. With this operation, air flows from the air inlet 216c into the processing chamber 211. The air is guided to the inner wall side of the rotary cup 212 by the current plate 213 to be exhausted from the exhaust hole 212d along the inner wall. For this reason, a resist solution mist scattered in the processing chamber 211 does not attach to the substrate G again. The mist is discharged outside to prevent the mist from attaching to the abutment portion between the opening portion of the rotary cup 212 and the lid 216. Further, air flows from the air supply holes 215b formed in the fixed lid 215 to the drain cup 214. The air is exhausted from the exhaust ports 214b along the outer wall of the rotary cup 212. The mist discharged from the processing chamber 211 of the rotary cup 212 is prevented from being blown to prevent the mist from attaching to the inner wall of the drain cup 214.

Upon completion of coating, the spin chuck 10 and the rotary cup 212 are rotated at a low speed, for example, 500 rpm. While the position of the substrate G is suppressed, the spin chuck 10 is slightly moved upward to locate the $N_2$ gas supply nozzle 236 in the processing chamber 211 (step 2-7; see FIG. 28). $N_2$ gas is radially sprayed from the small holes 236b of the $N_2$ gas supply nozzle 236 into the processing chamber 211 to substitute the interior of the processing chamber 211 with the $N_2$ gas. The negative pressure state in the processing chamber 211 is released (step 2-8). Thereafter, the rotation of the spin chuck 10 and the rotary cup 212 is stopped. The lid 216 is moved to the waiting position by the robot arm 20. The substrate G is extracted by the convey arm (not shown), completing the coating operation. The lid is opened to unload the substrate G (step 2-9).

Then, the opening portion 212a of the rotary cup 212 is closed with the lid 216, as needed (step 2-10). In this state, the spin chuck 10 is moved upward to locate the nozzle members 235a to 235c of the cleaning nozzle 235 in the processing chamber 211 (step 2-11). While rotating the rotary cup 212, a cleaning liquid is sprayed to the bottom portion 212b and the side wall portion 212c of the rotary cup 212, the lower surface of the lid 216, and the abutment portion between the lid 216 and the rotary cup 212 from the nozzle members 235a to 235c to remove the resist solution attached to them and the like (step 2-12). By this cleaning, the substrate G is prevented from being contaminated in the subsequent processing due to contamination of the rotary cup 212. This cleaning is performed periodically or for every processing for a predetermined number of substrates G.

Note that the second embodiment can also employ the modifications shown in FIGS. 15 to 22 as in the first embodiment.

The third embodiment of the present invention will be described below.

FIG. 31 shows a coating apparatus according to the third embodiment of the present invention. This apparatus comprises a coating mechanism 301, a removing mechanism 302, a first convey mechanism 303, and a second convey mechanism 304. The coating mechanism 301 coats the surface of an LCD substrate G as a quadrangular substrate to be processed with a coating liquid such as a resist solution. The removing mechanism 302 is integrally disposed with the coating mechanism 301 to remove an unnecessary coating film formed at the peripheral edge portion of the substrate G. The first convey mechanism 303 loads the substrate G to the coating mechanism 301 and unloads the substrate G from the removing mechanism 302. The second convey mechanism 304 conveys the substrate G coated in this process to the removing mechanism 302.

The coating mechanism 301 has substantially the same arrangement as the coating apparatus in the second embodiment, and a description thereof will be omitted.

The main part of the removing mechanism 302 is constituted by a table 350 as an apparatus means horizontally rotatable through 90° or more to hold the substrate G by suction with a vacuum unit (not shown), and a pair of removing nozzles 351 for spraying a resist removing liquid such as a resist solvent to the upper and lower surfaces of two opposite edge portions of the substrate G held by this table 350, as shown in FIGS. 31 and 32.

The table 350 is horizontally rotated through 90° or more by a driving unit 352 comprising a rotary mechanism such as a motor (not shown) and an elevating mechanism such as an elevating cylinder or ball screw. Further, the table 350 is constituted to be capable of elevating. The table 350 having such an arrangement is elevated to be switched between a transfer position of the substrate G, a coating film removing position, and a waiting position. By horizontally rotating the table 350 through 90°, the two pairs of two opposite edges of the substrate G can be switched to the removing nozzle 351 side.

Each removing nozzle 351 is constituted by upper surface cleaning nozzles 351a and lower surface cleaning nozzles 351b, each of which has a thin needle-like shape like a cannula. Each nozzle 351a is connected to a solvent supply path 353c for removing a resist from the upper surface. The solvent supply path 353c is formed in an upper horizontal piece 353a of a spray head 353 having an almost lateral U-shaped sectional surface which covers the upper, lower and side surfaces of the edge portion of the substrate G. Each nozzle 351b is connected to a solvent supply path 353d for removing a resist from the lower surface. The solvent supply path 353d is formed in a lower horizontal piece 353b of the spray head 353. In this case, the nozzle 351a is suspended down with its nozzle hole facing downward, while the nozzle 351b projects with its nuzzle hole facing upward. The nozzle hole of the nozzle 351a is shifted from the nozzle hole of the nozzle 351b such that a removing liquid sprayed from the nozzle hole of the nozzle 351a does not interfere with that sprayed form the nozzle hole of the nozzle 351b. The reason for shifting the nozzle hole of the nozzle 351a from the nozzle hole of the nozzle 351b in this manner is as follows. That is, if a solvent sprayed from the nozzle 351a collides with a solvent sprayed from the nozzle 351b near the nozzles, the solvent scattered by this collision attaches to a resist film on the surface portion of the substrate G to adversely form a nonuniform resist film. The above arrangement is for eliminating this adverse effect.

Note that an exhaust port 353f is provided to a vertical portion 353e in the spray head 353 of the removing nozzles 351 on the nozzle side. An exhaust pipe 354 connected to an exhaust unit (not shown) is connected to the exhaust port 353f. The solvent sprayed from the removing nozzles 351 to be supplied to remove a resist film is discharged through the exhaust pipe 354.

The case has been described in which the nozzles 351a are linearly suspended. The nozzles 351a, however, are not limited to this shape. As indicated by a chain double-dashed line in FIG. 33, the nozzle hole of the nozzle 351a may be bent to be inclined outward from the inside of the substrate G. By bending the nozzle hole in this manner, a removing liquid is sprayed from the nozzle 351a to the peripheral direction of the substrate G, thereby preventing the removing liquid from attaching to a resist film on the central side. The nozzle hole of the nozzle 351b may also be bent to be inclined outward from the inside of the substrate G.

As shown in FIG. 32, the pair of removing nozzles 351 having the above arrangement are arranged on two opposite first and second sides of the substrate G, that is, a long side and a short side so as to be position-adjustable. The removing nozzles 351 can be vertically moved between resist film removing positions at the edge portions of the substrate G and waiting positions by a vertically moving mechanism 356. The removing nozzles 351 are also moved along the edge portions of the substrate G by a horizontally moving mechanism 357. In this case, a plurality of removing nozzles 351 may be provided at proper intervals in a moving direction. With this arrangement, the removing performance can be further improved.

In this case, the position adjustment mechanism 355 comprises an air cylinder 359, an outer stopper 360a, and an inner stopper 360b. The air cylinder 359 is constituted by a cylinder member 359a coupled to the nozzle head of one of the opposite removing nozzles 351 through a mounting member 358a. An extendible rod 359b is slidably mounted on the cylinder member 359a and coupled to the spray head 353 of the other removing nozzle 351 through a mounting member 358b. The outer stopper 360a collides with both the mounting members 358a and 358b upon extension of the extendible rod 359b of the air cylinder 359 to determine a long side removing position of the substrate G for the removing nozzles 351. The inner stopper 360b collides with both the mounting members 358a and 358b upon shortening the extendible rod 359b of the air cylinder 359 to determine a short side removing position of the substrate G for the removing nozzles 351. Note that the two removing nozzles 351 are supported by a support member 361 for mounting the cylinder member 359a of the air cylinder 359.

The vertically moving mechanism 356 is constituted by an elevating member 364, and a cylinder member 365a mounted to the elevating member 364, and an extendible rod 365b slidably mounted on this cylinder member 365a and attached to the traveling plate 362. The elevating member 364 is mounted on the lower surface side of one end of the support member 361. The elevating member 364 can be elevated along an elevating guide rail 363, which is provided to a traveling plate 362 (to be described later) movable in the horizontal direction (Y direction). The horizontally moving mechanism 357 is constituted as follows. That is, the traveling plate 362 is mounted on two upper and lower traveling guide rails 368 parallel to each other, which are horizontally disposed on the side surface of a standing wall 367 standing from a base plate 366, thereby allowing the traveling plate 362 to travel. A timing belt 369a interposed between a pulley 369 mounted on the standing wall 367 and a driving pulley (not shown) mounted on the driving shaft of a driving motor (not shown) is fastened to the traveling plate 362.

Auxiliary cleaning nozzles 351A for removing a resist film attached to the lower corner surface portions of the substrate G are disposed below the table 350 (see FIG. 32).

Figure 35:
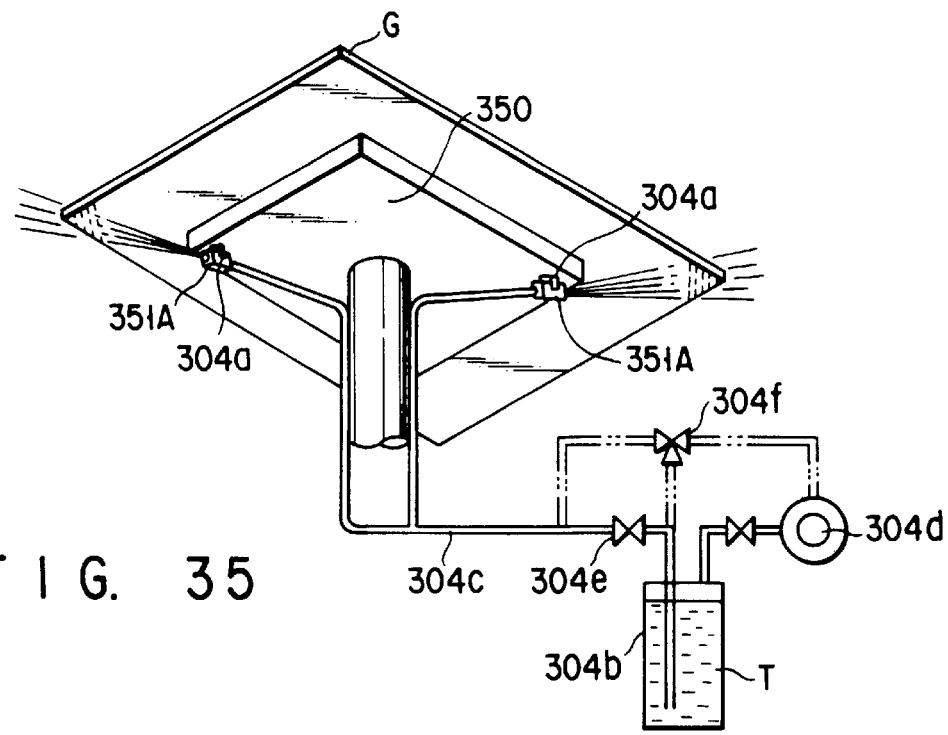
FIG. 35 is a perspective view showing a mounted state of auxiliary cleaning nozzles used in the removing mechanism.

The respective auxiliary cleaning nozzles 351A are mounted on corresponding positions on the diagonal line of the table 350 by support members 304a such that spray directions can be adjusted, as shown in FIG. 35. The auxiliary cleaning nozzles 351A are connected to a tank 304b containing thinner T as a solvent through a solvent supply tube 304c.

Note that, to remove a resist film attached to the lower corner surface portions of the substrate G by the auxiliary cleaning nozzles 351A, a pressure gas is supplied from, for example, a nitrogen ($N_2$) gas supply source 304d to the tank 304b. A valve 304e interposed in the solvent supply tube 304c is opened to spray the thinner T from the auxiliary cleaning nozzles 351A to the lower corner surface portions of the substrate G. In this case, as indicated by a chain double-dashed line in FIG. 35, the tank 304b and the $N_2$ gas supply source 304d are connected to the solvent supply tube 304c through a three-way selector valve 304f. The solvent is sprayed from the auxiliary cleaning nozzles 351A to remove the resist film attached to the lower corner surface portions of the substrate G. Then, the three-way selector valve 304f is switched. $N_2$ gas is sprayed (supplied) from the auxiliary cleaning nozzles 351A to promote drying of the lower corner surface portions.

Figure 36A:
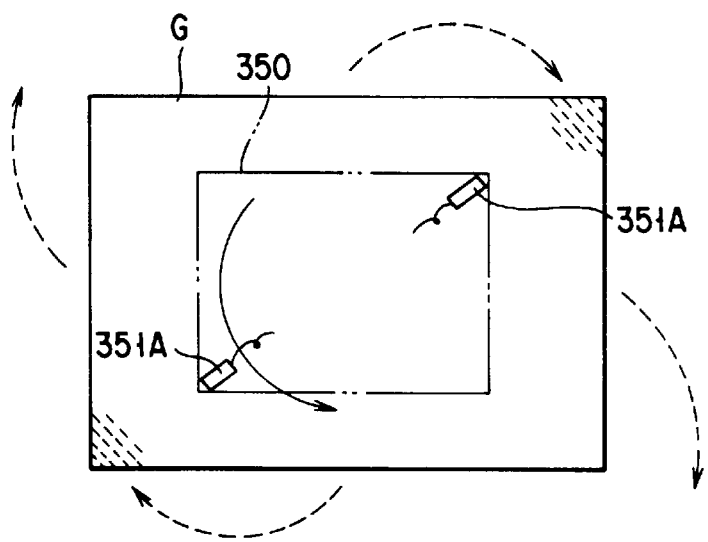
FIGS. 36A and 36B are bottom views schematically showing other mounted states of the auxiliary cleaning nozzles used in the removing mechanism.

In this case, when a resist solution applied to the surface of the quadrangle (for example, rectangular) substrate G is swished off by rotating a spin chuck 10, the resist solution attached to the long sides of the substrate G is scattered outward by the centrifugal force, as shown in FIG. 36A. However, after the resist solution attached to the short sides of the substrate G is scattered outward from the side portions of the substrate G, it collides with adjacent corners and attaches again to the lower corner surface portions of the substrate G at diagonal positions. This attachment amount increases at a higher rotation speed of the substrate G, with a larger size of the substrate G, at a higher ratio between the short and long sides, or at a larger amount of an applied resist solution. For this reason, the auxiliary cleaning nozzles 351A are disposed at diagonal positions on the lower side of the table 350 corresponding to the corner portions of the substrate G at diagonal positions to which resist solution attaches. The resist film attached to the lower corner surface portions of the substrate G, therefore, can be easily removed with the thinner sprayed from the auxiliary cleaning nozzles 351A.

Figure 36B:
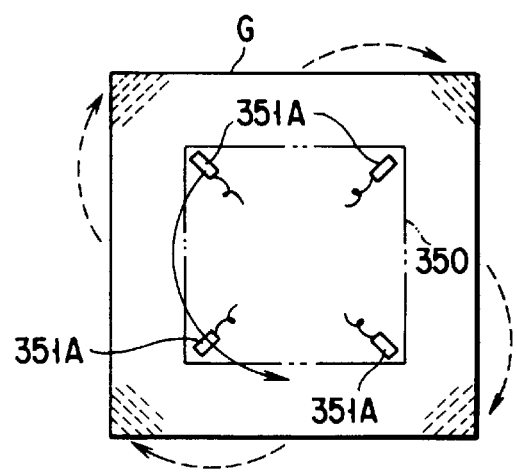

Note that the reattachment amount to a square substrate G is originally smaller than that to a rectangular substrate G. In swishing off a resist solution applied to the surface of the substrate G by rotating the spin chuck 10, the resist solution scattered from the side portions of the substrate G may attach again to adjacent lower corner surface portions. If the attached resist solution must be removed, a total of four auxiliary cleaning nozzles 351A may be disposed on the lower corner portions of the table 350, as shown in FIG. 36B.

Instead of providing the auxiliary cleaning nozzles 351A, a structure with improved removing nozzles 351 can be employed. More specifically, as shown in FIG. 37, the lower horizontal piece 353b of the spray head 353 of each removing nozzle 351 projects outward (substrate G side). First to fourth needle-like auxiliary cleaning nozzles 351c, 351d, 351e, and 351f are vertically arranged outside the lower surface cleaning nozzles 351b at a proper interval. When the removing nozzle 351 is located at the corner portion of the substrate G, a solvent such as thinner is sprayed from the upper surface cleaning nozzles 351a, the lower surface cleaning nozzles 351b, and the first to fourth auxiliary cleaning nozzles 351c to 351f to remove a resist film attached to the upper and lower corner surface portions of the substrate G. When the removing nozzle 351 is moved on the central portion away from the corner portion of each side of the substrate G, spraying of the thinner from the first to fourth auxiliary cleaning nozzles 351c to 351f is stopped. Only the nozzles 351a and 351b spray the thinner to remove a resist film attached to the two edge surface portions of the substrate G.

Note that a solvent supply path 353c is provided to the auxiliary cleaning nozzles 351c to 351f in addition to the solvent supply path 353b of the lower surface cleaning nozzle 351b. Valves (not shown) are interposed between the auxiliary cleaning nozzles of the solvent supply path 353c. The auxiliary cleaning nozzles 351c to 351f are sequentially opened/closed to gradually increase/decrease the solvent sprayed from the auxiliary cleaning nozzles 351c to 351f.

The auxiliary cleaning nozzles 351c and 351f having the above arrangement can be arbitrarily disposed, provided that they are disposed outside the lower surface cleaning nozzle 351b (substrate G side). However, the solvent sprayed from the auxiliary cleaning nozzles 351c to 351f may be sprayed in a fountain-like manner and scatter around. To avoid this, it is preferable to employ an arrangement shown in FIG. 38. More specifically, the spray head 353 is constituted by a rectangular spray head main body 353A having one open end, and a rectangular auxiliary spray head 353B having one open end. The upper surface cleaning nozzle 351a and the lower surface cleaning nozzle 351b are disposed on the spray head main body 353A. The auxiliary spray head 353B is continuous to the side surface of the spray head main body 353A and projects outward from the spray head main body 353A. The auxiliary cleaning nozzles 351c to 351f are disposed on a lower horizontal piece 353g of the auxiliary spray head 353B. The solvent sprayed from the auxiliary cleaning nozzles 351c to 351f is received by an upper horizontal piece 353h of the auxiliary spray head 353B.

Note that the opposite surfaces of the lower and upper horizontal pieces 353g and 353h of the auxiliary spray head 353B have arcuated sectional surfaces. With this structure, a sprayed solvent is reliably prevented from scattering around.

On the other hand, the second convey mechanism 304 for conveying the substrate G from the coating mechanism 301 to the removing mechanism 302 comprises a pair of convey arms 370 for holding, by suction, the lower peripheral surface portions of two opposite sides of the substrate G, as shown in FIG. 39. These convey arms 370 are guided along linear guides 371 and can be moved in a direction indicated by an arrow X in FIG. 31 by the driving force of an arm driving motor 375 transmitted through timing belts 372, pulleys 373, and a shaft 374. In this case, each convey arm 370 is fastened to the corresponding timing belt 372 through a fastening member 376. The arm driving motor 375 is controlled by a control unit 377 constituted by a central processing unit (CPU). As needed, the reciprocating motion can be repeated in a convey direction to coat the substrate G and remove a coating film for a predetermined period of time.

Figure 40A:
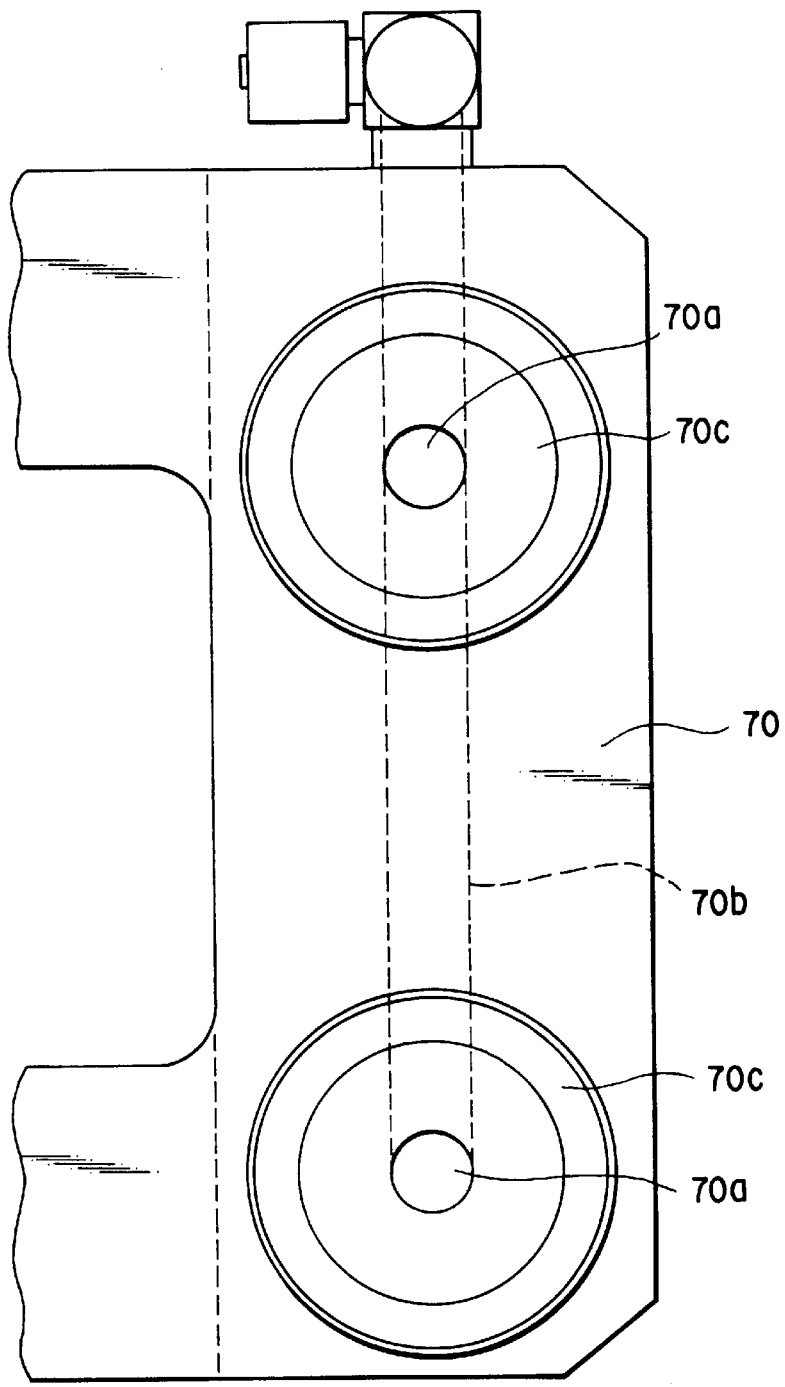
FIG. 40A is a plan view showing the main part of the second convey mechanism.
Figure 40B:
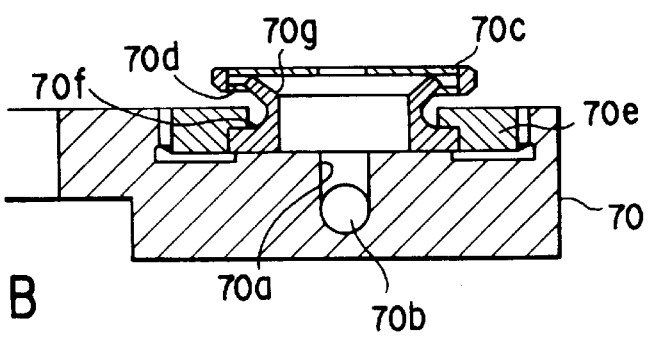
FIG. 40B is a sectional view showing the main part of the second convey mechanism.
Figure 43:
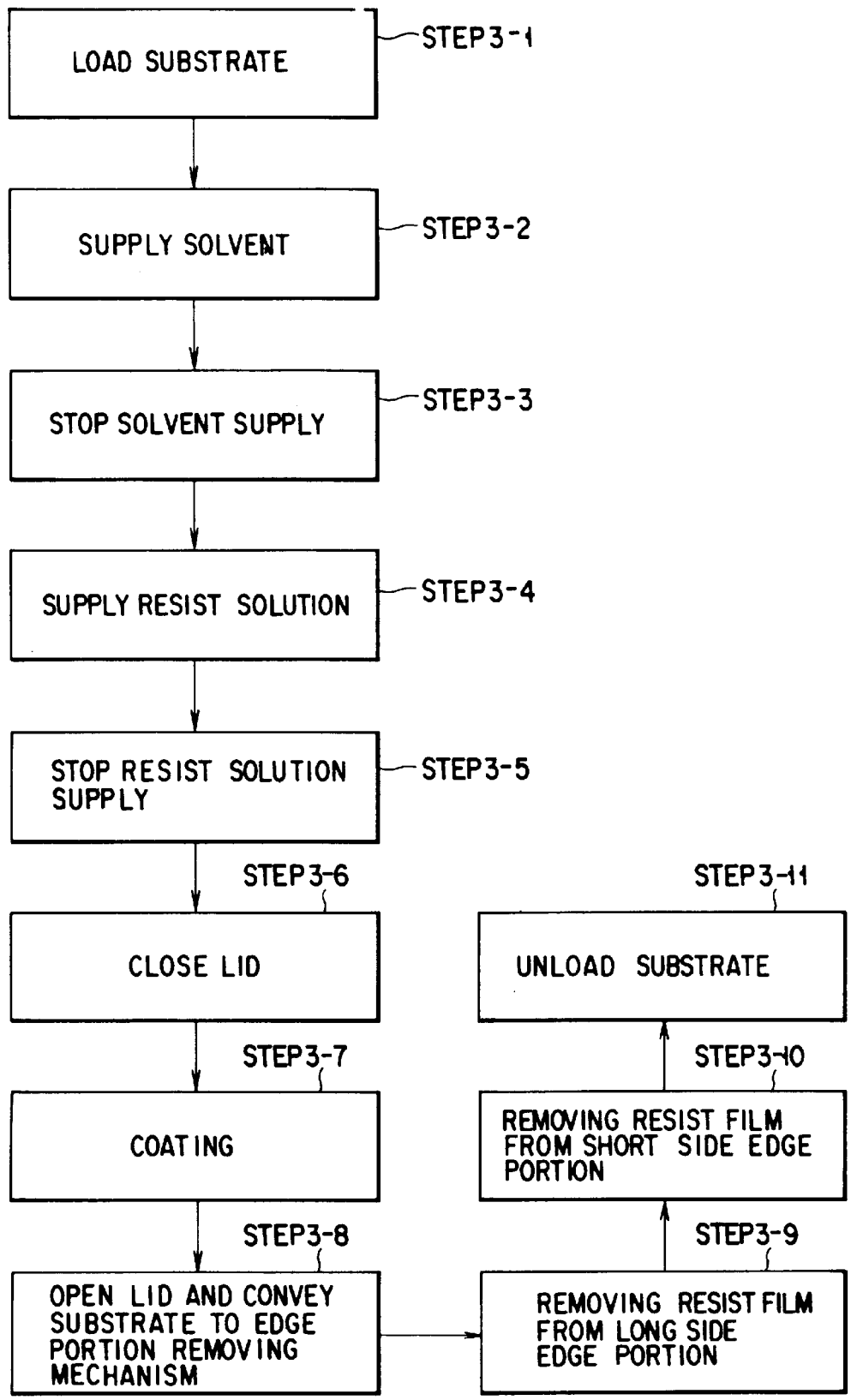
FIG. 43 is a flow chart for explaining a method of forming a resist film and removing the resist film from edge portions in the third embodiment of the present invention.

Suction holes 370a connected to a vacuum suction mechanism (not shown) through a suction passage 370b are formed in the substrate holding surface of each convey arm 370, as shown in FIGS. 40A and 40B. Pad members 370c having suction holes which communicate with the suction holes 370a are displacably arranged in the vertical direction with respect to the convey arm 370. In this case, each pad member 370d has an inverted hat-like shape with an inward flange 370d, and is made of a corrosion-resistant member as of Delrin (tradename).

A cylindrical synthetic rubber lip seal 370f having flexibility stands and is fixed around the suction hole 370a of each convey arm 370 by a press screw 370e. A locking portion 370g projects outward at the upper end of this lip seal 370f. The inward flange 370d is engaged with the locking portion 370g. With this arrangement, the pad members 370c is set to be vertically displacable.

Two of the pad members 370c mounted in this manner are provided for each convey arm 370. In conveying the substrate G, the lip seal 370f is elastically deformed to vertically displace the pad member 370c. The substrate G, therefore, can be conveyed following to the plan surface of the substrate G while horizontally holding the attitude of the substrate G. The lip seal 370f is elastically deformed to absorb shock in receiving the substrate G, thereby preventing the substrate G from damage. Note that, in this case, the number of pad members 370c is not limited to two, and an arbitrary number of pad members, that is, one pad member 370c or three or more pad members 370c may be provided.

The first convey mechanism 303 for loading the substrate G to the coating mechanism 301 and unloading the substrate G from the removing mechanism 302 comprises a main arm 380, as shown in FIGS. 41 and 42. The main arm 380 has a structure in which two upper and lower fork-like arm members 381a and 381b are independently, reciprocally movable in the horizontal direction. More specifically, the two sides of the upper arm member 381a are supported by a pair of outer frames 383 slidable along outer linear guides 382, which are arranged opposite to each other. A timing belt (not shown) is wound on an outer pulley 385 driven by a first driving motor 384 through a transmission pulley 385a. This timing belt is fastened to the outer frames 383. The upper arm member 381a can be reciprocally moved by rotating the first driving motor 384 clockwise or counterclockwise. The lower arm member 381b is supported by inner frames 387 movable along a pair of inner linear guides 386 disposed inside the outer linear guides 382. A timing belt (not shown) is wound on an inner pulley 389 driven by a second driving motor 388 through a transmission pulley 389a. This timing belt is fastened to the inner frames 387. The lower arm member 381b can be reciprocally moved by rotating the second driving motor 388 clockwise or counterclockwise.

The main arm 380 having such an arrangement is constituted to be movable in the X and Y directions on a plane, rotatable (~ direction), and movable in the vertical direction (Z direction), as shown in FIG. 31.

As shown in FIG. 41, each of the arm members 381a and 381b has holding pawls 381c. The presence of the substrate G, which is placed on the arm members 381a and 381b of the main arm 380, is detected by a sensor 450.

Note that, in this case, instead of providing the holding pawls 381c on the arm members 381a and 381b, suction holes and pad members may be provided to hold the substrate G by vacuum suction, like in the convey arms 370.

An example of a procedure of coating the substrate G with a resist and removing an unnecessary resist film from a side portion by using the coating apparatus having the above arrangement will be described below with reference to FIGS. 43 and 44A to 44E.

First, a lid 216 of a rotary cup 212 and a fixed lid 215 of a drain cup 214 in the coating mechanism 301 are opened. The substrate G is conveyed onto the rest spin chuck 10 by the main arm 308 of the first convey mechanism 303, and the substrate G is held by the spin chuck 10 by vacuum suction (step 3-1).

In this state, the spin chuck 10 is rotated to rotate the substrate G at a lower speed (for example, rotation speed: 200 to 800 rpm, acceleration: 300 to 500 rpm/sec) compared to normal processing rotation. At the same, the rotary cup 212 is rotated at the same speed. A moving arm 271 of a moving mechanism 270 is rotated from a waiting position to move a solvent supply nozzle 40 of a spray head 60 above the central portion of the substrate G. During the rotation of the spin chuck 10 and the rotary cup 212, for example, 26.7 cc of ethyl Cellosolve acetate (ECA) as a solvent A of a coating liquid are supplied (for example, dropped) to the substrate surface for, for example, 20 seconds from the solvent supply nozzle 40 (step 3-2). Alternatively, the solvent A may be dropped to the rest substrate G without rotating it, and then the substrate G may be rotated.

After the solvent A is supplied for 20 sec in this manner, the supply of the solvent A is stopped, while the rotation speed of the spin chuck 10 and the rotary cup 212 is kept at the above low rotation speed (step 3-3). At this time, the solvent A is diffused and applied to the entire surface of the substrate G.

Next, the spin chuck 10 is rotated at a high speed (first rotation speed: range of about 500 to 1,500 rpm, for example, 1,000 rpm, acceleration: 300 to 600 rpm/sec). At the same time, for example, 8 cc of a coating liquid such as a resist solution B are dropped for, for example, 5 sec from a resist solution supply nozzle 50, which is moved above the central portion of the solvent film on the substrate surface (step 3-4). Time when the solvent A is dried can be obtained in advance by an experiment. For example, when the interference fringes of light are visually recognized on the surface of the substrate G, the solvent A is not dried. When the solvent A is dried, the interference fringes of light are not recognized, thereby obtaining the time. In this case, for the supply time of 5 sec, the driving time of the bellows pump 57 can be controlled to accurately, delicately control the supply amount of resist solution.

After the resist solution B is supplied (dropped) for 5 sec in this manner, the supply of the resist solution B is stopped. At the same time, the rotation of the spin chuck 10 and the rotary cup 12 is stopped (step 3-5). In this state, the resist solution B is applied within a substantially concentric circle remaining corner portions Ga of the substrate G (see FIG. 30B). If the resist solution B is supplied to the entire region including the corner portions Ga of the substrate G at this time, the resist solution B is wasted. Also, the mist of the resist solution B may be scattered and attached to the lower surface of the rotary cup 212 and the substrate G. The amount of resist solution B, therefore, is preferably set to the minimum amount for being supplied to the entire region of the substrate G with a predetermined film thickness.

The supply of the resist solution B is stopped, and the resist solution supply nozzle 50 is moved to a waiting position. Thereafter, the fixed lid 215 and the lid 216 are moved to positions for respectively closing the opening portions of the drain cup 214 and the rotary cup 212 by the robot arm 20. These opening portions are closed to encapsulated the substrate G in the rotary cup 12 (step 3-6).

The opening portion of the drain cup 214 is closed with the fixed lid 215, and an opening portion 212a of the rotary cup 212 is tightly closed with the lid 216. In this state, the spin chuck 10 and the rotary cup 212 are rotated for, for example, 15 sec at a speed higher than the first rotation speed (second rotation speed: range of about 1,000 to 3,000 rpm, for example, 1,400 rpm, acceleration: 500 rpm/sec). The resist solution B spreads over the entire surface of the substrate G, thereby uniforming the film thickness of the resist film (step 3-7; see FIG. 44A). The discharge amount and time of the resist solution B at this time determine the film thickness of the resist film. Note that the solvent A and the resist film are not dry but are wet in this state.

Next, the convey arms 370 of the second convey mechanism 304 convey the substrate G onto the table 350 of the removing mechanism 302. The table 350 holds the table 350 by suction (step 3-8; see FIG. 44B).

The convey arms 370 of the second convey mechanism 304, which convey the substrate G, are retracted to a waiting position. Then, the removing nozzles 351 of the removing mechanism 302 are set at the two long side edge portions of the substrate G. The removing nozzles 351 spray a removing solvent such as a resist solvent (for example, thinner) to the two edge portions along the long side of the substrate G, while being moved along the long side. An unnecessary resist film about 5 mm wide from each end portion is dissolved and removed from the long side edge portions of the substrate G (step 3-9, first removing step; see FIG. 44C). At the same time, the resist attached to the side edge surface portions of the substrate G is also removed. In this removal, the second substrate G is loaded to the coating mechanism 301 and coated.

After the unnecessary resist film is removed from the long side of the substrate G, the table 350 is rotated clockwise through 90° to locate the short side of the substrate G to the removing nozzle 351 side. In this case, the rotation angle is not limited to 90° but may be an odd multiple of 90°, for example, 270° or 450°. The table 350 may be rotated counterclockwise. Next, the air cylinder 359 of the position adjustment mechanism 355 is tend to set the removing nozzles 351 to the short side of the substrate G (see FIG. 44D). While the removing nozzles 351 are moved along the short side of the substrate G, the solvent is sprayed to two edge portions along the short side of the substrate G to remove an unnecessary resist film at the short side edge portions of the substrate G (step 3-10, second removing step; see FIG. 44E).

Thereafter, the main arm 380 of the first convey mechanism 303 unloads the substrate G and conveys it for the subsequent step (step 3-11). Since the resist film on the substrate edge portions has been removed, the resist does not attach to the main arm 380.

As has been described above, according to this embodiment, the substrate G can be conveyed to the removing mechanism 302 immediately after applying and forming a resist film, and the resist can be removed from the substrate edge portions.

Note that the resist film attached to the lower corner surface portions of the substrate G can be easily removed by spraying the solvent (for example, thinner) from the auxiliary cleaning nozzles 351A or the auxiliary cleaning nozzles 351c to 351f during the first or second removing step or at any time before and after these coating steps. For example, as shown in FIG. 45, when resist solutions R1 and R2 attached to the lower corner surface portions of the substrate G are to be removed, the auxiliary cleaning nozzles 351c to 351f are controlled to spray the solvent as follows.

Assume that the right and left removing nozzles 351 are moved in a direction indicated by an arrow in FIG. 45. The right removing nozzle 351 will be described, first.

Assume that the resist solution R1 attaches within a triangular region defined by a distance $L_{S1}$ along a short side $G_S$ and a distance $L_{L1}$ along a long side $G_L$. When the nozzle is located near the edge of the short side $G_S$, all the auxiliary cleaning nozzles 351c to 351f in addition to the upper surface cleaning nozzle 351a and the lower surface cleaning nozzle 351b spray the solvent to perform satisfactory cleaning to the distance $L_{S1}$.

As the removing nozzle 351 is moved in the direction indicated by the arrow in FIG. 45, the attachment width of the resist solution R1 decreases compared to the attachment width of the distance $L_{S1}$. For this reason, the auxiliary cleaning nozzles 351f, 351e, and 351d sequentially stop spraying the solvent. When the removing nozzle 351 is moved close to the distance $L_{L1}$ along the nozzle long side $G_L$, the auxiliary cleaning nozzle 351c also stops spraying the solvent because no resist solution R1 attaches to the lower surface. Then, the removing nozzle 351 is moved along the long side $G_L$, while only the lower surface cleaning nozzle 351b sprays the solvent to the lower surface side.

On the other hand, as for the left removing nozzle 351, no resist solution attaches to the lower corner surface portion at the start of movement, as shown in FIG. 45. For this reason, the upper surface cleaning nozzle 351a and the lower surface cleaning nozzle 351b spray the solvent, and the auxiliary cleaning nozzles 351c to 351f do not spray the solvent.

The removing nozzle 351 is moved close to the resist solution R2 attached to the lower corner surface portion. When the removing nozzle 351 is located closer to the distance $L_{L2}$ than the short side $G_S$, the auxiliary cleaning nozzle 351c sprays the solvent, first. If the resist solution R2 also attaches within a triangular region as in the resist solution R1, the auxiliary cleaning nozzles 351d, 351e, and 351f sequentially spray the solvent to dissolve and remove the resist solution R2 up to the distance $L_{S2}$ portion.

Upon completion of removing the resist on the long side $G_L$ by the right and left removing nozzles 351, the nozzles stop spraying the solvent. Then, the right and left removing nozzles 351 are retracted so as not to interfere with rotation of the substrate G.

Next, the substrate G is rotated through 90° clockwise or counterclockwise. The resist solution is removed from the short side $G_S$. In this case, since the resist solution R1 and the resist solution R2 attached to the lower corner surface portions have already been removed, only the upper surface cleaning nozzle 351a and the lower surface cleaning nozzle 351b spray the solvent.

In this manner, the auxiliary cleaning nozzles 351c to 351f are controlled to spray the solvent within a predetermined range corresponding to the attachment place and region of the resist solution attached to the lower surface side. With this operation, an unnecessary resist can be removed with the minimum use amount of solvent. In addition, this operation decreases the possibility of a large change in temperature of the substrate G depending on the temperature and evaporation of the solvent, thereby preventing a variation in film thickness of the resist film on the upper surface.

The coating apparatus of the third embodiment having the above arrangement can be singly used, as a matter of course. It can also be incorporated in a coating/developing system for an LCD substrate as shown in FIG. 10, as the coating apparatuses in the first and second embodiments.

In this case, the coating apparatus of the third embodiment has a structure obtained by combining the coating unit 107 and the coating film removing unit 108 in FIG. 10, which function as the coating mechanism 301 and the removing mechanism 302, respectively.

In such a coating/developing system, two or more sets of coating units 107 and coating film removing units 108, which respectively correspond to the coating mechanism 301 and the removing mechanism 302 in the third embodiment, can be provided. In this case, the coating units 107 may be set parallel to the coating film removing units 108. To decrease the installation space, however, the coating units 107 are stacked on the coating film removing units 108. In this structure wherein the coating units 107 are stacked on the coating film removing units 108, the same structure as in FIG. 10 may be employed except for allowing a main arm to move upward up to the uppermost unit.

Figure 46:
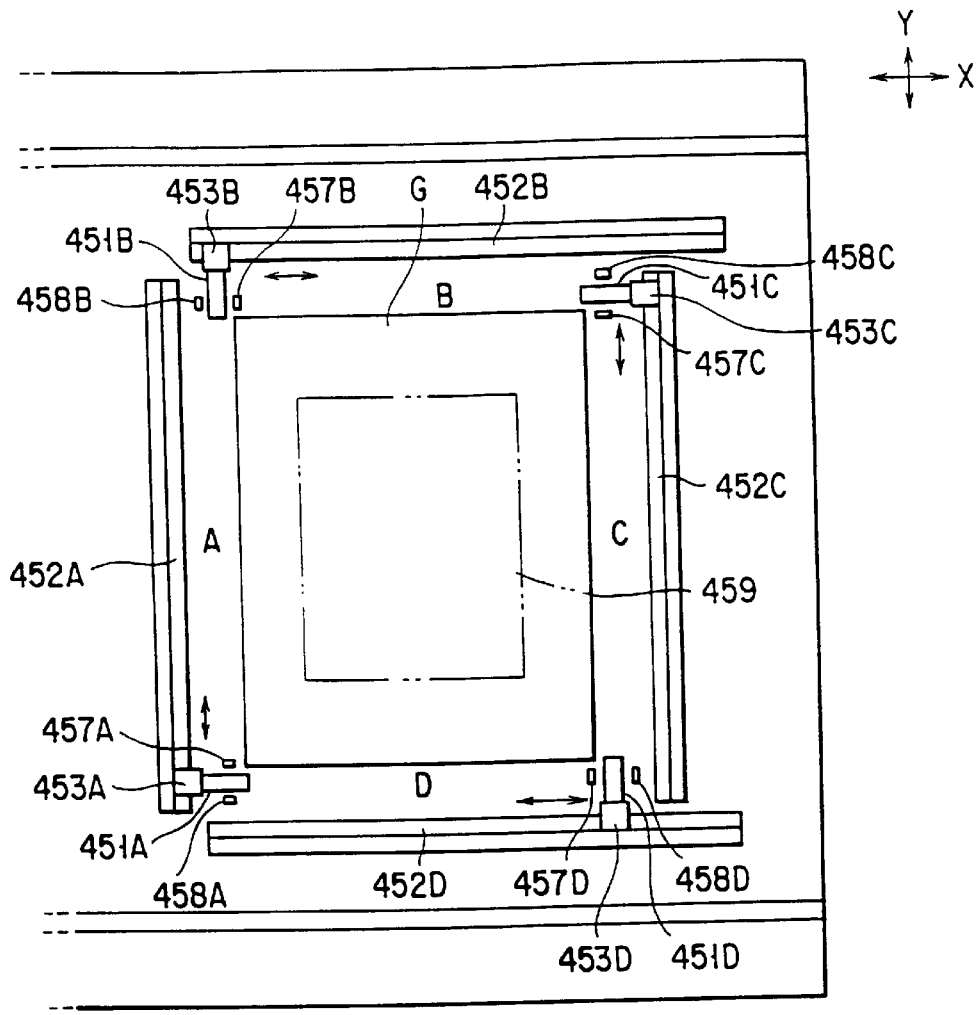
FIG. 46 is a plan view schematically showing another example of the removing mechanism.

In the above description of the third embodiment, the pair of right and left removing nozzles 351 dissolve and remove an unnecessary resist film from the long side end portions of the substrate G, first. Then, the substrate G is rotated through 90°, and an unnecessary resist film is dissolved and removed from the short sides. It is possible that, for example, four removing nozzles are provided to simultaneously dissolve and remove an unnecessary resist film from the four corners of the substrate G. For example, as shown in FIG. 46, removing nozzles 451A, 451B, 451C, and 451D are provided. Note that, since the structures and moving mechanisms of the four removing nozzles are the same, only those of the removing nozzle 451A will be described, and a detailed description of the remaining removing nozzles will be omitted.

Figure 47:
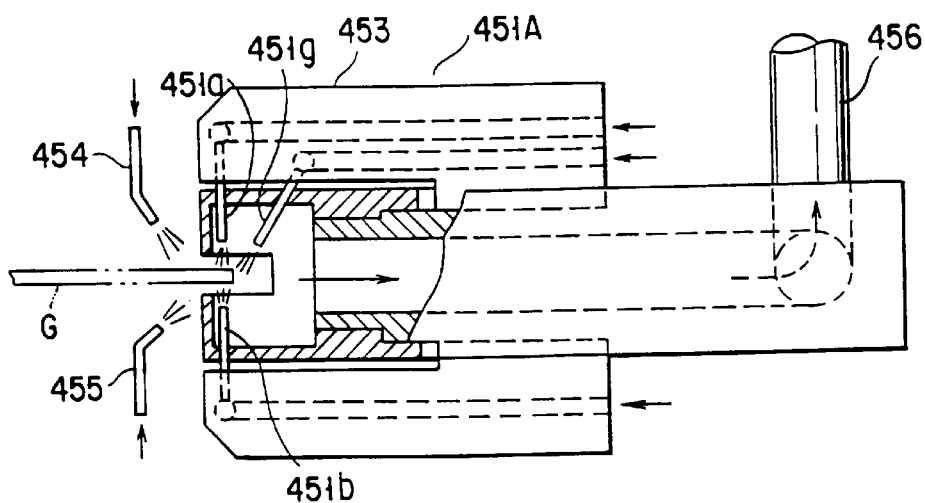
FIG. 47 is a sectional view schematically showing another example of the removing nozzles.

The removing nozzle 451A is mounted on a slide member 453A slidably mounted on a guide rail 452A, which extends in a Y direction in FIG. 47. The slide member 453A is reciprocally movable in the Y direction by a proper moving mechanism (not shown). As the moving mechanism, a wire, a chain, a belt, a ball screw, a stepping motor, an air cylinder, an ultrasonic motor, a superconducting linear motor, and the like can be used.

As shown in FIG. 47, the removing nozzle 451A has almost the same arrangement as that of the removing nozzle 351 shown in FIG. 33, and only a difference will be mainly described. An end face cleaning nozzle 451g for cleaning the end face (side surface) portion of the substrate G is provided inside in addition to an upper surface cleaning nozzle 451a and a lower surface cleaning nozzle 451b. The nozzles independently continue to supply a solvent and control the supply amount with opening/closing valves (not shown) respectively inserted in corresponding solvent supply paths.

A gas spray nozzle 454 and a gas spray nozzle 455 are respectively arranged on the upper and lower surface sides of the substrate G ahead of the end portion of the substrate G side such that their spray direction is the spray head 453 direction, that is, the peripheral direction of the substrate G. Sprayed gas is exhausted from an exhaust pipe 456 through the spray head 453.

As shown in FIG. 46, drying gas spray nozzles 457A and 458A are mounted on the two sides of the removing nozzle 451A by mounting members (not shown) so as to be movable in the Y direction together with the removing nozzle 451A. Each of the drying gas spray nozzles 457A and 458A sprays gas from the center of the substrate G on a long side A of the substrate G to the upper peripheral surface portion. Note that the drying gas spray nozzles 457A and 458A are set outside the substrate G, as shown in FIG. 46. However, they can be arranged at arbitrary positions, as far as they do not interfere with loading/unloading of the substrate G.

Each of the remaining removing nozzles 451B, 451C, and 451D has the same arrangement as that of the removing nozzle 451A, and reference numerals as in the removing nozzle 451A denote the corresponding parts. Note that the above nozzles are nozzles for dissolving and removing an unnecessary resist from the edge portions on a short side B, a long side C, and a short side D of the substrate G.

A procedure of removing an unnecessary resist by the removing mechanism having the above arrangement will be described below.

The substrate G, which has an upper surface coated with a resist film by the coating mechanism 301 shown in FIG. 31, is conveyed to a table 459 of the above removing mechanism by the convey arms 370. The substrate G is placed so as to set the long and short sides in the Y and X directions, respectively, and held by suction.

After the convey arms 370 are retracted to a waiting position, the removing nozzles 451A, 451B, 451C, and 451D are set at the four edge portions. They spray a resist solvent to the edge portions, while being simultaneously moved along the sides, thereby dissolving and removing an unnecessary resist film.

In this removal, the cleaning nozzles may be controlled to spray the solvent in correspondence with resist attachment conditions on the end portions of the substrate G. For example, if no resist attaches to the end face and lower peripheral surface portion of the substrate G, so dissolution/removal need not be performed, only the upper surface cleaning nozzle 451a sprays the solvent.

If the resist attaches to the end face, the end face cleaning nozzle 451g sprays the solvent. Further, if the resist attaches to the lower peripheral surface portion, the removing nozzle 451b also sprays the solvent.

If the attachment positions of a resist film attached to the end face and lower peripheral surface portion of the substrate G are obtained in advance, the end face cleaning nozzle 451g and the lower surface cleaning nozzle 451b are controlled to spray a solvent when the removing nozzle 451A is moved around these portions. With this operation, the consumption amount of solvent can be decreased.

Further, during the dissolution and removal, the gas spray nozzles 454 and 455 spray for example, nitrogen ($N_2$) gas to cause the $N_2$ gas to flow toward the peripheral portion of the substrate G, which is drawn into the spray head 453. Due to the presence of the $N_2$ gas flow, even if a solvent sprayed from the upper surface cleaning nozzle 451a, the end face cleaning nozzle 451g, and the lower surface cleaning nozzle 451b, bubbles formed by this spraying, and the like tend to scatter to the central side of the substrate G, they are discharged to the spray head side. Therefore, the solvent is prevented from scattering and attaching to the substrate G surface.

Prior to dissolution and removal using a solvent from the removing nozzle 451A, the drying gas spray nozzle 457A sprays, for example, heated $N_2$ gas to a resist film on the peripheral portion of the substrate G, and the $N_2$ gas is dried. With this operation, an increase in resist film thickness at the edge portions of the resist film upon dissolution and removal can be suppressed.

Still further, the drying gas spray nozzle 458A sprays, for example, heated $N_2$ gas to the peripheral portions of the substrate G upon dissolving and removing the resist film to dry the substrate G and the resist film. By this drying, the solvent is rapidly evaporated to dry the edge portions of the resist film. Therefore, unnecessary dissolution is not performed, and the resist film at the edge portions can be stabilized.

Although the above description exemplifies the removing nozzle 451A, the same effect can be obtained by the remaining removing nozzles 451B, 451C, and 451D.

In the above description, the independent moving mechanisms are provided as the moving mechanisms of the removing nozzles 451A, 451B, 451C, and 451D. However, another mechanism may be employed, as far as it can simultaneously perform dissolution and removal at the four corners. For example, the removing nozzles 451A and 451C may be mounted on a common mechanism, while the removing nozzles 451B and 451D may be mounted on a common mechanism. They may be set to be movable by the two corresponding moving mechanisms. Further, all the removing nozzles 451A, 451B, 451C, and 451D may be set to be movable by one common moving mechanism.

Note that, with the independent moving mechanisms, the moving speeds can also be independently set and controlled in accordance with resist attachment conditions on sides, and the like.

In FIG. 46, the substrate G is held to set the long side in the Y direction. However, it may be held to set the short side parallel to the Y direction, and the removing nozzles 451A, 451B, 451C, and 451D may be arranged in correspondence with this substrate direction. For example, each removing nozzle may have a structure using an air cylinder or capable of adjusting a stroke. With this structure, the removing nozzle is extendible to correspond to the substrate direction.

Moreover, the temperatures of the substrate G, a solvent, and $N_2$ gas may be controlled to the optimal dissolution temperatures to promote dissolution and removal of a resist film. To control the temperature of the substrate G, for example, the temperature of the atmosphere around the substrate G is controlled, or temperature-adjusted clean air or $N_2$ gas is supplied to the upper surface of the substrate G. In addition, the temperature of the substrate G is controlled by the table 459, or its temperature is controlled with infrared rays, microwaves, or the like.

The third embodiment exemplifies the case wherein one removing nozzle is provided for one side of the substrate G. Alternatively, a plurality of, for example, two removing nozzles may be provided on each side to shorten the moving distance or perform dissolution and removal twice. In this case, different types of solvents may be used, or dissolution positions may be different from removal positions.

Still further, the third embodiment exemplifies the case wherein the substrate G is fixed, and the removing nozzles are moved. Alternatively, the substrate G may be rotated, and the four sides may be simultaneously subjected to dissolution and removal by extending/shortening and moving the removing nozzles in the X and Y directions in correspondence with this rotation.

Note that any one of the above embodiments has exemplified the case wherein the present invention is applied to the resist coating apparatus for an LCD substrate. The present invention, however, can be applied to an apparatus for forming a coating film on an object to be processed such as a semiconductor wafer or a CD other than an LCD substrate. A polyimide-based coating liquid (PIQ), a coating liquid (SOG) containing a glass material, and the like can be used other than a resist, as a matter of course.

What is claimed is:

1. A coating apparatus comprising:
    a spin chuck for supporting a substrate with a surface of said substrate being set horizontal;
    a substrate rotation mechanism for rotating said spin chuck about a axis perpendicular to a surface of said supported substrate to rotate said substrate, said rotation mechanism mechanically interfaced with said spin chuck;
    a cup, having an upper opening for taking in and out said substrate, for surrounding said substrate on the spin chuck;
    a lid for closing said upper opening of said cup;
    means for forming a diffused layer of solvent directly on said substrate on the spin chuck, said means for forming a diffused layer having a solvent supply source, a first nozzle connected to said solvent supply source and means for adjusting a solvent supply mount for the first nozzle; and
    means for supplying coating liquid to said diffused layer of solvent on said substrate on the spin chuck
    said means for supplying the coating liquid having a coating liquid supply source, a second nozzle connected to said coating liquid supply source and means for adjusting amount of the coating liquid into the second nozzle.

2. A coating apparatus according to claim 1, further comprising nozzle support means for supporting at least one of said coating liquid supply nozzle and said solvent supply nozzle, and moving means for moving said nozzle support means between a supply position above said substrate and a waiting position falling outside the supply position located above said substrate.

3. A coating apparatus according to claim 1, further comprising temperature adjustment means, connected relative to at least one of said means for supplying coating liquid and said means for forming a diffused layer of solvent, for temperature-adjusting the coating liquid or the solvent.

4. A coating apparatus according to claim 1, further comprising lid moving means for moving said lid between a closing position for closing said processing vessel and a waiting position spaced apart from said cup.

5. A coating apparatus according to claim 1, further comprising cup rotation means for rotating said cup together with the substrate.

6. A coating apparatus comprising:
    a spin chuck for supporting a substrate with a surface of said substrate being set horizontal;
    a substrate rotation mechanism for rotating said spin chuck about an axis perpendicular to a surface of said supported substrate to rotate said substrate, said rotation mechanism mechanically interfaced with said spin chuck;
    a cup having an upper opening for taking in and out the substrate and having an air discharge hole near a bottom portion, for surrounding said substrate, said cup mechanically interfaced with said spin chuck;
    cup rotation means for rotating said cup together with said substrate;
    a lid for closing the upper opening of said cup, and having an air inlet port for feeding air into the closed space;
    a current plate, located below said lid, for diffusing air fed from the inlet port outward;
    means for forming a diffused layer of solvent directly on said substrate on the spin chuck; and
    coating liquid supply means for supplying the coating liquid to said diffused layer of solvent on said substrate on the spin chuck.

7. A coating apparatus according to claim 6, further comprising nozzle support means for supporting at least one of said coating liquid supply nozzle and said solvent supply nozzle, and moving means for moving said nozzle support means between a supply position above said substrate and a waiting position falling outside the supply position located above said substrate.

8. A coating apparatus according to claim 6, further comprising temperature adjustment means, provided to at least one of said means for supplying coating liquid and said means for forming a diffused layer of solvent, for temperature-adjusting the coating liquid or the solvent.

9. A coating apparatus according to claim 6, further comprising lid moving means for moving said lid between a closing position for closing said processing vessel and a waiting position spaced apart from said cup.

10. A coating apparatus comprising:
a spin chuck for supporting a substrate with a surface of said substrate being set horizontal;
a substrate rotation mechanism for rotating said spin chuck about an axis perpendicular to a surface of said supported substrate to rotate said substrate, said rotation mechanism mechanically interfaced with said spin chunk;
a cup, having an upper opening for taking in and out the substrate and an air discharge hole near a bottom portion, for surrounding said substrate on the spin chuck, said cup mechanically interfaced with said spin chuck;
cup rotation means for rotating said cup together with said substrate;
a lid for closing the upper opening of said cup, having an air inlet port for feeding air into the close space;
a current plate, located below said lid, for diffusing air fed from the air inlet port outward;
a stationary vessel, having an air discharge port, for surrounding an external side of said cup, being in a stationary state while rotating said cup by said cup rotation means;
a stationary lid, having a plurality of air supply hole, for closing an opening portion of said stationary vessel, and being in a stationary state while rotating said cup by said cup rotation means;
means for forming a diffused layer of solvent directly on said substrate on the spin chuck; and
means for supplying coating liquid to said diffused layer of solvent on said substrate on the spin chuck.

11. A coating apparatus according to claim 10, further comprising nozzle support means for supporting at least one of said coating liquid supply nozzle and said solvent supply nozzle, and moving means for moving said nozzle support means between a supply position above said substrate and a waiting position falling outside the supply position located above said substrate.

12. A coating apparatus according to claim 10, further comprising temperature adjustment means, connected relative to at least one of said means for supplying coating liquid and said means for forming a diffused layer of solvent, for temperature-adjusting the coating liquid or the solvent.

13. A coating apparatus according to claim 10, further comprising lid moving means for moving said lid between a closing position for closing said processing vessel and a waiting position spaced apart from said cup.

14. A coating apparatus comprising:
a spin chuck for supporting a substrate with a surface of said substrate being set horizontal;
substrate rotation means for rotating said spin chuck about an axis perpendicular to a surface of said supported substrate to rotate said substrate, said rotation mechanism mechanically interfaced with said spin chuck;
a cup having an upper opening for taking in and out the substrate and an air discharge hole near a bottom portion, for surrounding said substrate on the spin chuck, said cup mechanically interfaced with said spin chuck;
a cup rotation mechanism for rotating said cup together with the substrate;
a lid for closing the upper opening of said cup, having an air inlet port to feed air into the closed space;
inert gas supply means, retractable with respect to said cup, for supplying an inert gas into said cup;
means for supplying a diffused layer of solvent on said substrate on the spin chuck;
and means for supplying a coating liquid to said diffused layer of solvent on said substrate on the spin chuck.

15. A coating apparatus according to claim 14, wherein said coating liquid supply means comprises a coating liquid supply nozzle, a coating liquid supply source, a coating liquid supply pipe communicating with said coating liquid supply nozzle and said coating liquid supply source, and a pump capable of adjusting a coating liquid supply amount and provided to said coating liquid supply pipe, and said solvent supply means comprises a solvent supply nozzle, a solvent supply source, and a solvent supply pipe communicating with said solvent supply nozzle and said solvent supply source, and a pump capable of adjusting a solvent supply amount and provided to said solvent supply pipe.

16. A coating apparatus according to claim 15, further comprising nozzle support means for supporting at least one of said coating liquid supply nozzle and said solvent supply nozzle, and moving means for moving said nozzle support means between a supply position above said substrate and a waiting position falling outside the supply position located above said substrate.

17. A coating apparatus according to claim 14, further comprising temperature adjustment means, connected relative to at least one of said means for supplying coating liquid and said means for forming a diffused layer of solvent, for temperature-adjusting the coating liquid or the solvent.

18. A coating apparatus according to claim 14, further comprising lid moving means for moving said lid between a closing position for closing said processing vessel and a waiting position spaced apart from said cup.

19. A coating apparatus according to claim 14, further comprising a current plate, located below said lid, for diffusing air fed from the air inlet port outward.

20. A coating apparatus according to claim 14, further comprising a fixed vessel, having an exhaust port in a lower portion, for surrounding said cup, and a fixed lid, having a plurality of air supply holes in a central portion, for closing an opening portion of said fixed vessel.

21. A coating apparatus according to claim 14, further comprising moving means for vertically moving said support means, and wherein said inert gas supply means is moved between an inside and outside of said processing vessel with vertical movement of said substrate support means.

22. A coating apparatus according to claim 14, wherein said inert gas supply means comprises an annular nozzle having an annular member and a plurality of small holes formed in a circumferential surface, and the inert gas is supplied into said processing vessel through an interior of said annular member and the small holes.

23. A coating apparatus comprising:
a spin chuck for supporting a substrate with a surface of said substrate being set horizontal;
substrate rotation means for rotating said spin chuck about an axis perpendicular to a surface of said supported substrate to rotate said substrate, said rotation mechanism mechanically interfaced with said spin chuck;
a cup having an upper opening for taking in and out the substrate and an air discharge hole near a bottom portion, for surrounding said substrate, said cup mechanically interfaced with said spin chuck;
a lid for closing the upper opening of said cup, having an air inlet port to feed air into the closed space;

inert gas supply means, retractable with respect to said cup, for supplying an inert gas into said cup;

cup cleaning nozzle separate from said gas supply means, retractable with respect to interior of said cup, for spraying a cleaning liquid to an inner wall of said cup to clean the inner wall;

means for supplying a diffused layer of solvent directly on said substrate on the spin chuck; and means for supplying a coating liquid to said diffused layer of solvent on said substrate on the spin chuck.

24. A coating apparatus according to claim 23, wherein said means for supplying coating liquid comprises a coating liquid supply nozzle, a coating liquid supply source, a coating liquid supply pipe communicating with said coating liquid supply nozzle and said coating liquid supply source, and a pump capable of adjusting a coating liquid supply amount and provided to said coating liquid supply pipe, and said means for forming a diffused layer of solvent comprises a solvent supply nozzle, a solvent supply source, and a solvent supply pipe communicating with said solvent supply nozzle and said solvent supply source, and a pump capable of adjusting a solvent supply amount and provided to said solvent supply pipe.

25. A coating apparatus according to claim 24, further comprising nozzle support means for supporting at least one of said coating liquid supply nozzle and said solvent supply nozzle, and moving means for moving said nozzle support means between a supply position above said substrate and a waiting position falling outside the supply position located above said substrate.

26. A coating apparatus according to claim 23, further comprising temperature adjustment means, connected relative to at least one of said means for supplying coating liquid and said means for forming a diffused layer of solvent, for temperature-adjusting the coating liquid or the solvent.

27. A coating apparatus according to claim 23, further comprising lid moving means for moving said lid between a closing position for closing said cup and a waiting position spaced apart from said cup.

28. A coating apparatus according to claim 23, comprising a current plate, located below said lid, for diffusing air fed from the air inlet port outward.

29. A coating apparatus according to claim 23, further comprising a fixed vessel, having an exhaust port in a lower portion, for surrounding said cup, and a fixed lid, having a plurality of air supply holes in a central portion, for closing an opening portion of said fixed vessel.

30. A coating apparatus according to claim 23, further comprising moving means for vertically moving said spin chuck, and wherein said inert gas supply means and said cup cleaning nozzle are moved between an inside and outside of said cup with vertical movement of said holding means.

31. A coating apparatus according to claim 23, wherein said inert gas supply means comprises an annular nozzle having an annular member and a plurality of small holes formed in a circumferential surface, and the inert gas is supplied into said cup through an interior of said annular member and the small holes.

32. A coating apparatus according to claim 23, further comprising a bottom surface cleaning nozzle member for spraying a cleaning liquid to a bottom surface of said cup, a side surface cleaning nozzle member for spraying the cleaning liquid to an inner side surface of said cup, and a lid cleaning nozzle member for spraying the cleaning liquid to an abutment portion between said cup and said lid and a lower surface of said lid.

33. A coating apparatus comprising: a coating mechanism for supplying a coating liquid to a rectangular substrate to form a coating film on a surface of said substrate, having a spin chuck for supporting a substrate with a rectangular surface of said substrate being set horizontal, substrate rotation mechanism for rotating said spin chuck about an axis perpendicular to said supported substrate, said rotation mechanism mechanically interfaced with said spin chuck, a cup having an upper opening for taking in and out a substrate, for surrounding said substrate on the spin chuck, a cup rotation mechanism for rotating said cup together with said substrate, a lid for closing an upper opening of said cup, and coating liquid supply means for supplying a coating liquid to said substrate on the spin chuck;

a coating film removing mechanism for removing the coating film formed by said coating mechanism from a peripheral portion of said substrate, comprising a substrate support portion for substantially horizontally, rotatably supporting said substrate, a movement mechanism and a removing liquid spray nozzle for spraying a coating film removing liquid to said peripheral portion of said substrate while being moved by said movement mechanism along a side of the substrate, of;

a first convey mechanism for loading said substrate in said coating mechanism and unloading said substrate from said coating film removing mechanism; and a second convey mechanism for conveying said substrate from said coating mechanism to said coating film removing mechanism.

34. A coating apparatus according to claim 33, wherein said removing mechanism further comprises an auxiliary cleaning nozzle for spraying the coating film removing liquid to a lower corner surface portion of said substrate, said auxiliary cleaning nozzle communicating with a lower corner surface portion of said substrate.

35. A coating apparatus according to claim 33, wherein said second convey mechanism comprises a convey arm for holding a side portion of said substrate by vacuum suction, said arm having a vacuum suction hole formed in a substrate holding surface, and a pad member communicating with the suction hole and displacable in a direction perpendicular to an arm member.

36. A coating apparatus comprising:

coating mechanism having a spin chuck for supporting a substrate with a rectangular surface of said substrate being set horizontal, a substrate rotation mechanism for rotating said spin chuck about an axis perpendicular to said supported substrate, said rotation mechanism mechanically interfaced with said spin chuck, a cup having an upper opening for taking in and out a substrate, for surrounding said substrate on the spin chuck, a cup rotation mechanism for rotating said cup together with a substrate, a lid for closing the upper opening of said cup, solvent supply means for supplying a diffused layer of solvent to said substrate on the spin chuck and coating liquid supply means for supplying a coating liquid to said diffused layer of solvent on said substrate on the spin chuck, for supplying a coating liquid on a rectangular substrate to form a coating film on the surface of the substrate;

a coating film removing mechanism having a substrate support portion for substantially horizontally, rotatably supporting the substrate, a movement mechanism and the removing liquid spray nozzle for spraying the coating film removing liquid to a peripheral portion of said substrate while being moved by said movement mechanism along a side of said substrate, for removing the coating film formed by said coating mechanism from the peripheral portion of the substrate;

a first convey mechanism for loading said substrate in said coating mechanism and unloading said substrate from said coating film removing mechanism; and a second convey mechanism for conveying said substrate from said coating mechanism to said coating film removing mechanism.

37. A coating apparatus according to claim 36, wherein said removing mechanism further comprises an auxiliary opening nozzle for spraying the coating film removing liquid to a lower corner surface portion of said substrate.

38. A coating apparatus according to claim 36, wherein said second convey mechanism comprises a convey arm for holding a side portion of said substrate by vacuum suction, said arm having a vacuum suction hole formed in a substrate holding surface, and a pad member communicating with the suction hole and displacable in a direction perpendicular to an arm member.

* * * * *